United States Patent
Lee et al.

(10) Patent No.: US 12,532,472 B2
(45) Date of Patent: Jan. 20, 2026

(54) THREE-DIMENSIONAL SEMICONDUCTOR MEMORY DEVICE AND ELECTRONIC SYSTEM INCLUDING THE SAME

(71) Applicant: Samsung Electronics Co., Ltd., Suwon-si (KR)

(72) Inventors: Seungmin Lee, Seoul (KR); Junhyoung Kim, Seoul (KR); Jisu Shin, Suwon-si (KR); Byungik Yoo, Suwon-si (KR); Joon-Sung Lim, Seongnam-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 574 days.

(21) Appl. No.: 18/054,730

(22) Filed: Nov. 11, 2022

(65) Prior Publication Data

US 2023/0180476 A1 Jun. 8, 2023

(30) Foreign Application Priority Data

Dec. 3, 2021 (KR) .................... 10-2021-0172070

(51) Int. Cl.
*H10B 43/27* (2023.01)
*H01L 23/535* (2006.01)
(Continued)

(52) U.S. Cl.
CPC .......... *H10B 43/27* (2023.02); *H01L 23/535* (2013.01); *H10B 41/27* (2023.02); *H10B 41/41* (2023.02); *H10B 43/40* (2023.02)

(58) Field of Classification Search
CPC ........ H10B 43/27; H10B 41/27; H10B 41/41; H10B 43/10; H10B 80/00; H10B 43/35; H10B 43/50; H01L 23/535
See application file for complete search history.

(56) References Cited

U.S. PATENT DOCUMENTS 10,020,319 B2  7/2018  Baba
10,734,396 B2  8/2020  Kang
(Continued)

FOREIGN PATENT DOCUMENTS

CN            112614845 A    4/2021
KR     10-2021-0014828 A    2/2021
(Continued)

*Primary Examiner* — Ajay Ojha
*Assistant Examiner* — Sandra Milena Rodriguez Villanu
(74) *Attorney, Agent, or Firm* — Wolf, Greenfield & Sacks, P.C.

(57) ABSTRACT

A three-dimensional semiconductor memory device and an electronic system including the same are discussed. The device may include: a stack structure including electrode layers and inter-electrode insulating layers that are alternately stacked on a substrate; one or more vertical semiconductor structures that extend into the stack structure and are adjacent to the substrate; one or more vertical conductive structures arranged in a first direction between adjacent ones of the one or more vertical semiconductor structures and extending into the stack structure and are adjacent to the substrate; and a conductive line portion on the stack structure that extends in the first direction to connect the one or more vertical conductive structures to each other. The conductive line portion and the vertical conductive structures may be connected to form a single unit.

20 Claims, 53 Drawing Sheets

(51) Int. Cl.
*H10B 41/27* (2023.01)
*H10B 41/41* (2023.01)
*H10B 43/40* (2023.01)

(56) References Cited

U.S. PATENT DOCUMENTS

| | | |
|---|---|---|
| 11,049,877 B2 | 6/2021 | Oike |
| 2020/0328223 A1* | 10/2020 | Lai .................. H10B 43/27 |
| 2021/0408035 A1* | 12/2021 | Sato ................ H10B 41/27 |
| 2022/0399364 A1* | 12/2022 | Kim ............... H01L 21/76805 |
| 2023/0080606 A1 | 3/2023 | Lee et al. |

FOREIGN PATENT DOCUMENTS

| | | |
|---|---|---|
| KR | 20210090577 A | 7/2021 |
| KR | 10-2021-0134523 A | 11/2021 |
| KR | 20230037864 A | 3/2023 |

* cited by examiner

THREE-DIMENSIONAL SEMICONDUCTOR MEMORY DEVICE AND ELECTRONIC SYSTEM INCLUDING THE SAME

CROSS-REFERENCE TO RELATED APPLICATION

This U.S. non-provisional patent application claims priority under 35 U.S.C. § 119 to Korean Patent Application No. 10-2021-0172070, filed on Dec. 3, 2021, in the Korean Intellectual Property Office, the entire contents of which are hereby incorporated by reference.

BACKGROUND OF THE INVENTION

The present disclosure relates to semiconductor devices and electronic systems including the same, and in particular, to a three-dimensional semiconductor memory device with improved reliability and increased integration density and an electronic system including the same.

Higher integration of semiconductor devices may be beneficial to satisfy consumer's demands for superior performance and inexpensive prices. In the case of semiconductor devices, since their integration may be an important factor in determining product prices, increased integration is especially useful. In the case of two-dimensional or planar semiconductor devices, since their integration is mainly determined by the area occupied by a unit memory cell, integration can be greatly influenced by the level of a fine pattern forming technology. However, the extremely expensive process equipment needed to increase pattern fineness sets a practical limitation on increasing integration for two-dimensional or planar semiconductor devices. Thus, three-dimensional semiconductor memory devices including three-dimensionally arranged memory cells have recently been proposed.

SUMMARY

An embodiment of the present disclosure provides a highly-integrated and highly-reliable three-dimensional semiconductor memory device and an electronic system including the same.

According to an embodiment of the present disclosure, a three-dimensional semiconductor memory device may include a stack structure comprising a plurality of electrode layers and a plurality of inter-electrode insulating layers on a substrate, a plurality of vertical semiconductor structures that extend into the stack structure and are adjacent to the substrate, one or more vertical conductive structures arranged in a first direction between adjacent ones of the plurality of vertical semiconductor structures, the one or more vertical conductive structures extending into the stack structure to be adjacent to the substrate, and a conductive line portion that is on the stack structure and extends in the first direction to connect the one or more vertical conductive structures to each other. The conductive line portion and the vertical conductive structures may be connected to form a single unit.

According to an embodiment of the present disclosure, a three-dimensional semiconductor memory device may include a peripheral circuit structure and a cell array structure on the peripheral circuit structure. The cell array structure may include a first substrate comprising a cell array region and a connection region, each of which is arranged in a first direction, a source structure on the first substrate, a first sub-stack structure comprising first electrode layers and first inter-electrode insulating layers alternately stacked on the first substrate, a second sub-stack structure comprising second electrode layers and second inter-electrode insulating layers alternately stacked on the first sub-stack structure, a planarization insulating layer on the connection region to at least partially cover an end portion of the first and second sub-stack structures, a plurality of vertical semiconductor structures on the cell array region to extend into the first and second sub-stack structures and the source structure, and are adjacent to the first substrate, a plurality of bit line pads on the vertical semiconductor structures, with each one of the plurality of bit line pads on a respective one of the plurality of vertical semiconductor structures, a plurality of vertical conductive structures arranged in the first direction between adjacent ones of the vertical semiconductor structures that extend into the first and second sub-stack structures and are adjacent to the substrate, a conductive line portion on the second sub-stack structure that extends in the first direction to connect ones of the plurality of vertical conductive structures to each other, and a separation insulating line that extends in the first direction and into the first sub-stack structure, the second sub-stack structure, and the source structure on the cell array region and the connection region. Each of side surfaces of the plurality of vertical semiconductor structures may have a first inflection point near an interface between the first and second sub-stack structures, and each of side surfaces of the plurality of vertical conductive structures may have a second inflection point near an interface between the first and second sub-stack structures.

According to an embodiment of the present disclosure, an electronic system may comprise: a semiconductor device including a peripheral circuit structure, a cell array structure on the peripheral circuit structure, and an input/output pad electrically connected to the peripheral circuit structure; and a controller, which is electrically connected to the semiconductor device through the input/output pad to control the semiconductor device. The cell array structure comprises a stack structure including electrode layers and inter-electrode insulating layers on a substrate layer, a plurality of vertical semiconductor structures that extend into the stack structure and are adjacent to the substrate, a plurality of vertical conductive structures between adjacent ones of the vertical semiconductor structures, the plurality of vertical conductive structures arranged in a first direction and extending into the stack structure to be adjacent to the substrate layer, and a conductive line portion on the stack structure and extending in the first direction to connect ones of the plurality of vertical conductive structures, wherein the conductive line portion and the plurality of vertical conductive structures are connected to form a single unit.

BRIEF DESCRIPTION OF THE DRAWINGS

FIG. 8A to 18A are sectional views sequentially illustrating a process of fabricating a three-dimensional semiconductor memory device having the section of FIG. 5A.

FIG. 8B to 18B are sectional views sequentially illustrating a process of fabricating a three-dimensional semiconductor memory device having the section of FIG. 5B.

DETAILED DESCRIPTION

Example embodiments of the present disclosure will now be described more fully with reference to the accompanying drawings, in which example embodiments are shown.

Figure 1A:
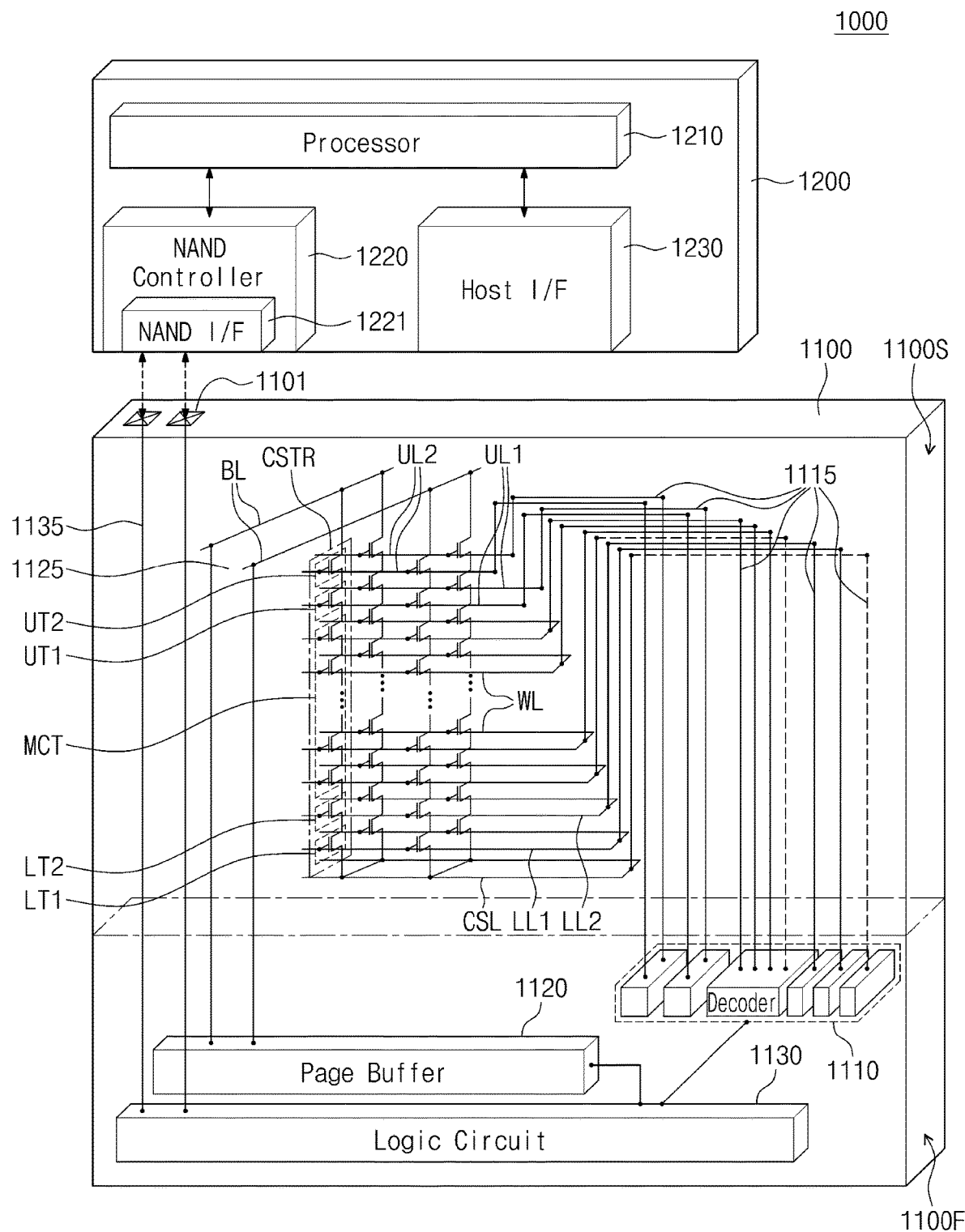
FIG. 1A is a diagram schematically illustrating an electronic system including a semiconductor device according to an embodiment of the present disclosure.

FIG. 1A is a diagram schematically illustrating an electronic system including a semiconductor device according to an embodiment of the present disclosure.

Referring to FIG. 1A, an electronic system 1000 according to an embodiment of the present disclosure may include a semiconductor device 1100 and a controller 1200 electrically connected to the semiconductor device 1100. The electronic system 1000 may be a storage device including one or more semiconductor devices 1100 or an electronic device including the storage device. For example, the electronic system 1000 may be a solid state drive (SSD) device, a universal serial bus (USB), a computing system, a medical system, or a communication system, in which at least one semiconductor device 1100 is provided.

The semiconductor device 1100 may be a nonvolatile memory device (e.g., a NAND FLASH memory device). The semiconductor device 1100 may include a first structure 1100F and a second structure 1100S on the first structure 1100F. In an embodiment, the first structure 1100F may be beside the second structure 1100S. The first structure 1100F may be a peripheral circuit structure including a decoder circuit 1110, a page buffer circuit 1120, and a logic circuit 1130. The second structure 1100S may be a memory cell structure including a bit line BL, a common source line CSL, word lines WL, first and second gate upper lines UL1 and UL2, first and second gate lower lines LL1 and LL2, and memory cell strings CSTR between the bit line BL and the common source line CSL.

In the second structure 1100S, each of the memory cell strings CSTR may include lower transistors LT1 and LT2 adjacent to the common source line CSL, upper transistors UT1 and UT2 adjacent to the bit line BL, and a plurality of memory cell transistors MCT between the lower transistors LT1 and LT2 and the upper transistors UT1 and UT2. The number of the lower transistors LT1 and LT2 and the number of the upper transistors UT1 and UT2 may be changed, according to various embodiments.

In an embodiment, the upper transistors UT1 and UT2 may include at least one string selection transistor, and the lower transistors LT1 and LT2 may include at least one ground selection transistor. The gate lower lines LL1 and LL2 may be respectively used as gate electrodes of the lower transistors LT1 and LT2. The word lines WL may be respectively used as gate electrodes of the memory cell transistors MCT, and the gate upper lines UL1 and UL2 may be respectively used as gate electrodes of the upper transistors UT1 and UT2.

In an embodiment, the lower transistors LT1 and LT2 may include a lower erase control transistor LT1 and a ground selection transistor LT2, which are connected in series in one embodiment. The upper transistors UT1 and UT2 may include a string selection transistor UT1 and an upper erase control transistor UT2, which are connected in series in one embodiment. At least one of the lower and upper erase control transistors LT1 and UT2 may be used for an erase operation of erasing data, which are stored in the plurality of memory cell transistors MCT, using a gate-induced drain leakage (GIDL) phenomenon.

The common source line CSL, the first and second gate lower lines LL1 and LL2, the word lines WL, and the first and second gate upper lines UL1 and UL2 may be electrically connected to the decoder circuit 1110 through first connection lines 1115, which extend from the first structure 1100F into the second structure 1100S. The bit lines BL may be electrically connected to the page buffer circuit 1120 through second connection lines 1125, which extend from the first structure 1100F to the second structure 1100S.

In the first structure 1100F, the decoder circuit 1110 and the page buffer circuit 1120 may be configured to perform a control operation on at least one memory cell transistor selected from the plurality of memory cell transistors MCT. The decoder circuit 1110 and the page buffer circuit 1120 may be controlled by the logic circuit 1130. The semiconductor device 1100 may communicate with the controller 1200 through an input/output pad 1101, which is electrically connected to the logic circuit 1130. The input/output pad 1101 may be electrically connected to the logic circuit 1130 through an input/output connection line 1135, which extend from the first structure 1100F to the second structure 1100S.

The controller 1200 may include a processor 1210, a NAND controller 1220, and a host interface 1230. In an embodiment, the electronic system 1000 may include a plurality of semiconductor devices 1100, and in this case, the controller 1200 may control the semiconductor devices 1100.

The processor 1211 may control overall operations of the electronic system 1000 including the controller 1200. The processor 1211 may be operated based on a specific firmware in one embodiment and may control the NAND controller 1220 to access the semiconductor device 1100. The NAND controller 1220 may include a NAND interface 1221 which is used for communication with the semiconductor device 1100. The NAND interface 1221 may be used to transmit and receive control commands, which are used to control the semiconductor device 1100, and data, which will be written in or read from the plurality of memory cell transistors MCT of the semiconductor device 1100. The host interface 1230 may be configured to allow for communication between the electronic system 1000 and an external host. When a control command is received from the external host through the host interface 1230, the processor 1211 may control the semiconductor device 1100 in response to the control command.

Figure 1B:
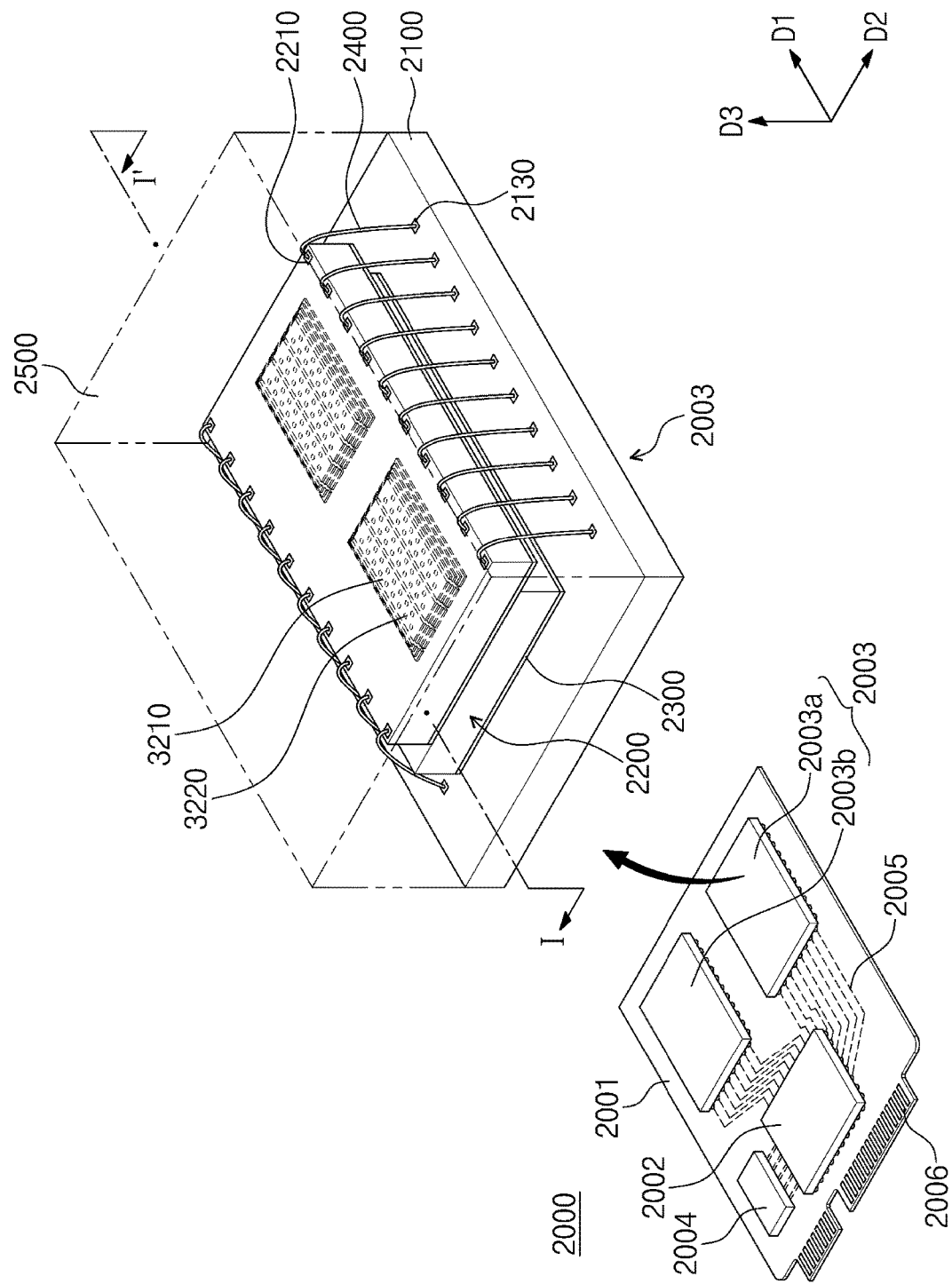
FIG. 1B is a perspective view schematically illustrating an electronic system including a semiconductor device according to an embodiment of the present disclosure.

FIG. 1B is a perspective view schematically illustrating an electronic system including a semiconductor device according to an embodiment of the present disclosure.

Referring to FIG. 1B, an electronic system 2000 according to an embodiment of the present disclosure may include a main substrate 2001 and a controller 2002, at least one semiconductor package 2003, and a DRAM 2004, which are on the main substrate 2001. In one embodiment, the controller 2002, the at least one semiconductor package 2003, and the DRAM 2004 may be mounted on the main substrate 2001. The semiconductor package 2003 and the DRAM 2004 may be connected to the controller 2002 by interconnection patterns 2005, which are formed in or on the main substrate 2001.

The main substrate 2001 may include a connector 2006, which includes a plurality of pins coupled to an external host. In the connector 2006, the number and arrangement of the pins may be changed depending on a communication interface between the electronic system 2000 and the external host. In an embodiment, the electronic system 2000 may communicate with the external host, in accordance with one or more of various interfaces, such as universal serial bus (USB), peripheral component interconnect express (PCI-Express), serial advanced technology attachment (SATA), universal flash storage (UFS) M-Phy, or the like. In an embodiment, the electronic system 2000 may be driven by power which is supplied from the external host through the connector 2006. The electronic system 2000 may further include a power management integrated circuit (PMIC) that is configured to distribute power which is supplied from the external host to the controller 2002 and the semiconductor package 2003.

The controller 2002 may be configured to control a writing or reading operation on the semiconductor package 2003 and to improve an operation speed of the electronic system 2000.

The DRAM 2004 may be a buffer memory, which relieves technical difficulties caused by a difference in speed between the semiconductor package 2003, which serves as a data storage device, and an external host. In an embodiment, the DRAM 2004 in the electronic system 2000 may serve as a cache memory and may be used as a storage space, which is configured to store data temporarily during a control operation on the semiconductor package 2003. In the case where the electronic system 2000 includes the DRAM 2004, the controller 2002 may further include a DRAM controller for controlling the DRAM 2004, in addition to a NAND controller for controlling the semiconductor package 2003.

The semiconductor package 2003 may include first and second semiconductor packages 2003a and 2003b spaced apart from each other. Each of the first and second semiconductor packages 2003a and 2003b may be a semiconductor package including a plurality of semiconductor chips 2200. Each of the first and second semiconductor packages 2003a and 2003b may include a package substrate 2100, the plurality of semiconductor chips 2200 on the package substrate 2100, one or more adhesive layers 2300 on respective bottom surfaces of each of the plurality of semiconductor chips 2200, a connection structure 2400 electrically connecting each of the plurality of semiconductor chips 2200 to the package substrate 2100, and a molding layer 2500 disposed on the package substrate 2100 to at least partially cover the semiconductor chips 2200 and the connection structure 2400.

The package substrate 2100 may be a printed circuit board including one or more package upper pads 2130. Each of the semiconductor chips 2200 may include an input/output pad 2210. The input/output pad 2210 may correspond to the input/output pad 1101 of FIG. 1A. Each of the semiconductor chips 2200 may include a plurality of gate stacks 3210 and a plurality of vertical structures 3220. Each of the semiconductor chips 2200 may include a semiconductor device, which will be described below, according to an embodiment of the present disclosure.

In an embodiment, the connection structure 2400 may be a bonding wire, which is provided to electrically connect the input/output pad 2210 to the package upper pads 2130. Thus, in each of the first and second semiconductor packages 2003a and 2003b, the semiconductor chips 2200 may be electrically connected to each other in a bonding wire manner and may be electrically connected to the package upper pads 2130 of the package substrate 2100. Alternatively, in one or more of the first and second semiconductor packages 2003a and 2003b, the semiconductor chips 2200 may be electrically connected to each other by a connection structure including through-silicon vias (TSVs), instead of by the connection structure 2400 provided in the form of bonding wires.

In an embodiment, the controller 2002 and the plurality of semiconductor chips 2200 may be included in a single package. In an embodiment, the controller 2002 and the plurality of semiconductor chips 2200 may be on an additional interposer substrate different from the main substrate 2001 and may be connected to each other through interconnection lines, which are provided in the interposer substrate.

In one embodiment, the controller 2002 and the plurality of semiconductor chips 2200 may be mounted on the interposer substrate.

Figure 1C:
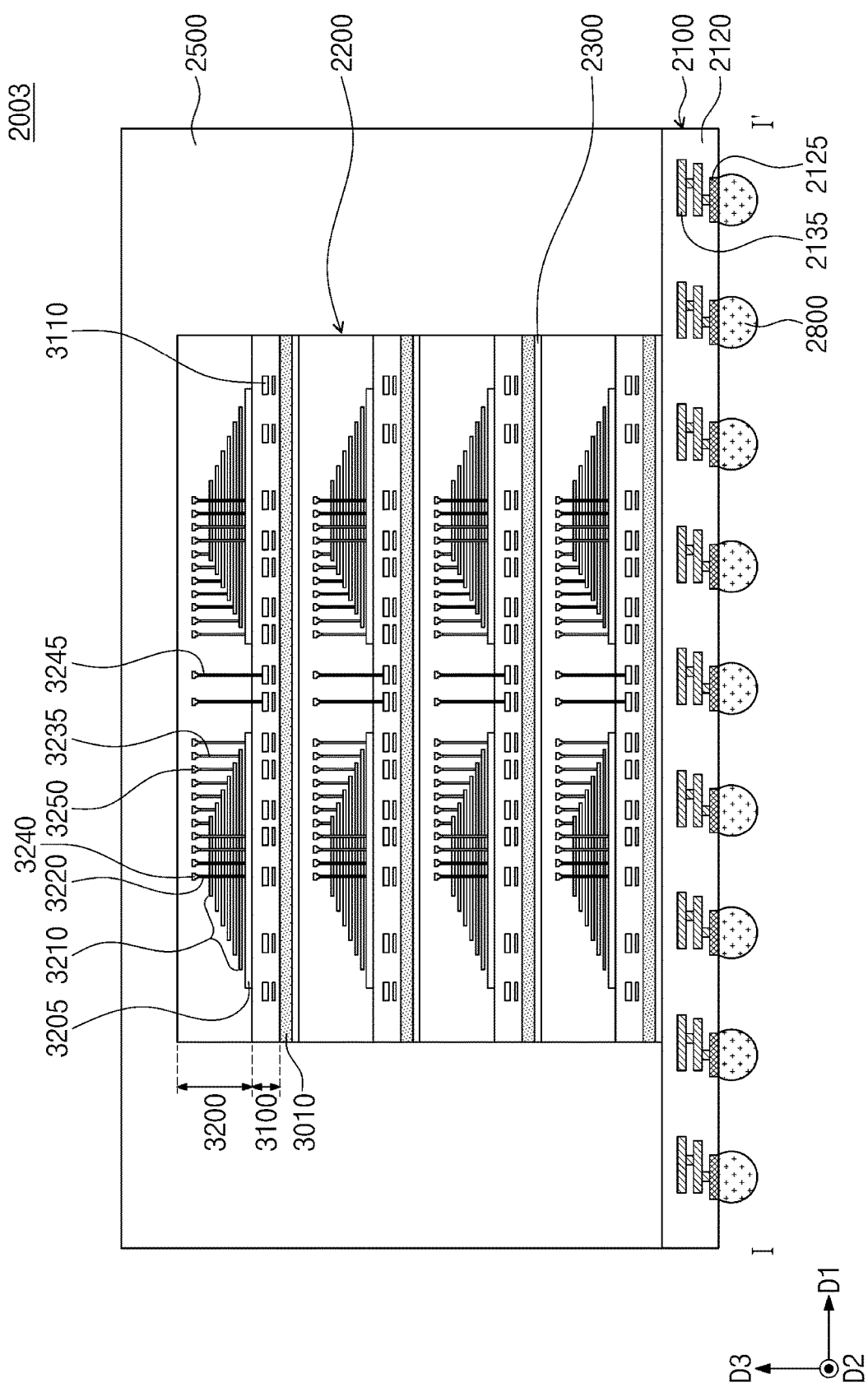
FIGS. 1C and 1D are sectional views, each of which schematically illustrates a semiconductor package according to an embodiment of the present disclosure
Figure 1D:
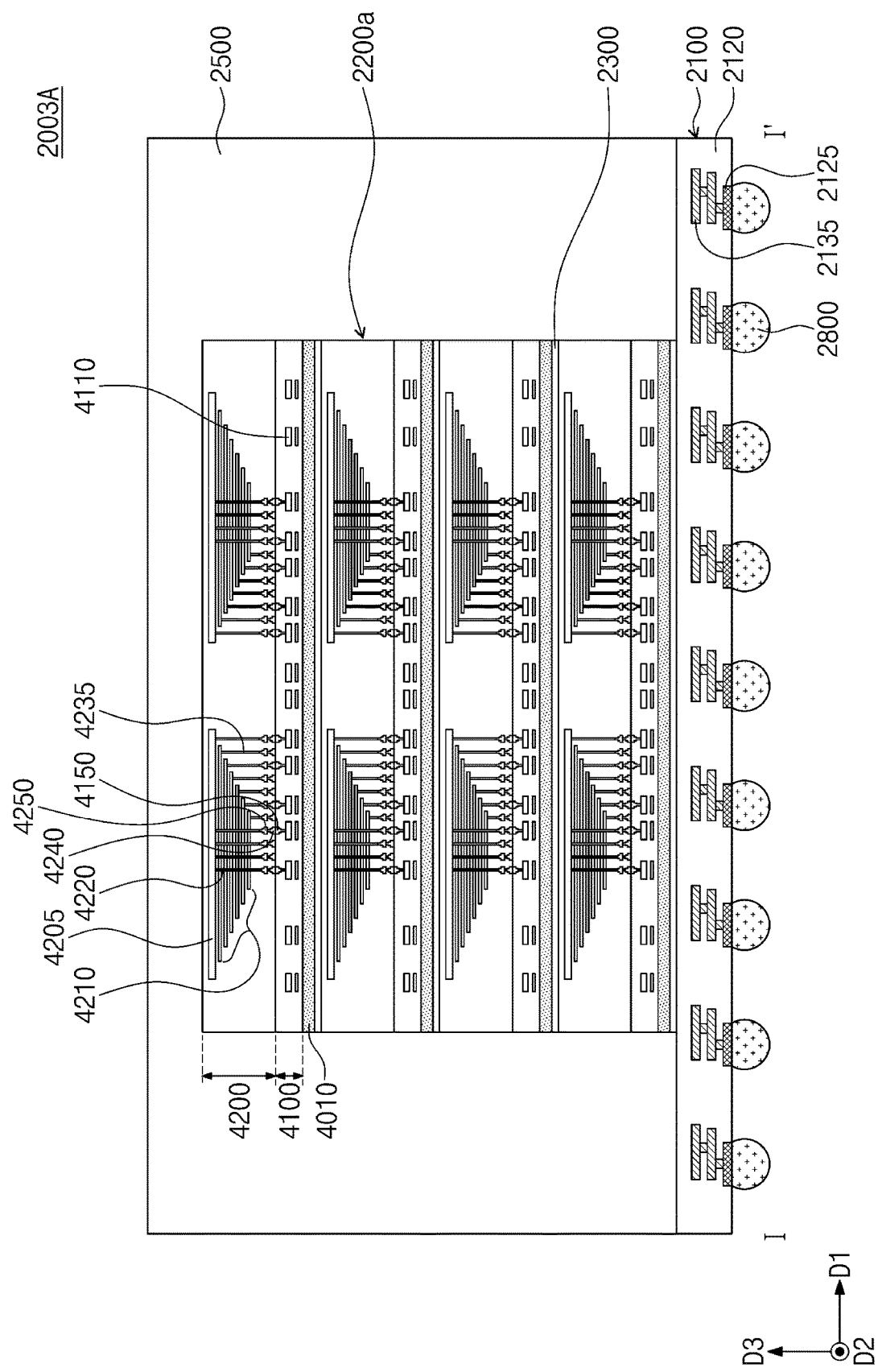

FIGS. 1C and 1D are sectional views, each of which schematically illustrates a semiconductor package according to an embodiment of the present disclosure. FIGS. 1C and 1D are sectional views taken along a line I-I' of FIG. 1B and illustrate two different examples of the semiconductor package of FIG. 1B.

Referring to FIG. 1C, the package substrate 2100 of the semiconductor package 2003 may be a printed circuit board. The package substrate 2100 may include a package substrate body portion 2120, a plurality of package upper pads 2130 (e.g., see FIG. 1B) on a top surface of the package substrate body portion 2120, a plurality of lower pads 2125 on or exposed through a bottom surface of the package substrate body portion 2120, and a plurality of internal lines 2135 in the package substrate body portion 2120 to electrically connect the package upper pads 2130 to the lower pads 2125. The plurality of package upper pads 2130 may be electrically connected to the connection structures 2400. The plurality of lower pads 2125 may be connected to respective ones of the plurality of interconnection patterns 2005 of the main substrate 2001 of the electronic system 2000 shown in FIG. 1B through a plurality of conductive connecting portions 2800.

Each of the plurality of semiconductor chips 2200 may include a semiconductor substrate 3010 and a first structure 3100 and a second structure 3200, which are sequentially stacked on the semiconductor substrate 3010. The first structure 3100 may include a peripheral circuit region including peripheral lines 3110. The second structure 3200 may include a source structure 3205, a stack 3210 on the source structure 3205, the plurality of vertical structures 3220 and the plurality of separation structures 3230 extending into the stack 3210, a plurality of bit lines 3240 electrically connected to the vertical structures 3220, and a plurality of cell contact plugs 3235 electrically connected to the word lines WL (e.g., see FIG. 1) of the stack 3210. The cell contact plugs 3235 are connected to interconnection lines 3250. Each of the first and second structures 3100 and 3200 and the plurality of semiconductor chips 2200 may further include separation structures to be described below.

Each of the semiconductor chips 2200 may include a penetration line 3245, which is electrically connected to the peripheral lines 3110 of the first structure 3100 and extends into the second structure 3200. The penetration line 3245 may be outside the stack 3210, and in one embodiment, the penetration line 3245 may be provided to further extend into the stack 3210. Each of the semiconductor chips 2200 may further include the input/output pad 2210 (e.g., see FIG. 1B), which is electrically connected to the peripheral lines 3110 of the first structure 3100.

Referring to FIG. 1D, in the semiconductor package 2003A, each of the semiconductor chips 2200a may include a semiconductor substrate 4010, a first structure 4100 on the semiconductor substrate 4010, and a second structure 4200, which is provided on the first structure 4100 and is bonded to the first structure 4100 in a wafer bonding manner.

The first structure 4100 may include a peripheral circuit region including at least one peripheral line 4110 and one or more first junction structures 4150. The second structure 4200 may include a source structure 4205, a stack 4210 between the source structure 4205 and the first structure 4100, a plurality of vertical structures 4220 and a separation structure 4230 extending into the stack 4210, and a plurality of second junction structures 4250, which are electrically and respectively connected to the plurality of vertical structures 4220 and the word lines WL (e.g., see FIG. 1A) of the stack 4210. For example, the second junction structures 4250 may be electrically connected to the vertical structures 4220 and the word lines WL (e.g., see FIG. 1A), respectively, through bit lines 4240 electrically connected to the vertical structures 4220 and cell contact plugs 4235 electrically connected to the word lines WL (e.g., see FIG. 1A). The first junction structures 4150 of the first structure 4100 may be in contact with and bonded to the second junction structures 4250 of the second structure 4200 in one embodiment. The bonded portions of the first junction structures 4150 and the second junction structures 4250 may be formed of or include, for example, copper (Cu).

Each of the first and second structures 4100 and 4200 and the semiconductor chips 2200a may further include a source structure according to an embodiment to be described below. Each of the semiconductor chips 2200a may further include the input/output pad 2210 (e.g., see FIG. 1B), which is electrically connected to the peripheral lines 4110 of the first structure 4100.

The semiconductor chips 2200 of FIG. 1C and the semiconductor chips 2200a of FIG. 1D may be electrically connected to each other by the connection structures 2400, which are provided in the form of bonding wires. However, in an alternative embodiment, semiconductor chips provided in each semiconductor package (e.g., the semiconductor chips 2200 of FIG. 1C and the semiconductor chips 2200a of FIG. 1D) may be electrically connected to each other through a connection structure including through-silicon vias (TSVs).

The first structure 3100 of FIG. 1C and the first structure 4100 of FIG. 1D may correspond to a peripheral circuit structure in an embodiment to be described below, and the second structure 3200 of FIG. 1C and the second structure 4200 of FIG. 1D may correspond to a cell array structure in an embodiment to be described below.

Figure 2:
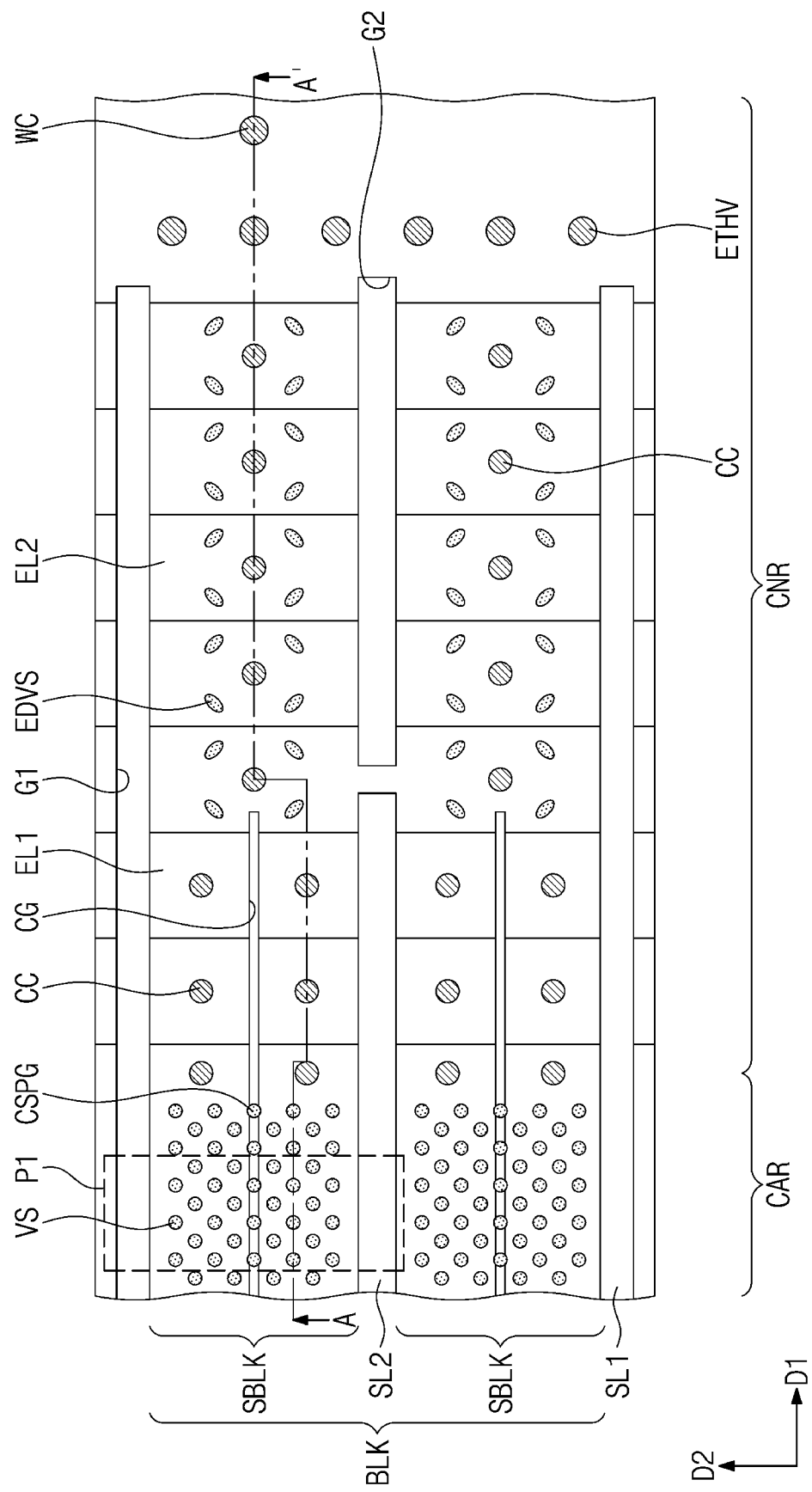
FIG. 2 is a plan view illustrating a three-dimensional semiconductor memory device according to an embodiment of the present disclosure.
Figure 3:
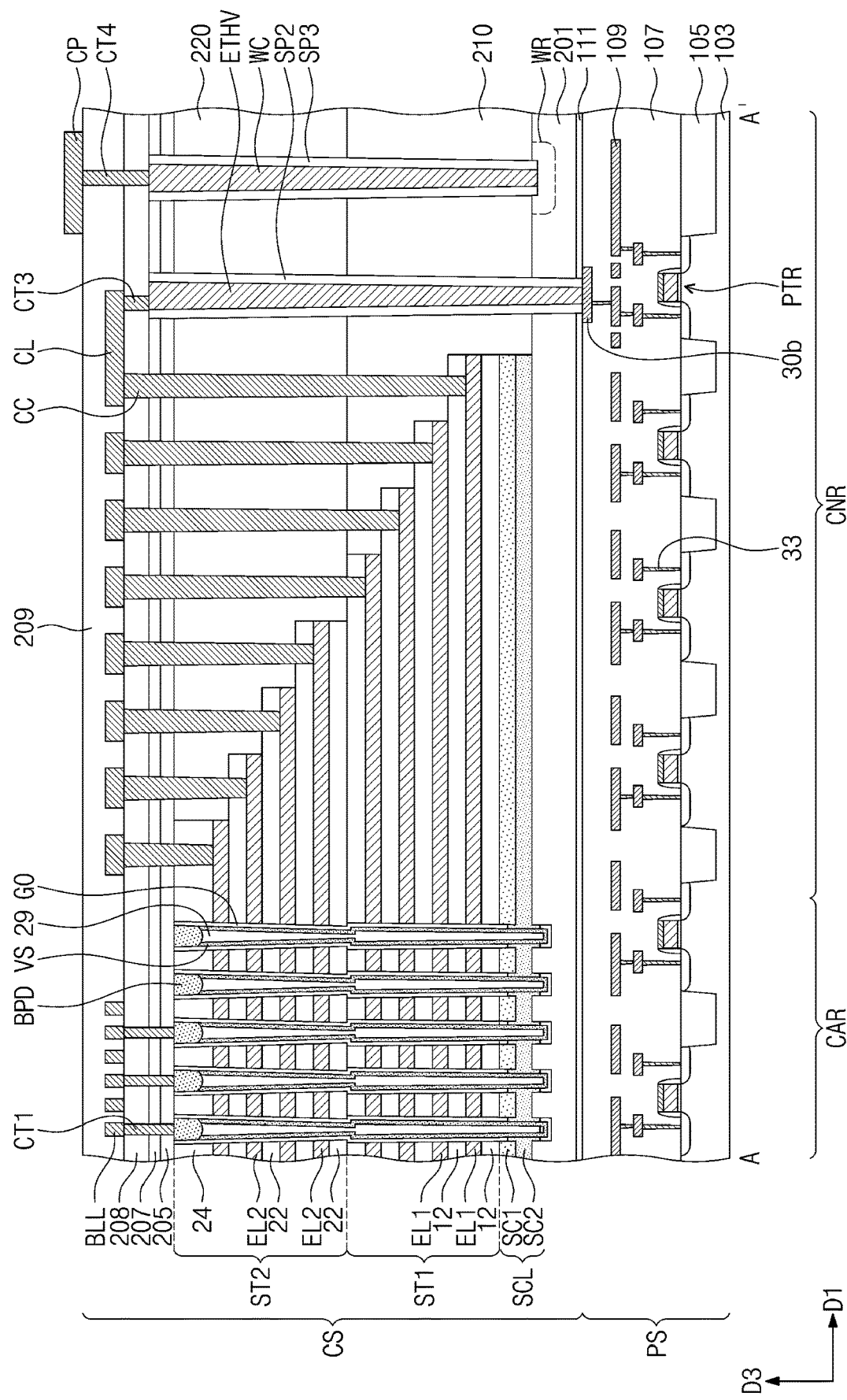
FIG. 3 is a sectional view taken along a line A-A' of FIG. 2.
Figure 4A:
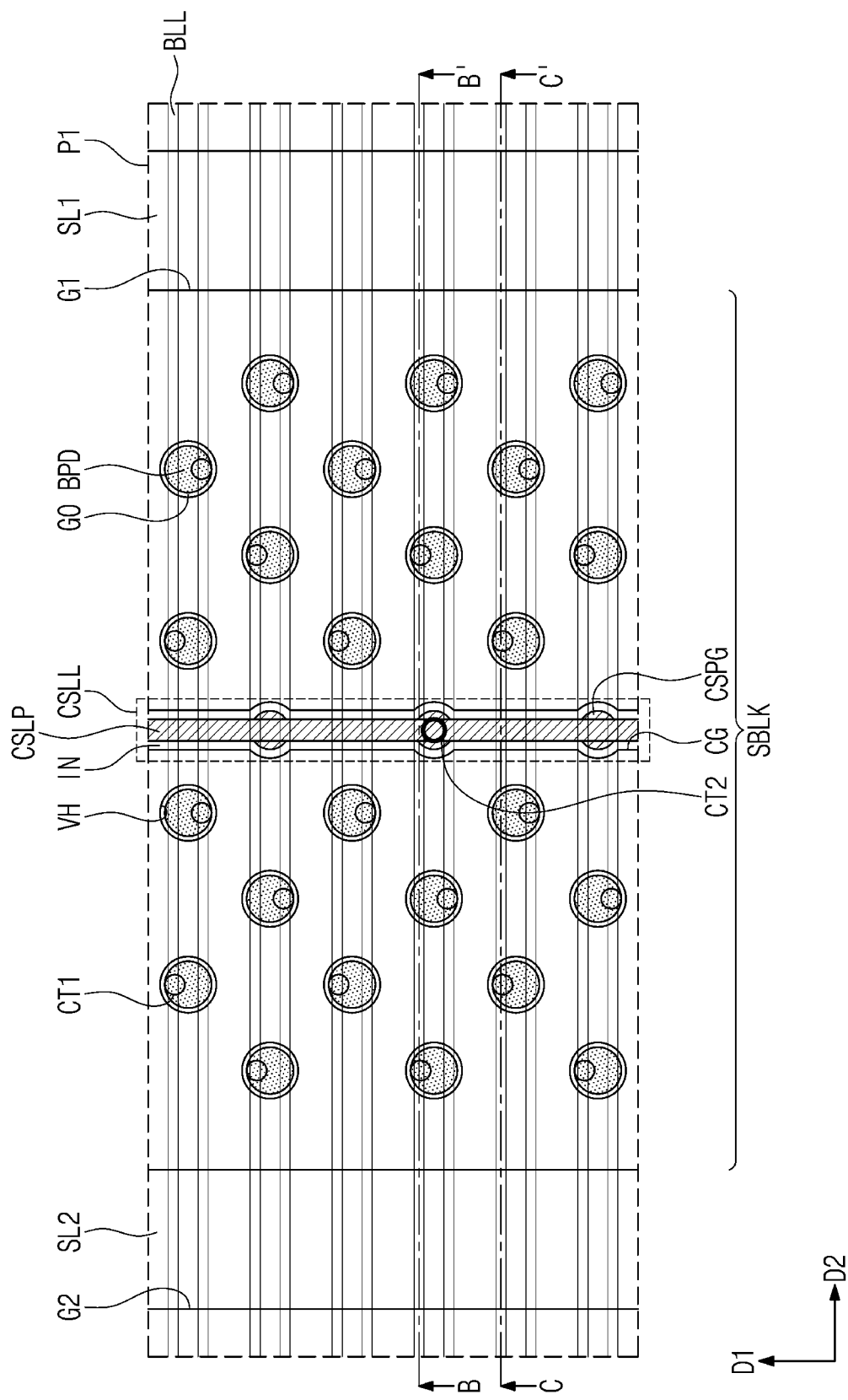
FIGS. 4A and 4B are enlarged plan views, each of which illustrates a detailed structure of a portion 'P1' of FIG. 2.
Figure 4B:
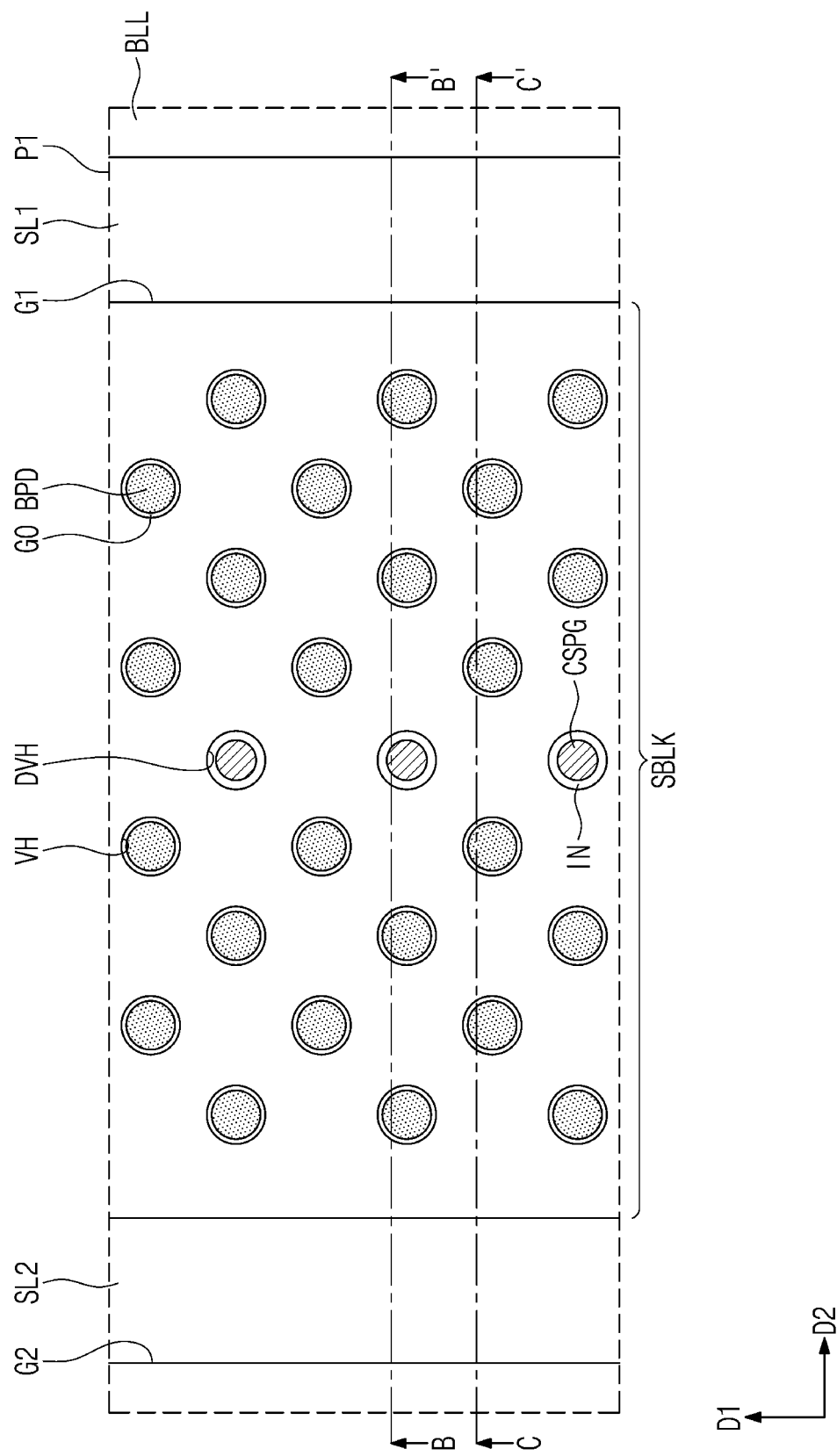
Figure 5A:
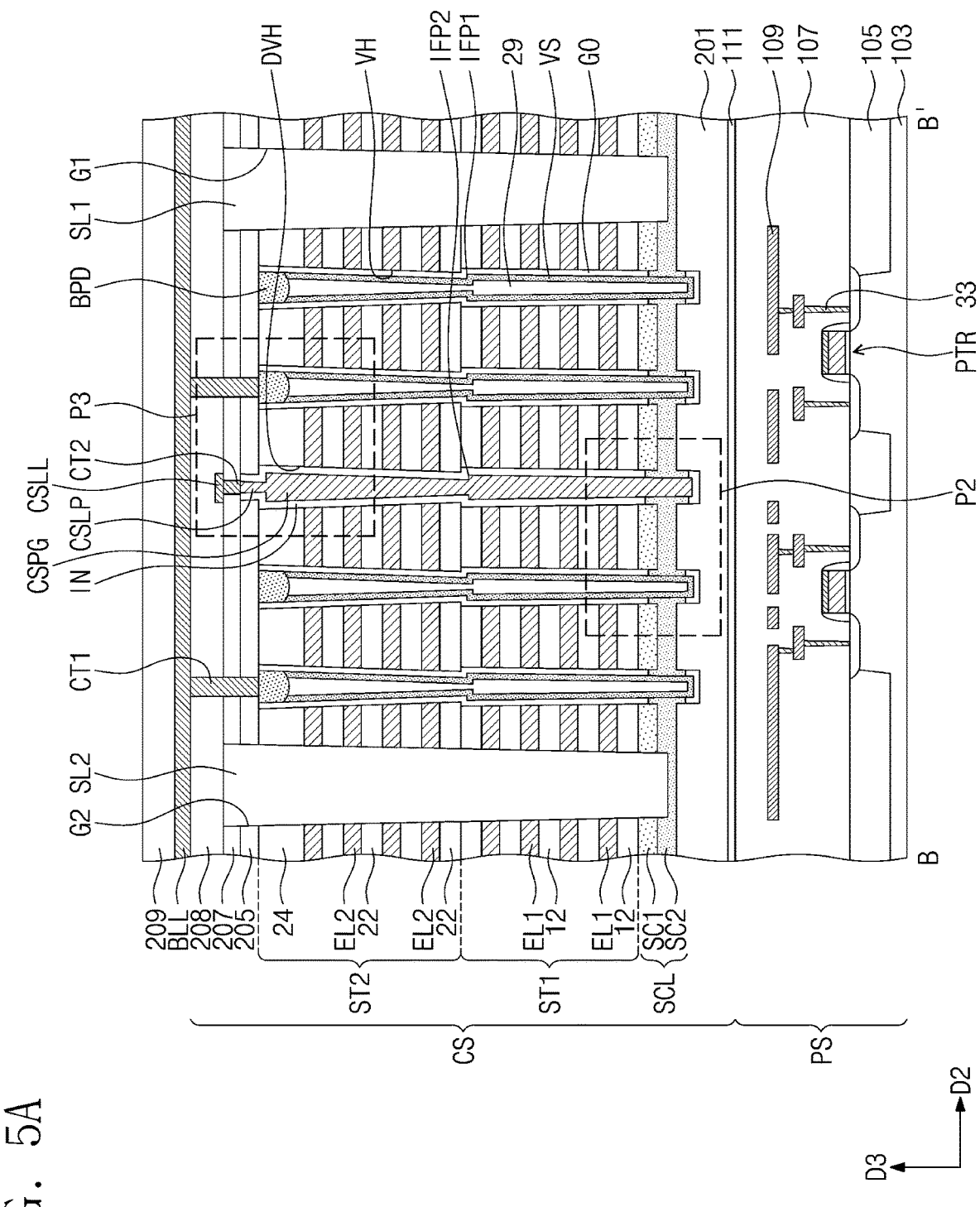
FIG. 5A is a sectional view taken along a line B-B' of FIG. 4A or 4B.
Figure 5B:
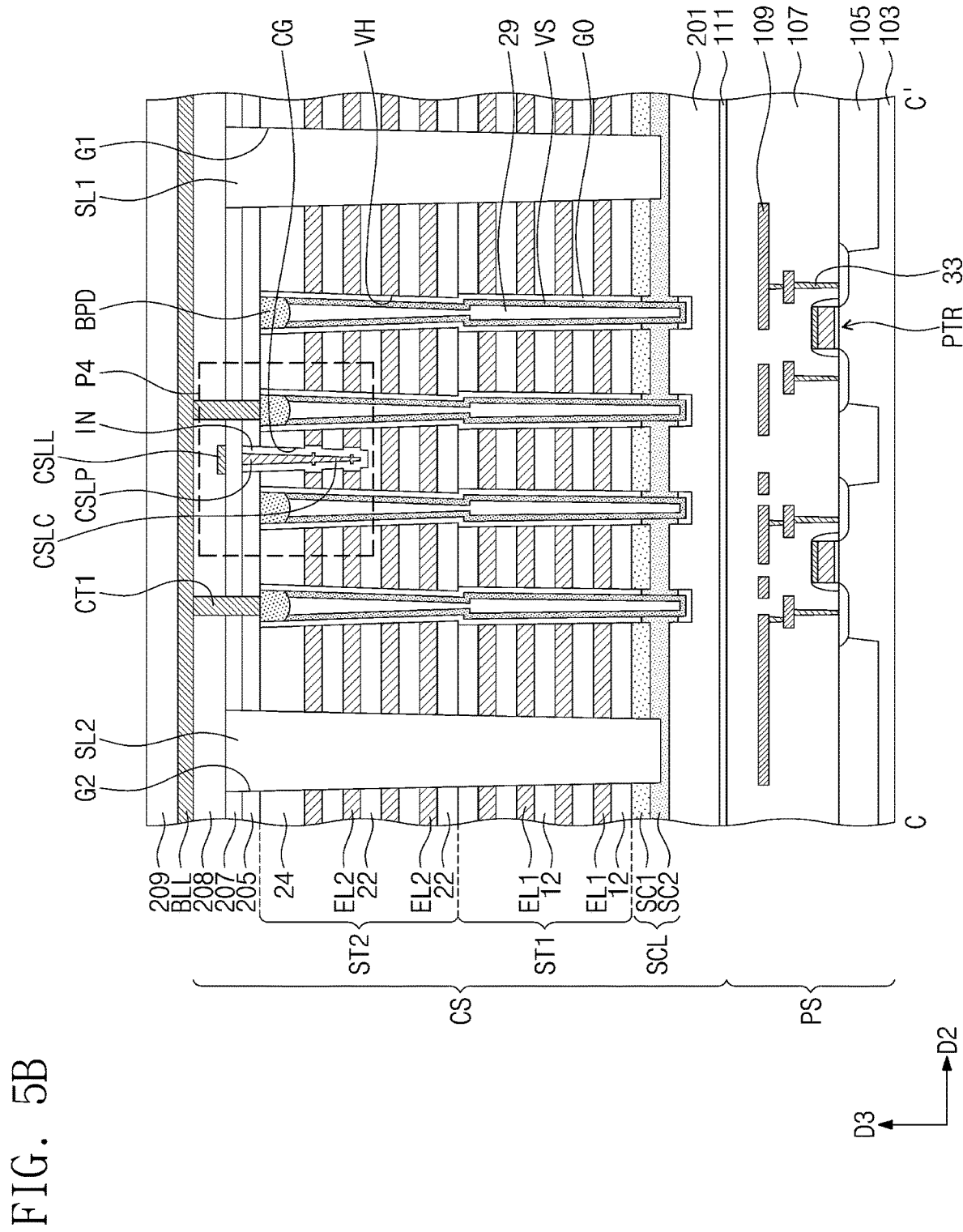
FIG. 5B is a sectional view taken along a line C-C' of FIG. 4A or 4B.

FIG. 2 is a plan view illustrating a three-dimensional semiconductor memory device according to an embodiment of the present disclosure. FIG. 3 is a sectional view taken along a line A-A' of FIG. 2. FIGS. 4A and 4B are enlarged plan views, each of which illustrates a detailed structure of a portion 'P1' of FIG. 2. FIG. 5A is a sectional view taken along a line B-B' of FIG. 4A or 4B. FIG. 5B is a sectional view taken along a line C-C' of FIG. 4A or 4B.

Referring to FIGS. 2, 3, 4A, 4B, 5A, and 5B, a cell array structure CS may be on a peripheral circuit structure PS. The cell array structure CS may include one or more blocks BLK arranged in a second direction D2 that is perpendicular to a first direction D1. Most of the blocks BLK may be a memory block, on which data programming, reading, and erasing operations are performed. Alternatively, some of the blocks BLK may be a dummy block, on which data programming, reading, and erasing operations are not performed. The blocks BLK may be separated from each other by one or more first separation insulating lines SL1. FIG. 2 illustrates one of the blocks BLK.

The first separation insulating line(s) SL1 may extend in a first direction D1 crossing the second direction D2. The first separation insulating line(s) SL1 may be in a first groove G1. The first separation insulating line(s) SL1 may include at least one of a silicon oxide layer, a silicon nitride layer, a silicon oxynitride layer, and a porous insulating layer and may have a single or multi-layered structure. Each of the blocks BLK may include a cell array region CAR and connection regions CNR at both sides of the cell array region CAR.

Each block BLK may be divided into two sub-blocks SBLK by a second separation insulating line SL2, which extends in the first direction D1 and passes through a center thereof. The second separation insulating line SL2 may not be cut in the cell array region CAR and may extend to the connection region CNR. The second separation insulating line SL2 may be cut in the connection region CNR and may be divided into two portions. The second separation insulating line SL2 may be in a second groove G2.

The peripheral circuit structure PS may include a first substrate 103. The first substrate 103 may be a single crystalline silicon substrate or a silicon-on-insulator (SOI) substrate. A device isolation layer 105 may be in the first substrate 103 to delimit active regions. Peripheral transistors PTR may be on the active regions. Each of the peripheral transistors PTR may include a peripheral gate electrode, a peripheral gate insulating layer, and peripheral source/drain regions, which are formed in the first substrate 103 and at both sides of the peripheral gate electrode. The peripheral transistors PTR may be at least partially covered with a peripheral interlayer insulating layer 107. The peripheral interlayer insulating layer 107 may include at least one of a silicon oxide layer, a silicon nitride layer, a silicon oxynitride layer, and a porous insulating layer and may have a single or multi-layered structure. Peripheral lines 109 and peripheral contacts 33 may be in the peripheral interlayer insulating layer 107. The peripheral lines 109 and the peripheral contacts 33 may be formed of or include at least one conductive material.

Some of the peripheral lines 109 and the peripheral contacts 33 may be electrically connected to the peripheral transistors PTR. The peripheral lines 109 and the peripheral transistors PTR may constitute the page buffer circuit 1120 and the decoder circuit 1110 of FIG. 1A. The peripheral circuit structure PS may include conductive pads 30b provided at the topmost level thereof.

An etch stop layer 111 may be on the peripheral circuit structure PS. The etch stop layer 111 may be formed of or include a material having an etch selectivity with respect to a second substrate 201 and the peripheral interlayer insulating layer 107. For example, the etch stop layer 111 may be formed of or include silicon nitride or silicon oxide. The etch stop layer 111 may be referred to as an 'adhesive layer'.

Each block BLK in the cell array structure CS may include the second substrate 201, a source structure SCL, a first sub-stack structure ST1, a second sub-stack structure ST2, and first to fourth upper interlayer insulating layers 205, 207, 208, and 209, which are sequentially stacked. The first sub-stack structure ST1 may include first electrode layers EL1 and first inter-electrode insulating layers 12, which are alternately stacked. The second sub-stack structure ST2 may include second electrode layers EL2 and second inter-electrode insulating layers 22, which are alternately stacked, and an uppermost second inter-electrode insulating layer 24, which is provided at the uppermost level of the second sub-stack structure ST2, where the uppermost level is a level that is the furthest away from a reference plane, such as the first substrate 103. The second substrate 201 may be, for example, a single crystalline silicon layer, a silicon epitaxial layer, or a SOI substrate. The second substrate 201 may be doped with impurities of a first conductivity type. In one embodiment, the impurity may be boron, and the first conductivity type may be p-type. In another embodiment, the impurity may be arsenic or phosphorus and the first conductivity type may be n-type.

The lowermost and next lowermost ones of the first electrode layers EL1 may correspond to the first and second gate lower lines LL1 and LL2 of FIG. 1A or may correspond to the gate electrodes of the lower transistors LT1 and LT2 (i.e., the lower erase control transistor LT1 and the ground selection transistor LT2). In this case, the term "lowermost" refers to an element that is the closest to a reference plane, such as the first substrate 103

In each sub-block SBLK, at least two topmost ones of the second electrode layers EL2 may be divided into a plurality of lines, which are used as the gate upper lines UL1 and UL2 in FIG. 1A, by a source groove CG. The lowermost and next lowermost ones of the second electrode layers EL2 may correspond to the gate electrodes of the upper transistors UT1 and UT2 of FIG. 1A (i.e., the upper erase control transistor UT2 and the string selection transistor UT1), respectively. The remaining ones of the electrode layers EL1 and EL2 may serve as the word lines WL of FIG. 1A. In an embodiment, at least one of the remaining ones of the electrode layers EL1 and EL2 may correspond to a dummy word line, which is not used for an actual operation.

The electrode layers EL1 and EL2 may be formed of or include at least one of, for example, doped semiconductor materials (e.g., doped silicon), metallic materials (e.g., dummy, copper, or aluminum), conductive metal nitrides (e.g., titanium nitride or tantalum nitride), or transition metals (e.g., titanium or tantalum). The inter-electrode insulating layers 12, 22, and 24 may have a single- or multi-layered structure including at least one of a silicon oxide layer, a silicon nitride layer, a silicon oxynitride layer, or a porous insulating layer.

The source structure SCL may include a first source pattern SC1 (also referred to as a first source layer), which is between the lowermost inter-electrode insulating layer 12 and the second substrate 201, and a second source pattern SC2 (also referred to as a second source layer), which is between the first source pattern SC1 and the second substrate 201. The first source pattern SC1 may include a doped semiconductor pattern (e.g., a doped polysilicon pattern of the first conductivity type). The second source pattern SC2 may include a doped semiconductor pattern (e.g., a doped polysilicon pattern). The second source pattern SC2 may further include a semiconductor material that is different from the first source pattern SC1. The second source pattern SC2 may have the same conductivity type as the first source pattern SC1. A doping concentration of the second source pattern SC2 may be equal to or different from that of the first source pattern SC1. The source structure SCL may correspond to the common source line CSL of FIG. 1A. In addition, the second substrate 201 may serve as the common source line CSL of FIG. 1A.

Figure 6A:
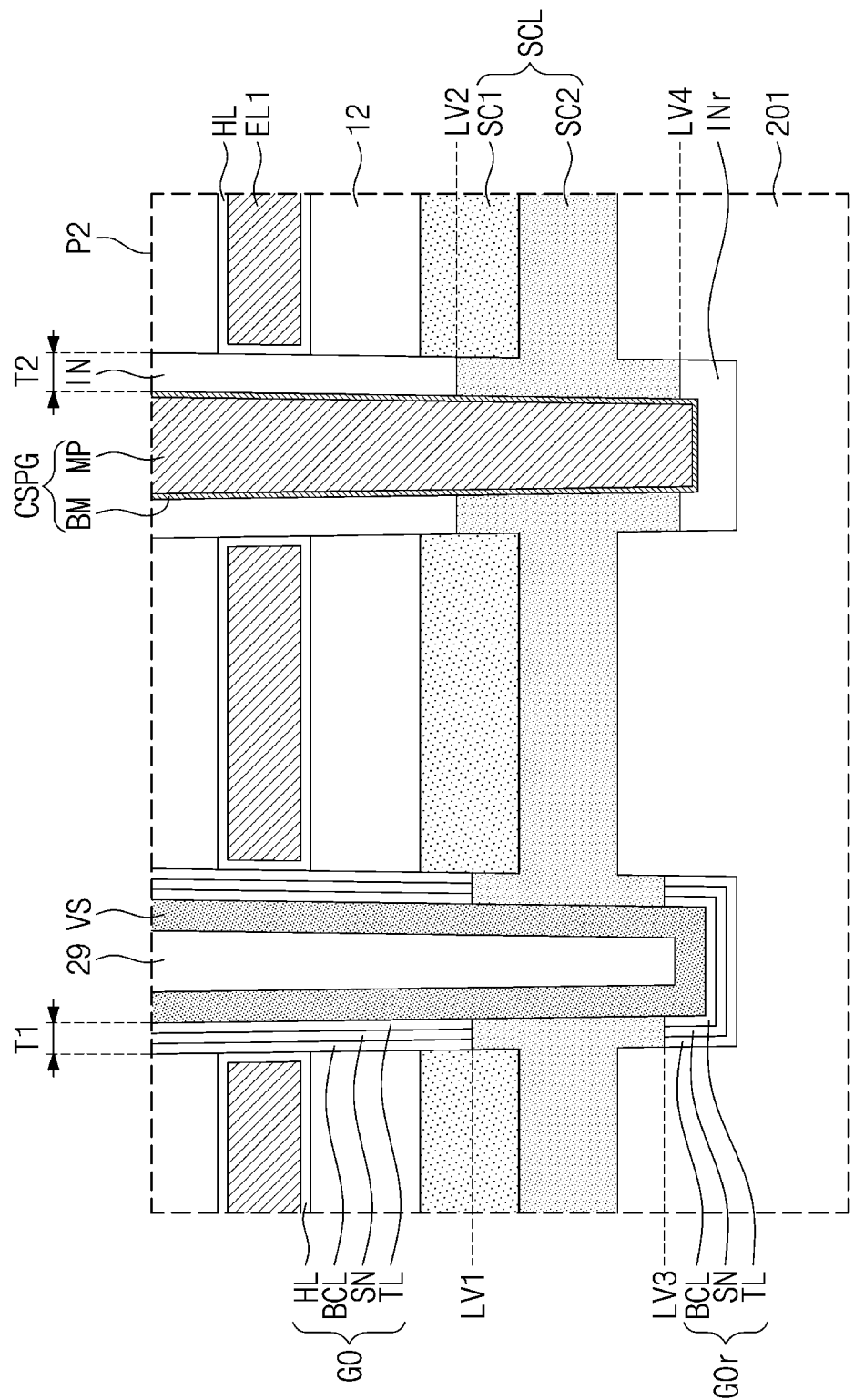
FIG. 6A is an enlarged sectional view of a portion 'P2' of FIG. 5A.
Figure 6B:
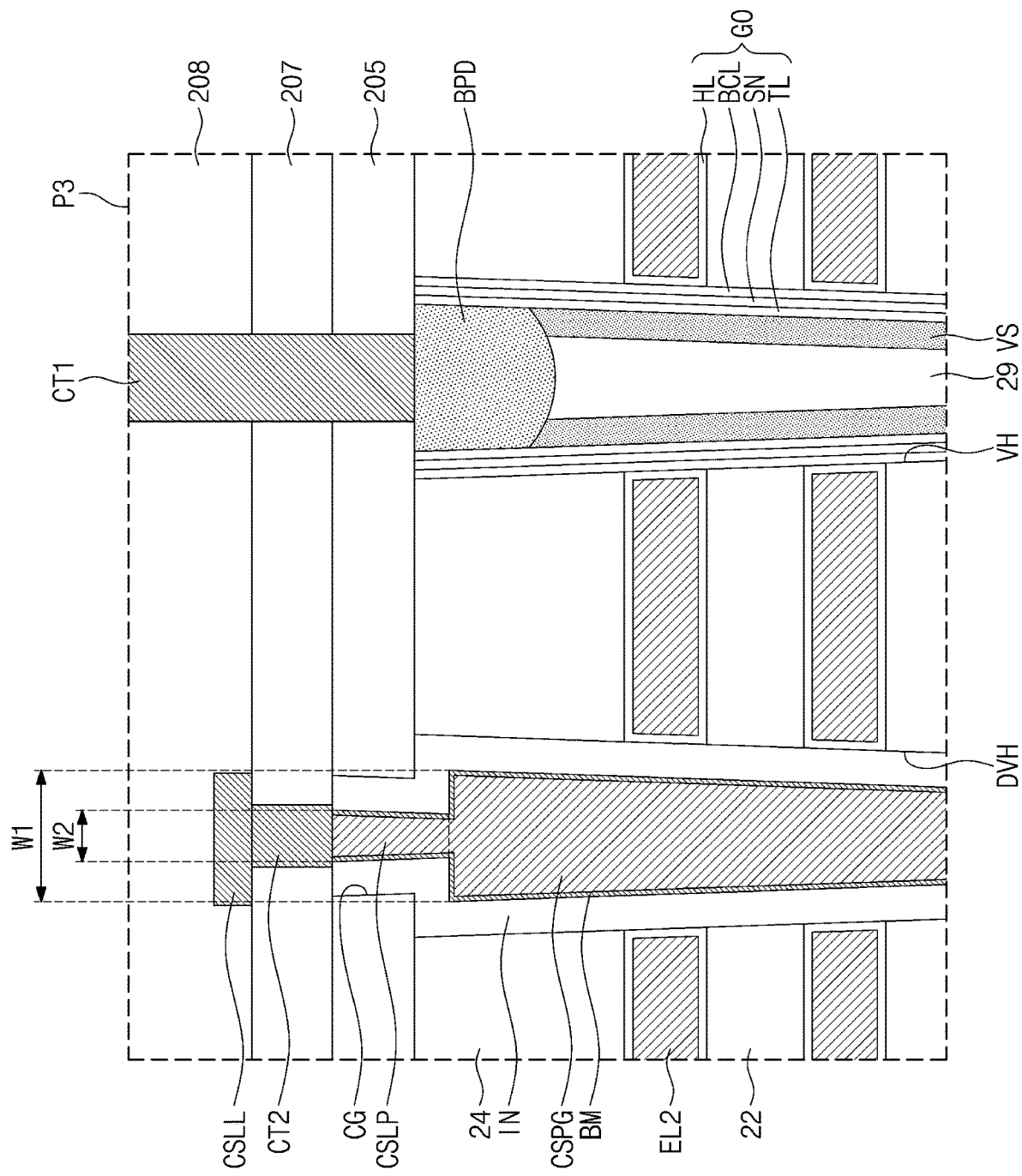
FIG. 6B is an enlarged sectional view of a portion 'P3' of FIG. 5A.
Figure 6C:
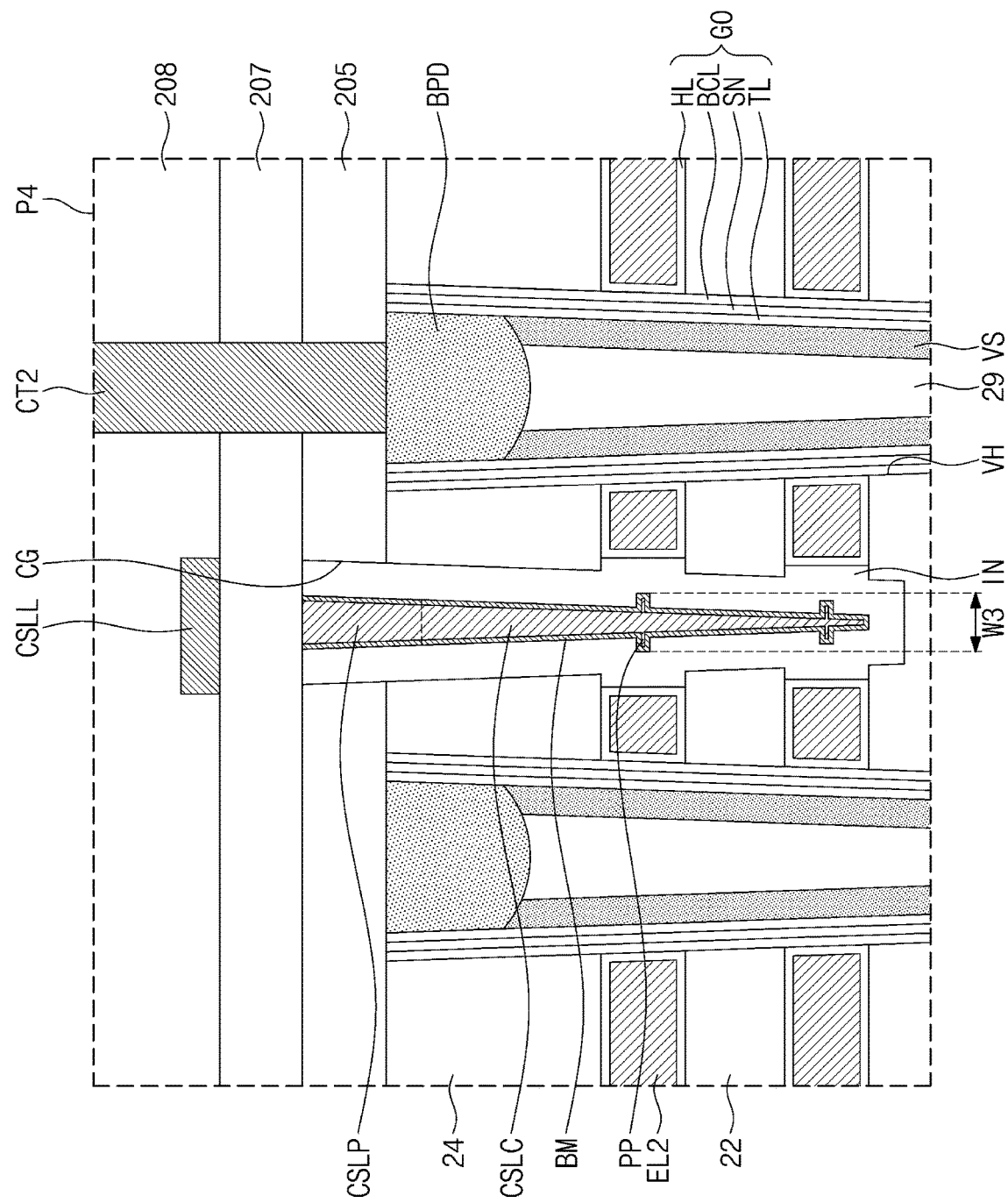
FIG. 6C is an enlarged sectional view of a portion 'P4' of FIG. 5B.
Figure 7:
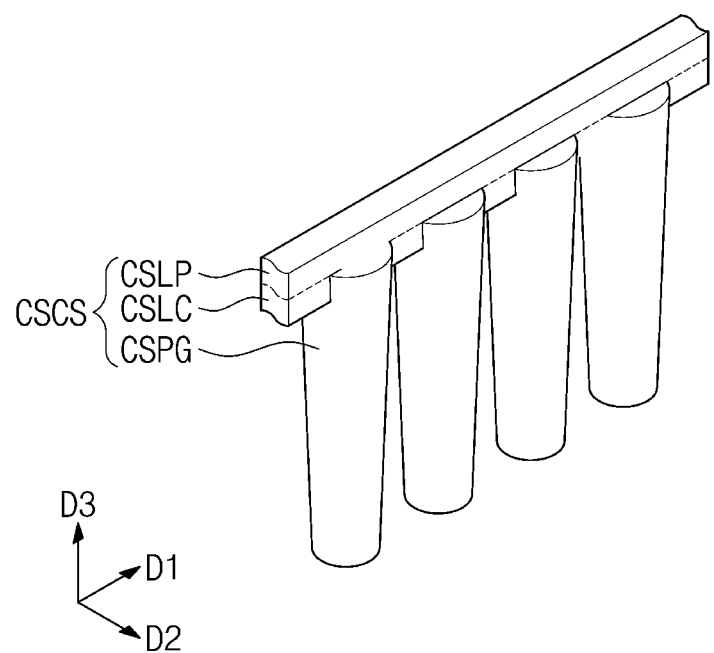
FIG. 7 is a perspective view illustrating a common source contact structure according to an embodiment of the present disclosure.

FIG. 6A is an enlarged sectional view of a portion 'P2' of FIG. 5A. FIG. 6B is an enlarged sectional view of a portion 'P3' of FIG. 5A. FIG. 6C is an enlarged sectional view of a portion 'P4' of FIG. 5B. FIG. 7 is a perspective view illustrating a common source contact structure according to an embodiment of the present disclosure.

Referring to FIGS. 4A, 4B, 5A, 5B, 6A, 6B, 6C, and 7, vertical semiconductor patterns VS (which may also be referred to as vertical semiconductor structures VS) and vertical conductive patterns CSPG (which may also be referred to as vertical conductive structures CSPG) may be provided in the cell array region CAR of each of the sub-blocks SBLK to extend into the inter-electrode insulating layers 12, 22, and 24 and the electrode layers EL1 and EL2. The vertical conductive patterns CSPG may be located between the vertical semiconductor patterns VS. As shown in FIG. 4B, the vertical conductive patterns CSPG, which are placed in dummy vertical holes DVH, may be arranged to form a single row that is parallel to the first direction D1 and overlaps the center of each sub-block SBLK.

The second sub-stack structure ST2 may be at least partially covered with the first upper interlayer insulating layer 205. The source groove CG may be formed in the first upper interlayer insulating layer 205 and an upper portion of the second sub-stack structure ST2.

The source groove CG may be between upper portions of the vertical conductive patterns CSPG in the first direction D1. A top surface of the vertical conductive pattern CSPG may be connected to a conductive line portion CSLP. The conductive line portion CSLP may protrude above the top surface of the vertical conductive pattern CSPG. An upper side surface of the vertical conductive pattern CSPG may be in contact with a conductive connecting portion CSLC in the first direction D1. The conductive connecting portion CSLC may be in contact with a bottom surface of the conductive line portion CSLP.

The vertical conductive patterns CSPG may be in the dummy vertical hole DVH. The conductive connecting portion CSLC and the conductive line portion CSLP may be in the source groove CG. As shown in FIG. 6B, a width W1 of a top surface of the vertical conductive pattern CSPG may be larger than a width W2 of the conductive line portion CSLP. The width W1 of the top surface of the vertical conductive pattern CSPG may be larger than a width W3 of the conductive connecting portion CSLC (see FIG. 6C).

The vertical conductive pattern CSPG, the conductive line portion CSLP, and the conductive connecting portion CSLC may be provided to form a single unit. That is, there may be no interface between the vertical conductive pattern CSPG, the conductive line portion CSLP, and the conductive connecting portion CSLC. The vertical conductive pattern CSPG, the conductive line portion CSLP, and the conductive connecting portion CSLC may constitute a common source contact structure CSCS of FIG. 7.

Referring to FIGS. 6A to 6C, each of the vertical conductive pattern CSPG, the conductive line portion CSLP, and the conductive connecting portion CSLC may include a metal pattern portion MP and a diffusion barrier layer BM, which is provided to be on, and at least partially cover, a surface (e.g., side and bottom surfaces) of the metal pattern portion MP. In an embodiment, the metal pattern portion MP may be formed of or include tungsten, and the diffusion barrier layer BM may be formed of or include titanium and/or titanium nitride. As shown in FIG. 6C, the conductive connecting portion CSLC may include protruding portions PP that laterally protrude from a side surface thereof. The side surface of the conductive connecting portion CSLC may have an uneven structure.

A side surface of the vertical conductive pattern CSPG may be at least partially covered with a separation insulating layer IN. The separation insulating layer IN may extend to be on, and at least partially cover, the side surfaces of the conductive connecting portion CSLC and the conductive line portion CSLP. In some embodiments, the separation insulating layer IN may be formed of or include silicon nitride.

Referring to FIG. 6B, a gate insulating layer GO may be provided on the vertical semiconductor patterns VS, and may enclose the vertical semiconductor patterns VS and/or cover at least a portion of side surfaces of the vertical semiconductor patterns VS in some embodiments. The gate insulating layer GO may have a first thickness T1. The separation insulating layer IN may have a second thickness T2. The second thickness T2 may be different from the first thickness T1. Preferably, in some embodiments, the second thickness T2 may be larger than the first thickness T1. The second thickness T2 may range from twenty nanometers (20 nm) to fifty nanometers (50 nm) in some embodiments.

The gate insulating layer GO may be between the electrode layers EL1 and EL2 and the vertical semiconductor patterns VS. Each of the vertical semiconductor patterns VS may have a hollow cup or shell shape. The vertical semiconductor patterns VS may be formed of or include undoped silicon. Referring to FIG. 5A, a side surface of the vertical semiconductor pattern VS may have a first inflection point IFP1, which is located near an interface between the first and second sub-stack structures ST1 and ST2. A side surface of the vertical conductive pattern CSPG may have a second inflection point IFP2, which is located near the interface between the first and second sub-stack structures ST1 and ST2.

An inner region of the vertical semiconductor pattern VS may be partially or completely filled with an insulating gapfill pattern 29. The insulating gapfill pattern 29 may have a single or multi-layered structure including at least one of, for example, a silicon oxide layer, a silicon nitride layer, or a silicon oxynitride layer. A bit line pad BPD may be on each of the vertical semiconductor patterns VS. The bit line pad BPD may be formed of or include at least one of doped polysilicon or metallic materials (e.g., tungsten, aluminum, and copper).

As shown in FIG. 6A, the second source pattern SC2 may be provided to extend into the gate insulating layer GO and to be in contact with a lower side surface of each of the vertical semiconductor patterns VS. The second source pattern SC2 may be provided to extend into the separation insulating layer IN and to be in contact with a lower side surface of each of the vertical conductive patterns CSPG. The second source pattern SC2 may be in contact with the diffusion barrier layer BM of the vertical conductive patterns CSPG. Accordingly, it may be possible to prevent a metallic element, which is included in the metal pattern portion MP of the vertical conductive patterns CSPG, from being diffused into a silicon layer constituting the second source pattern SC2.

As shown in FIG. 6A, a top end of the second source pattern SC2 on the lower side surfaces of the vertical semiconductor patterns VS may be located at a first level LV1. The top end of the second source pattern SC2 on the lower side surfaces of the vertical conductive patterns CSPG may be located at a second level LV2 different from the first level LV1. Preferably, in some embodiments, the second level LV2 may be higher than the first level LV1. A bottom end of the second source pattern SC2 on the lower side surfaces of the vertical semiconductor patterns VS may be located at a third level LV3. The bottom end of the second source pattern SC2 on the lower side surfaces of the vertical conductive patterns CSPG may be located at a fourth level LV4 different from the third level LV3. Preferably, in some embodiments, the fourth level LV4 may be lower than the third level LV3. As used herein, "level" may mean a height level when viewed with respect to a reference plane, such as an upper surface of the substrate 201. When an Element A is said to be at a "higher level" than Element B, this may mean that Element A is a height level that is further away from an upper surface of the substrate 201 than the height level of Element B. When an Element A is said to be at a "lower level" than Element B, this may mean that Element A is a height level that is closer to an upper surface of the substrate 201 than the height level of Element B.

Referring to FIG. 6A, the gate insulating layer GO may include a tunnel insulating layer TL, a charge storing layer SN, and a blocking insulating layer BCL. The charge storing layer SN may be a trap insulating layer, a floating gate electrode, or an insulating layer including conductive nanodots. In detail, the charge storing layer SN may include at least one of a silicon nitride layer, a silicon oxynitride layer, a silicon-rich nitride layer, a nanocrystalline silicon layer, or a laminated trap layer. The tunnel insulating layer TL may be formed of or include one of materials having a band gap larger than the charge storing layer SN, and the blocking insulating layer BCL may be a high-k dielectric layer (e.g., an aluminum oxide layer and a hafnium oxide layer). The gate insulating layer GO may further include a high-k dielectric layer HL. The high-k dielectric layer HL may be between the blocking insulating layer BCL and the electrode layers EL1 and EL2. The high-k dielectric layer HL may be between the electrode layers EL1 and EL2 and the inter-electrode insulating layers 12, 22, and 24. The high-k dielectric layer HL may have a dielectric constant higher than the silicon oxide layer and may include a metal oxide layer (e.g., a hafnium oxide layer and an aluminum oxide layer).

As shown in FIG. 6A, the thickness T1 of the gate insulating layer GO may correspond to a sum of thicknesses of the tunnel insulating layer TL, the charge storing layer SN, and the blocking insulating layer BCL, except for the high-k dielectric layer HL. The second source pattern SC2 may be provided extend into the gate insulating layer GO and to be in contact with the vertical semiconductor patterns VS. Accordingly, a lower portion of the gate insulating layer GO may be spaced apart from an upper portion of the gate insulating layer GO by the second source pattern SC2 and may form a residual gate insulating layer GOr. The second source pattern SC2 may be provided to extend into the separation insulating layer IN and to be in contact with the vertical conductive patterns CSPG. Accordingly, a lower portion of the separation insulating layer IN may be spaced apart from an upper portion of the separation insulating layer IN by the second source pattern SC2 and may form a residual separation insulating layer INr.

Referring back to FIGS. 5A and 5B, a second upper interlayer insulating layer 207 may be on the first upper interlayer insulating layer 205. Each of the first and second separation insulating lines SL1 and SL2 may be provided to extend into the second upper interlayer insulating layer 207, the first upper interlayer insulating layer 205, and the sub-stack structures ST1 and ST2. Preferably, in some embodiments, each of the first and second separation insulating lines SL1 and SL2 may be formed of or include silicon oxide. In the present embodiment, the first and second separation insulating lines SL1 and SL2 may be provided to extend into the first source pattern SC1 of the source structure SCL and to be in contact with the second source pattern SC2. Bottom surfaces of the first and second separation insulating lines SL1 and SL2 may be located at the same level.

Alternatively, although not shown, the first and second separation insulating lines SL1 and SL2 may be provided to extend into both of the first and second source patterns SC1 and SC2 of the source structure SCL and to be in contact with the second substrate 201.

Referring to FIGS. 5A and 5B, a third upper interlayer insulating layer 208 may be on the second upper interlayer insulating layer 207. First conductive lines BLL may be on the third upper interlayer insulating layer 208 to extend in the second direction D2 and parallel to each other. The first conductive lines BLL may correspond to the bit lines BL of FIG. 1A. First contacts CT1 may be provided on the cell array region CAR to extend into the first to third upper interlayer insulating layers 205, 207, and 208 and to connect the bit line pads BPD, which are on the vertical semiconductor patterns VS, to one of the first conductive lines BLL.

A second contact CT2 may be provided to extend into the second upper interlayer insulating layer 207 and to be in contact with the conductive line portion CSLP. A second conductive line CSLL may be on the second upper interlayer insulating layer 207 and may be in contact with the second contact CT2. The second conductive line CSLL may extend in the first direction D1, as shown in FIG. 4A.

Referring to FIGS. 2 and 3, the sub-stack structures ST1 and ST2, which are respectively included in the blocks BLK, may have a staircase shape on the connection region CNR. That is, the electrode layers EL1 and EL2 and the inter-electrode insulating layers 12, 22, and 24 may have a staircase shape on the connection region CNR. As a distance to the peripheral circuit structure PS decreases, the electrode layers EL1 and EL2 and the inter-electrode insulating layers 12, 22, and 24 may protrude with an increasing length in the first direction D1. An end portion of the first sub-stack structure ST1 on the connection region CNR may be at least partially covered with a first planarization insulating layer 210. An end portion of the second sub-stack structure ST2 on the connection region CNR may be at least partially covered with a second planarization insulating layer 220. Each of the first and second planarization insulating layers 210 and 220 may include a silicon oxide layer or a porous insulating layer. The first to third upper interlayer insulating layers 205, 207, and 208 may be sequentially formed on the first and second planarization insulating layers 210 and 220.

End portions of the electrode layers EL1 and EL2 may be connected to cell contact plugs CC, respectively. The cell contact plugs CC may be provided to extend into the first to third upper interlayer insulating layers 205, 207, and 208 and the inter-electrode insulating layers 12, 22, and 24 and to be in contact with the electrode layers EL1 and EL2, respectively.

Referring to FIG. 2, edge dummy vertical patterns EDVS may be provided to extend into the planarization insulating layers 210 and 220 and the end portions of the electrode layers EL1 and EL2 and the inter-electrode insulating layers 12, 22, and 24 constituting the staircase structure. The edge dummy vertical patterns EDVS may have an elliptical shape that is elongated in a specific direction when viewed in a plan view. The edge dummy vertical patterns EDVS may have the same or similar section as the vertical semiconductor pattern VS of FIG. 5A. Internal spaces of the edge dummy vertical patterns EDVS may be at least partially filled with the insulating gapfill pattern 29. The gate insulating layer GO may be between the edge dummy vertical patterns EDVS and the electrode layers EL1 and EL2. The bit line pad BPD may be on the edge dummy vertical patterns EDVS. However, the edge dummy vertical patterns EDVS may not be connected to the first conductive line BLL.

Referring back to FIG. 3, an electrode connection line CL may be on the third upper interlayer insulating layer 208. In the connection region CNR, an edge through via ETHV may be provided to extend into the first and second interlayer insulating layers 205 and 207, the planarization insulating layers 210 and 220, the second substrate 201, and the etch stop layer 111 and to be in contact with a peripheral conductive pad 30b. In the present embodiment, the edge through vias ETHV may be spaced apart from the sub-stack structures ST1 and ST2. The edge through vias ETHV may be respectively connected to the electrode connection lines CL through third contacts CT3, which are in the second interlayer insulating layer 207. Accordingly, the electrode layers EL1 and EL2 may be connected to the peripheral circuit structure PS (e.g., the decoder circuit 1110 of FIG. 1A). A via insulating pattern SP2 may be between the edge through via ETHV and the planarization insulating layers 210 and 220 and between the edge through via ETHV and the etch stop layer 111.

The edge through vias ETHV may be formed of or include at least one of metallic materials (e.g., tungsten, aluminum, copper, titanium, and tantalum). The via insulating pattern SP2 may be formed of or include at least one of insulating materials (e.g., silicon oxide, silicon nitride, and silicon oxynitride).

Referring to FIGS. 2 and 3, a substrate ground region WR may be disposed in a portion of the second substrate 201 spaced apart from the edge through vias ETHV. The substrate ground region WR may be doped to have the same conductivity type as the second substrate 201 (i.e., the first conductivity type) and to have a higher doping concentration than that in the second substrate 201. A substrate contact plug WC may be provided in the connection region CNR to extend into the first and second upper interlayer insulating layers 205 and 207 and the planarization insulating layers 210 and 220 and to be in contact with the substrate ground region WR.

The electrode connection lines CL may be at least partially covered with the fourth upper interlayer insulating layer 209. An outer terminal CP may be on the fourth upper interlayer insulating layer 209. A fourth contact CT4 may be provided to extend into the fourth and third upper interlayer insulating layers 209 and 208 and to connect the outer terminal CP to the substrate contact plug WC. A side surface of the substrate contact plug WC may be at least partially covered with a contact insulating pattern SP3.

In the present specification, the vertical conductive patterns CSPG may be referred to as 'source contacts'. In the three-dimensional semiconductor memory device described with reference to FIGS. 2 to 7B, the vertical conductive patterns CSPG may be provided in the dummy vertical holes DVH and may be used as the source contacts connected to the source structure SCL. In some embodiments, the source contacts or source contact lines may not be in the first and second grooves G1 and G2 corresponding to a 'word line cut region', and the first and second grooves G1 and G2 may be filled with only insulating layers (e.g., the separation insulating lines SL1 and SL2).

Accordingly, in the three-dimensional semiconductor memory device, an absolute volume or amount of the source contacts for connection with the source structure SCL may be reduced. In the case where an absolute amount of a metallic element (e.g., tungsten) constituting the source contacts is increased, a warpage issue, which is caused by a difference in thermal expansion coefficient between a silicon substrate and a tungsten layer, may be deepened. However, according to an embodiment of the present disclosure, since the absolute volume or amount of the source contacts is decreased, the absolute amount of the metallic element (e.g., tungsten) constituting the source contacts may also be decreased, and in this case, it may be possible to prevent or minimize the warpage issue.

Furthermore, in the cell array region CAR, the vertical conductive patterns CSPG may be in the dummy vertical holes DVH and a distance between the dummy vertical holes DVH may be maintained to a uniform value, and in this case, it may be possible to uniformly apply a source voltage to the source structure SCL. Accordingly, it may be possible to prevent or minimize a CSL noise.

Furthermore, in the cell array region CAR, the vertical conductive patterns CSPG may be in the dummy vertical holes DVH, and an additional space for forming the source contacts may not be required. Thus, it may be possible to reduce a horizontal size of a semiconductor memory device or to increase an integration density of the semiconductor memory device. In addition, since the horizontal size of the semiconductor memory device is reduced, the number of chips or net dies produced from one wafer may be increased, and thus, it may be possible to increase a yield.

FIG. 8A to 18A are sectional views sequentially illustrating a process of fabricating a three-dimensional semiconductor memory device having the section of FIG. 5A. FIG. 8B to 18B are sectional views sequentially illustrating a process of fabricating a three-dimensional semiconductor memory device having the section of FIG. 5B.

Figure 8A:
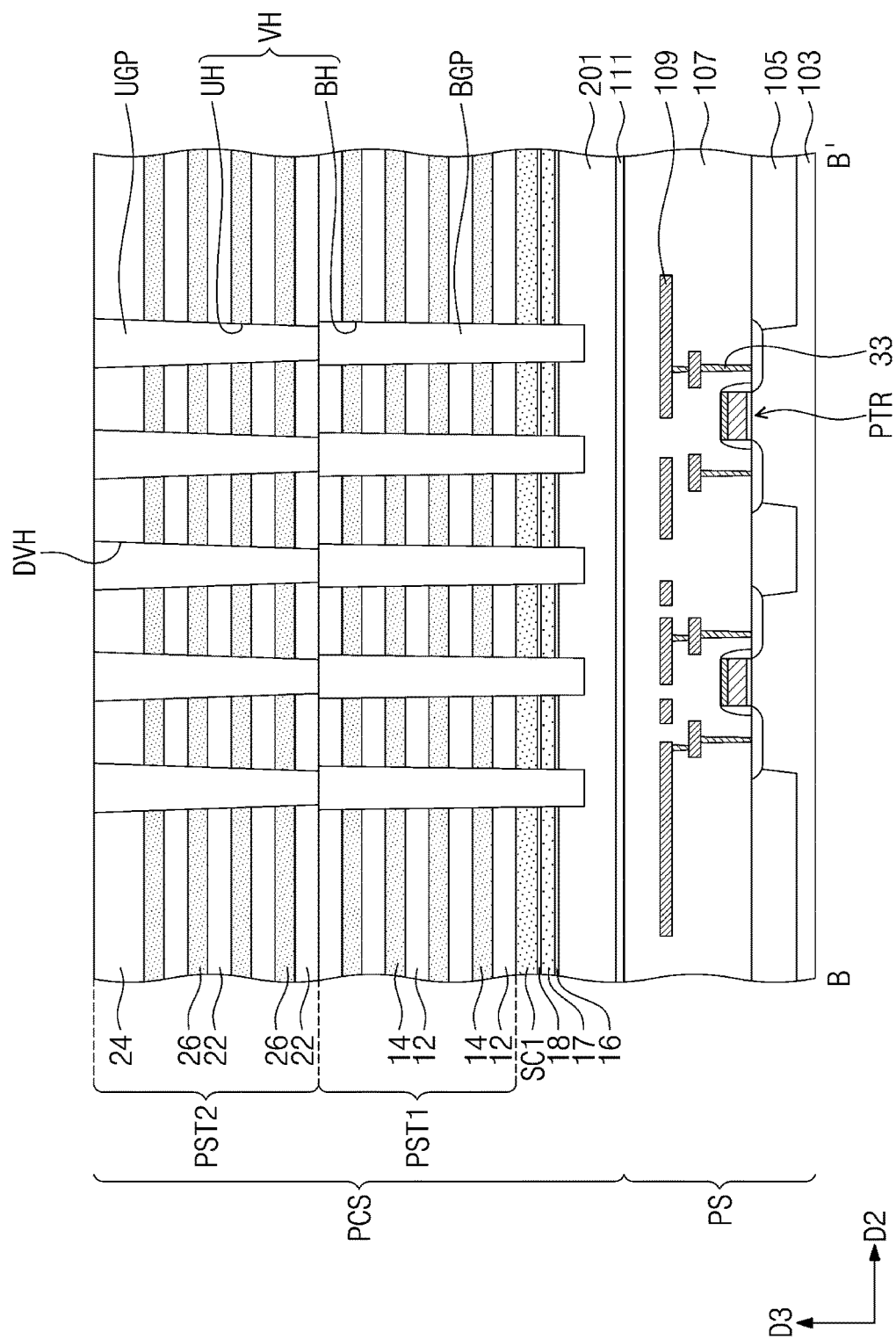
Figure 8B:
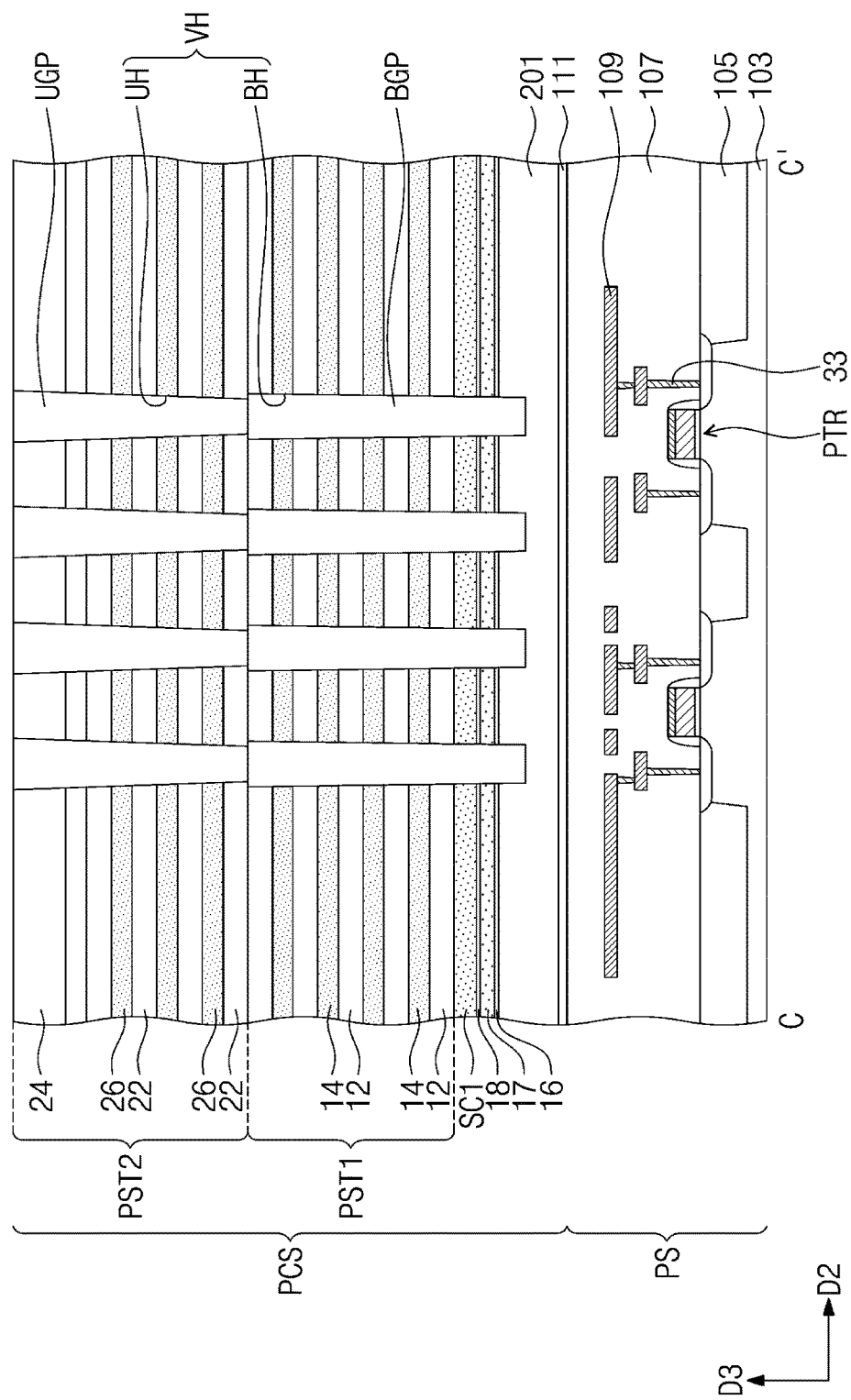

Referring to FIGS. 8A and 8B, the peripheral circuit structure PS may be fabricated. In detail, the device isolation layer 105 may be formed in the first substrate 103 to delimit the active regions. Transistors PTR may be formed on the active regions. The peripheral interlayer insulating layer 107, which may be composed of a plurality of layers, may be formed to cover the transistors PTR, and the peripheral contacts 33 and the peripheral lines 109 may be formed in the peripheral interlayer insulating layer 107. The peripheral the conductive pads 30b of FIG. 3 may be formed at the topmost portion of the peripheral circuit structure PS. The etch stop layer 111 may be formed on the peripheral circuit structure PS.

Next, the second substrate 201 may be formed on the etch stop layer 111. The second substrate 201 may be formed by forming a semiconductor epitaxial layer or by attaching a single crystalline semiconductor substrate to the etch stop layer 111. The second substrate 201 may be referred to as a semiconductor layer. The second substrate 201 may be doped to have, for example, a first conductivity type. The substrate ground region WR of FIG. 3 may be formed in the second substrate 201. The substrate ground region WR may be formed by doping the second substrate 201 with impurities of the first conductivity type and may have an impurity concentration that is higher than that of the second substrate 201. The second substrate 201 may include the cell array region CAR and the connection region CNR, as shown in FIG. 2.

A first buffer layer 16, a first sacrificial layer 17, a second buffer layer 18, and the first source pattern SC1 may be sequentially stacked on the second substrate 201. A first preliminary stack structure PST1 may be formed by alternately and repeatedly stacking the first inter-electrode insulating layers 12 and second sacrificial layers 14 on the first source pattern SC1. The first source pattern SC1 may be a doped poly-silicon layer. Preferably, in some embodiments, the first and second buffer layers 16 and 18 and the inter-electrode insulating layers 12 may include a silicon oxide layer. The first sacrificial layer 17 may be formed of or include a material having an etch selectivity with respect to all of the first and second buffer layers 16 and 18, the first inter-electrode insulating layers 12, the first source pattern SC1, and the second sacrificial layers 14. For example, the second sacrificial layers 14 may include a silicon nitride layer. The first sacrificial layer 17 may be a silicon germanium layer or a silicon oxynitride layer. Alternatively, the first sacrificial layer 17 may be a doped poly-silicon layer, which is doped to have a doping concentration different from the first source pattern SC1.

A trimming process and an anisotropic etching process may be repeatedly performed to form end portions of the first inter-electrode insulating layers 12 and the second sacrificial layers 14 in the staircase structure shown in FIG. 3 on the connection region CNR. Here, the first buffer layer 16, the first sacrificial layer 17, the second buffer layer 18, and the first source pattern SC1 may be partially etched to expose the top surface of the second substrate 201 on the connection region CNR. An insulating layer may be formed, and then, a chemical mechanical polishing (CMP) process may be performed on the insulating layer to form the first planarization insulating layer 210 covering end portions of the first preliminary stack structure PST1.

A plurality of bottom holes BH may be formed by partially etching the first preliminary stack structure PST1, the first source pattern SC1, the second buffer layer 18, the first sacrificial layer 17, the first buffer layer 16, and the second substrate 201 on the cell array region CAR and the dummy region DR. Bottom sacrificial gapfill patterns BGP may be formed to at least partially fill the bottom holes BH, respectively. The sacrificial gapfill pattern BGP may be formed of or include a material having an etch selectivity with respect to all of the first inter-electrode insulating layers 12, the second sacrificial layers 14, the first source pattern SC1, the second buffer layer 18, the first sacrificial layer 17, the first buffer layer 16, and the second substrate 201. For example, the bottom sacrificial gapfill pattern BGP may be formed of or include spin-on-hardmask (SOH) materials, amorphous carbon layer (ACL) materials, or SiGe.

A second preliminary stack structure PST2 may be formed by alternately and repeatedly stacking the second inter-electrode insulating layers 22 and 24 and third sacrificial layers 26 on the first preliminary stack structure PST1 and the first planarization insulating layer 210. The second inter-electrode insulating layers 22 and 24 may be formed of or include the same material as the first inter-electrode insulating layers 12. The third sacrificial layers 26 may be formed of or include the same material as the second sacrificial layers 14.

A trimming process and an anisotropic etching process may be repeatedly performed to form end portions of the second inter-electrode insulating layers 22 and 24 and the third sacrificial layers 26 in the staircase structure shown in FIG. 3 on the connection region CNR. An insulating layer may be formed, and then, a chemical mechanical polishing (CMP) process may be performed to form the second planarization insulating layer 220 covering end portions of the second preliminary stack structure PST2. Thereafter, upper holes UH may be formed by etching the second preliminary stack structure PST2 on the cell array region CAR and the dummy region DR, and in an embodiment, the upper holes UH may be formed to expose the sacrificial gapfill patterns BGP, respectively. Next, the upper holes UH may be at least partially filled with an upper sacrificial gapfill pattern UGP. The upper sacrificial gapfill pattern UGP may be formed of or include at least one of spin-on-hardmask (SOH) materials, amorphous carbon layer (ACL) materials, or SiGe.

The upper holes UH and the bottom holes BH, which overlap each other, may constitute the vertical holes VH and the dummy vertical holes DVH. As shown in FIG. 4B, the dummy vertical holes DVH may be between the vertical holes VH and may be arranged in the first direction D1.

Figure 9A:
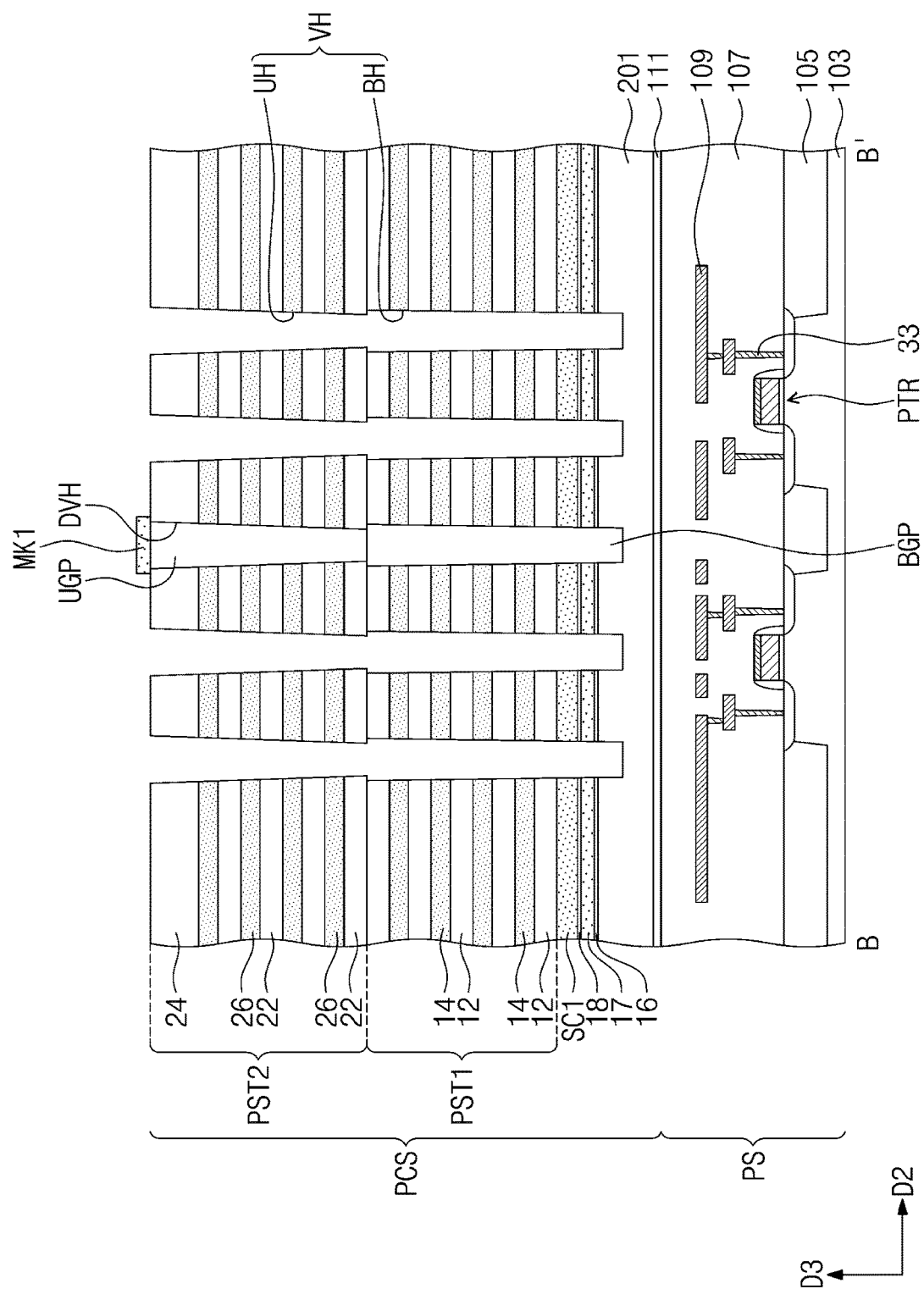
Figure 9B:
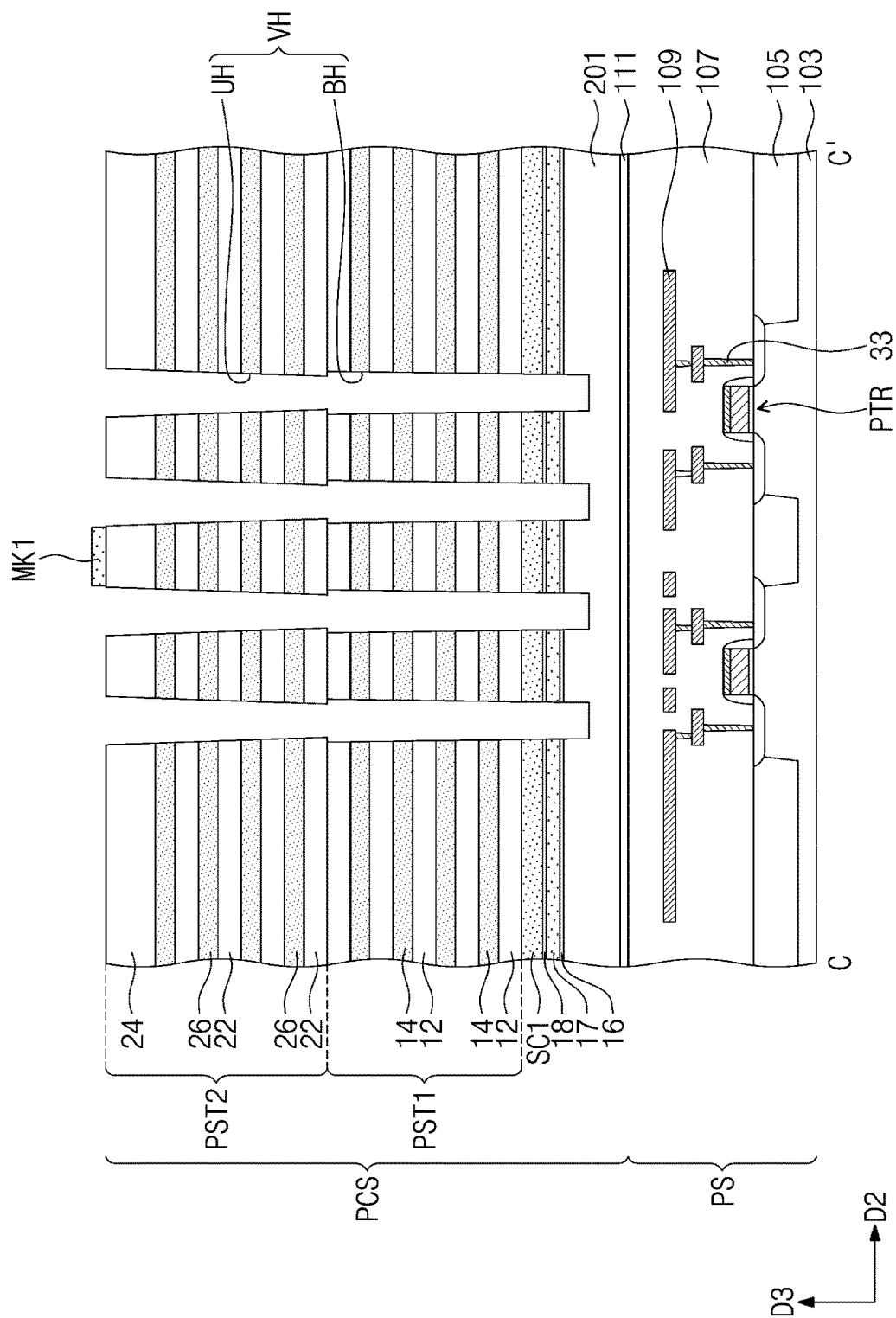

Referring to FIGS. 9A and 9B, a first mask pattern MK1 may be formed on the second preliminary stack structure PST2. The first mask pattern MK1 may be formed to overlap the dummy vertical holes DVH and may have a line shape extending in the first direction D1 of FIG. 4B. The first mask pattern MK1 may cover all of the dummy vertical holes DVH. The first mask pattern MK1 may not cover the vertical holes VH or may expose the vertical holes VH. The first mask pattern MK1 may be formed of or include a material which has an etch selectivity with respect to the upper and bottom sacrificial gapfill patterns UGP and BGP. For example, the first mask pattern MK1 may be formed of or include at least one of silicon nitride, silicon oxide, or silicon oxynitride. The upper and bottom sacrificial gapfill patterns UGP and BGP may be removed from the vertical holes VH using the first mask pattern MK1 as an etch mask to expose inner surfaces of the vertical holes VH.

Figure 10A:
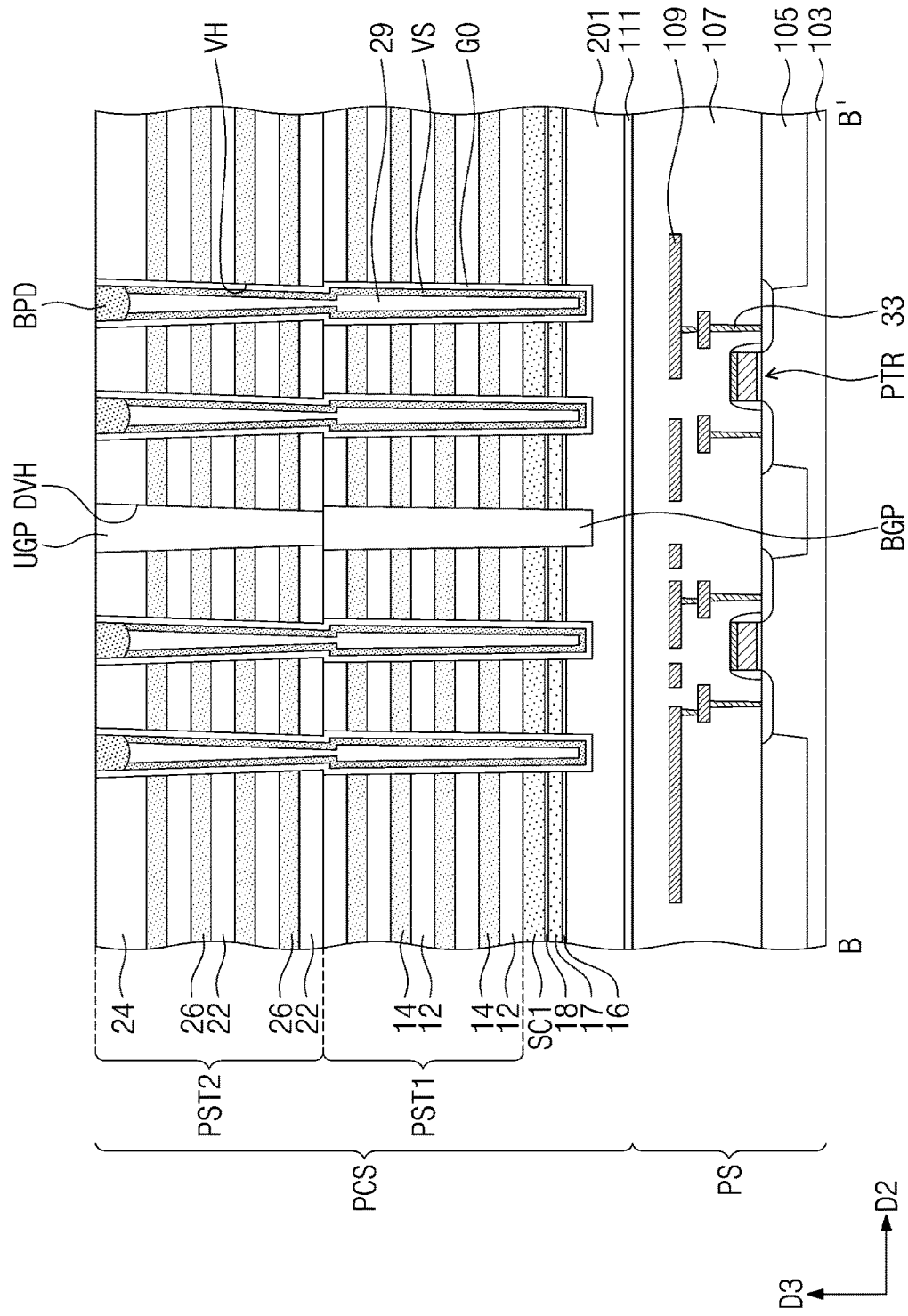
Figure 10B:
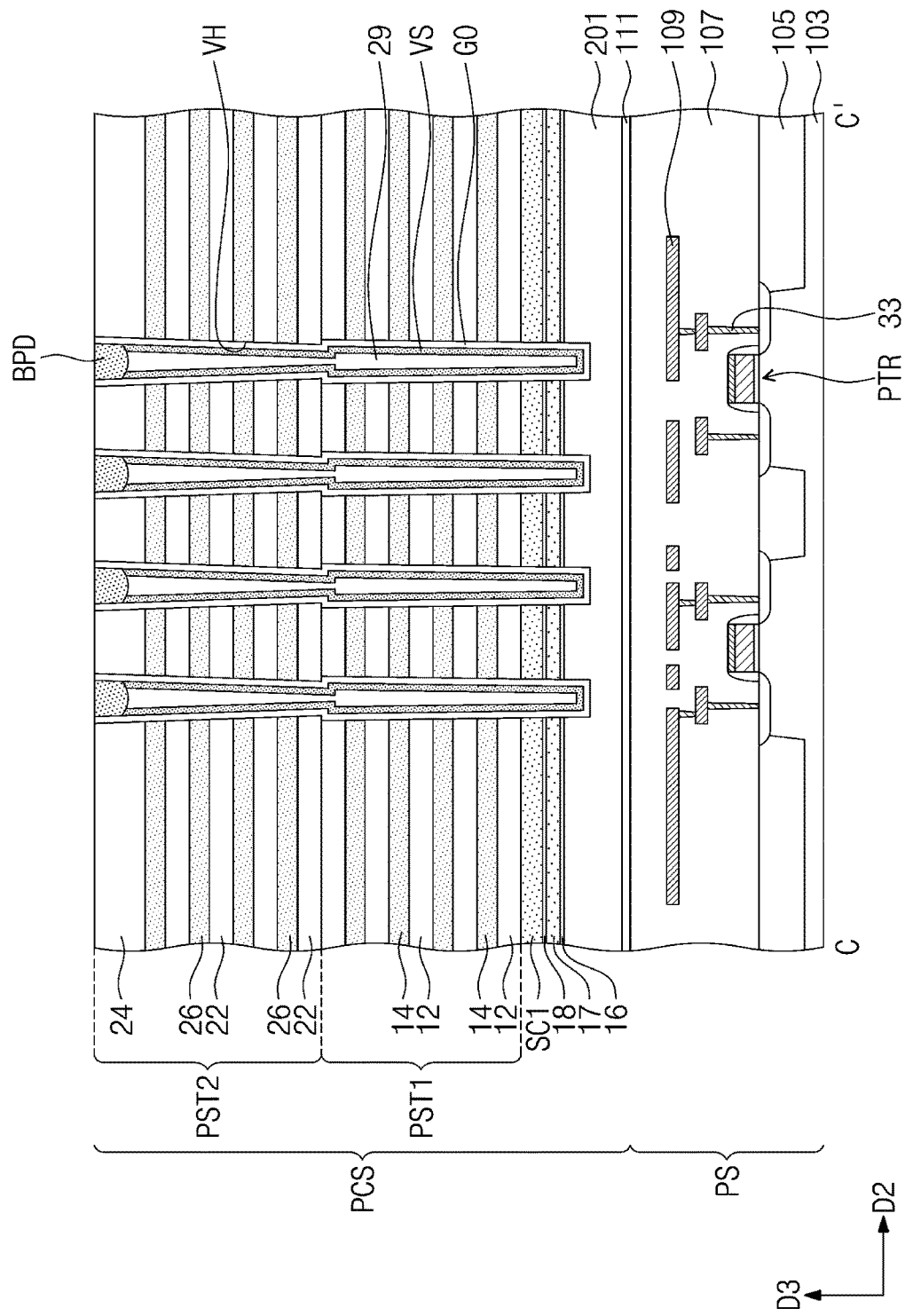

Referring to FIGS. 10A and 10B, the gate insulating layer GO may be formed in the vertical holes VH. The vertical semiconductor pattern VS may be formed on the gate insulating layer GO, and the insulating gapfill pattern 29 may be formed to fill remaining portions of the vertical holes VH. An upper portion of the vertical semiconductor pattern VS may be removed to form an empty region, and then, the bit line pad BPD may be formed by filling the empty region with a doped silicon layer. During the formation of the bit line pads BPD, the first mask pattern MK1 may be removed, and in this case, the upper sacrificial gapfill pattern UGP in the dummy vertical hole DVH may be exposed.

Figure 11A:
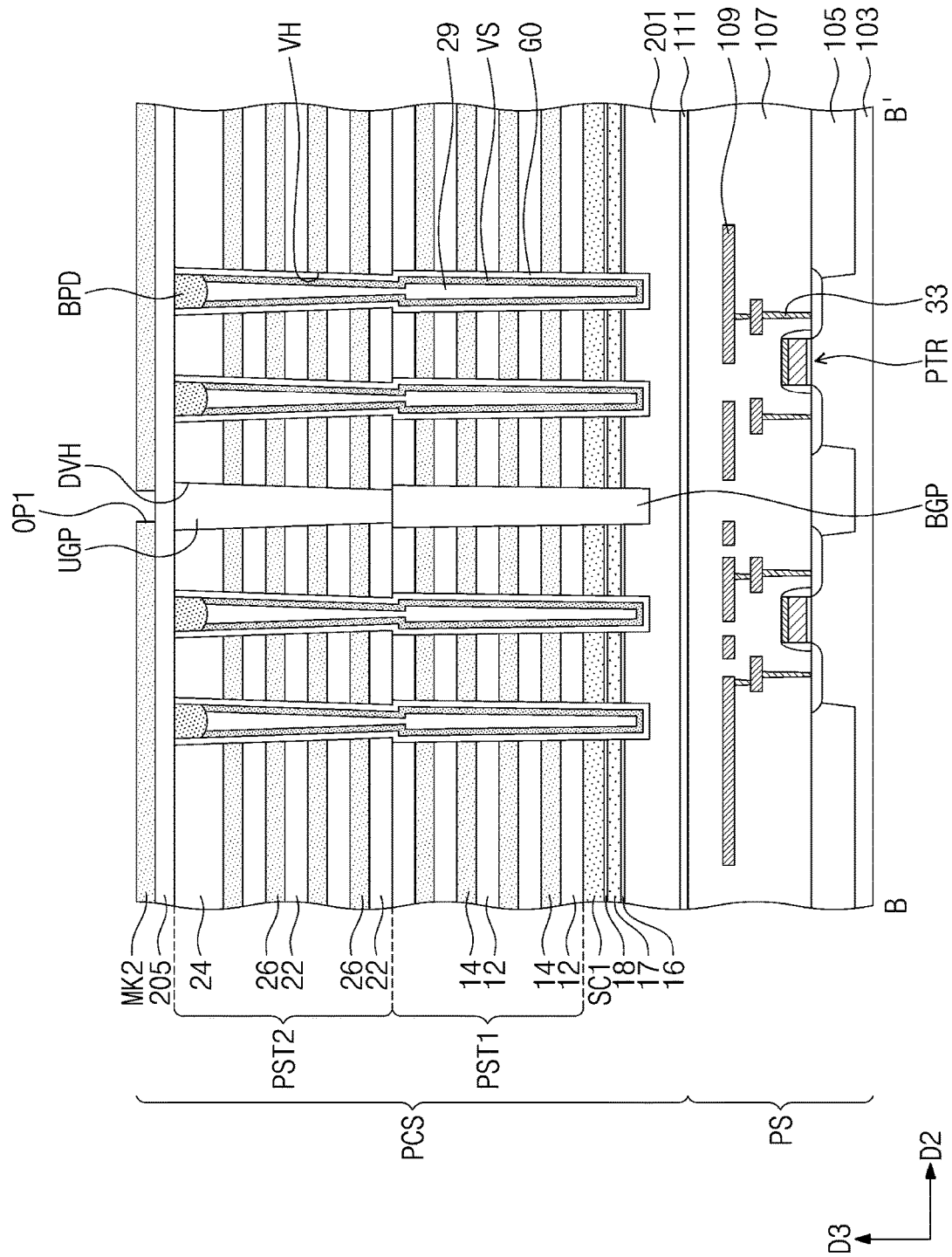
Figure 11B:
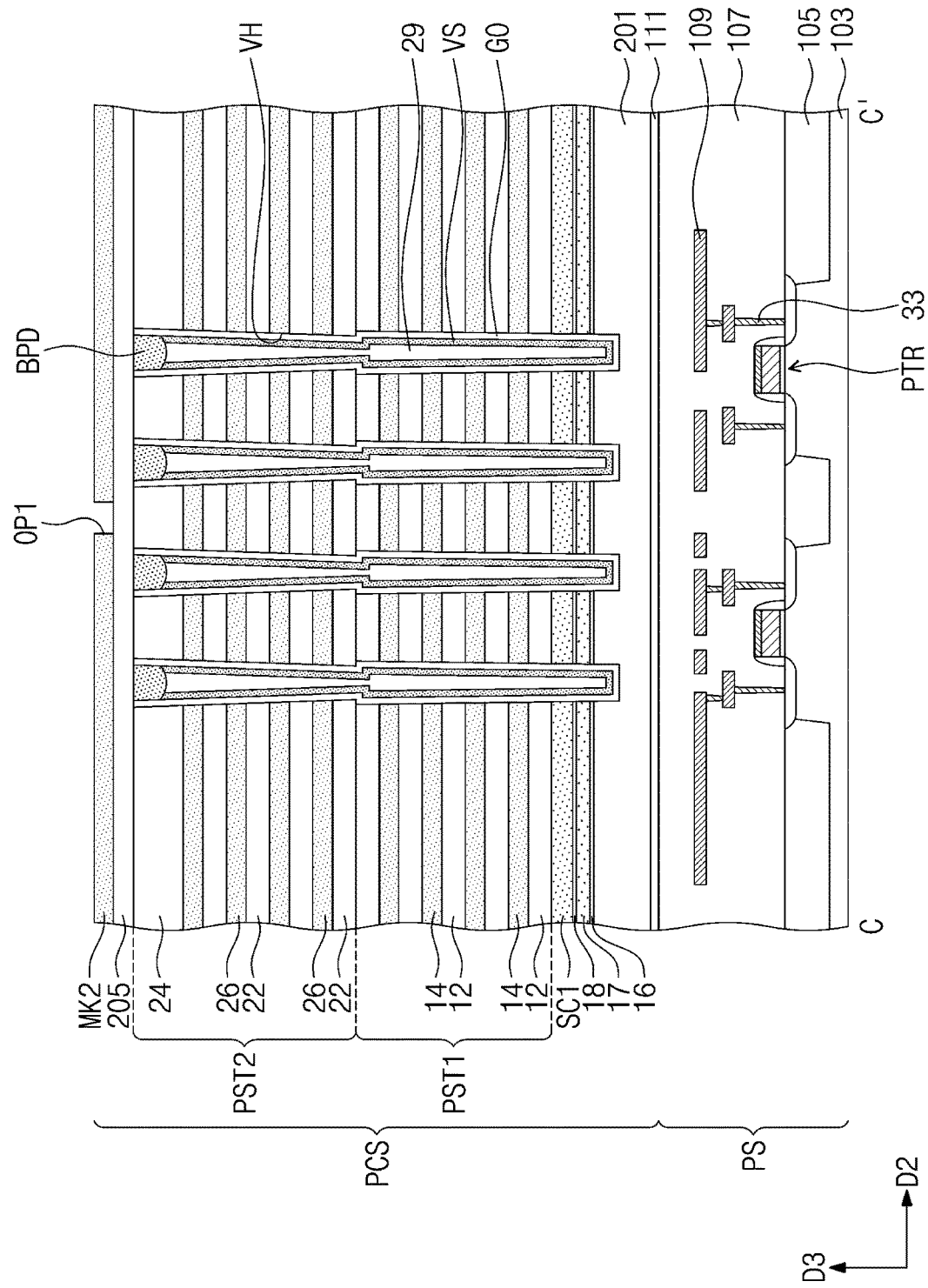

Referring to FIGS. 11A and 11B, the first upper interlayer insulating layer 205 may be stacked on the second preliminary stack structure PST2. A second mask pattern MK2 may be formed on the first upper interlayer insulating layer 205. The second mask pattern MK2 may include a first opening OP1 exposing the first upper interlayer insulating layer 205. The first opening OP1 may define a position of the source groove CG of FIG. 4A and may overlap the dummy vertical hole DVH.

Figure 12A:
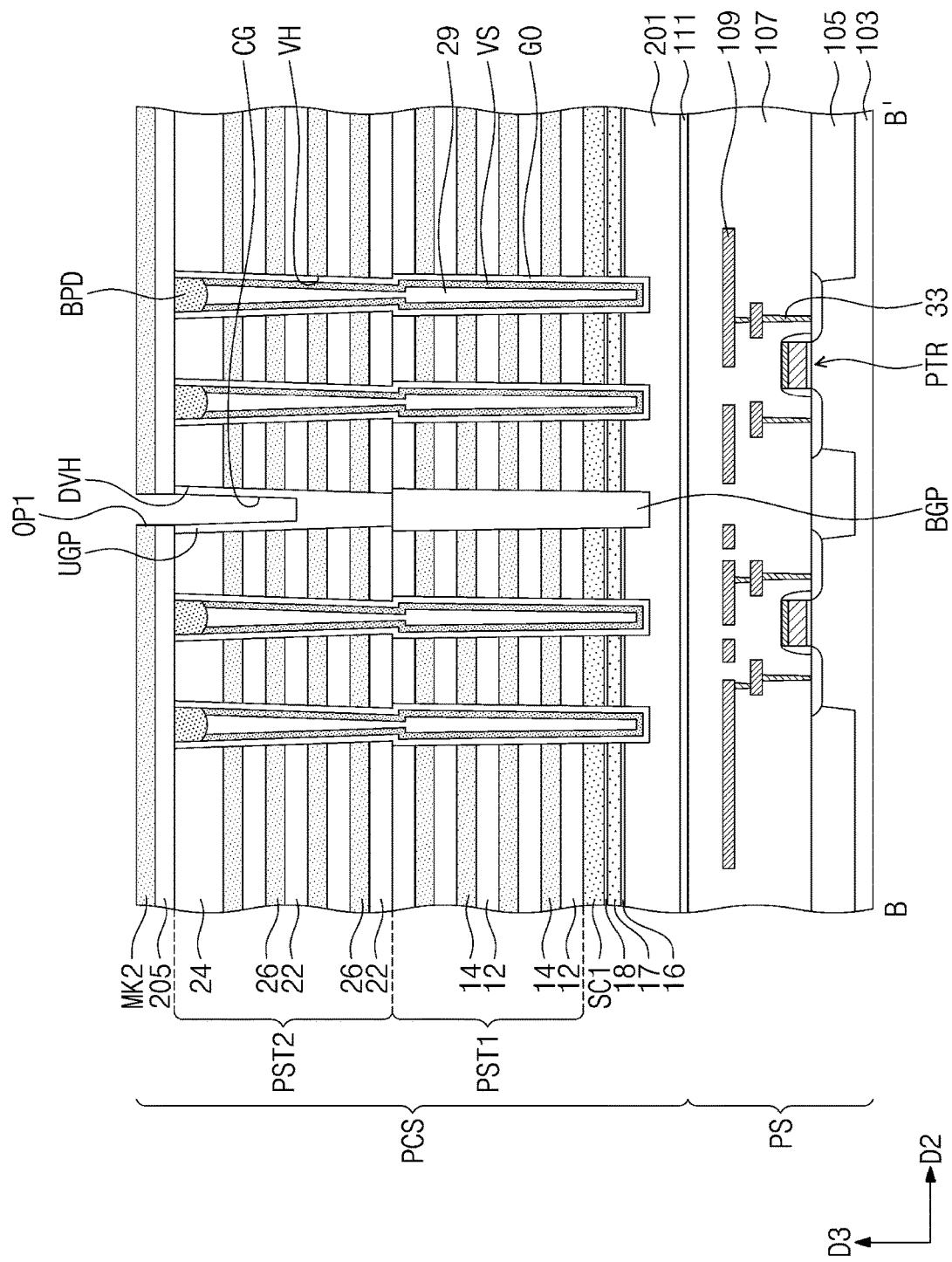
Figure 12B:
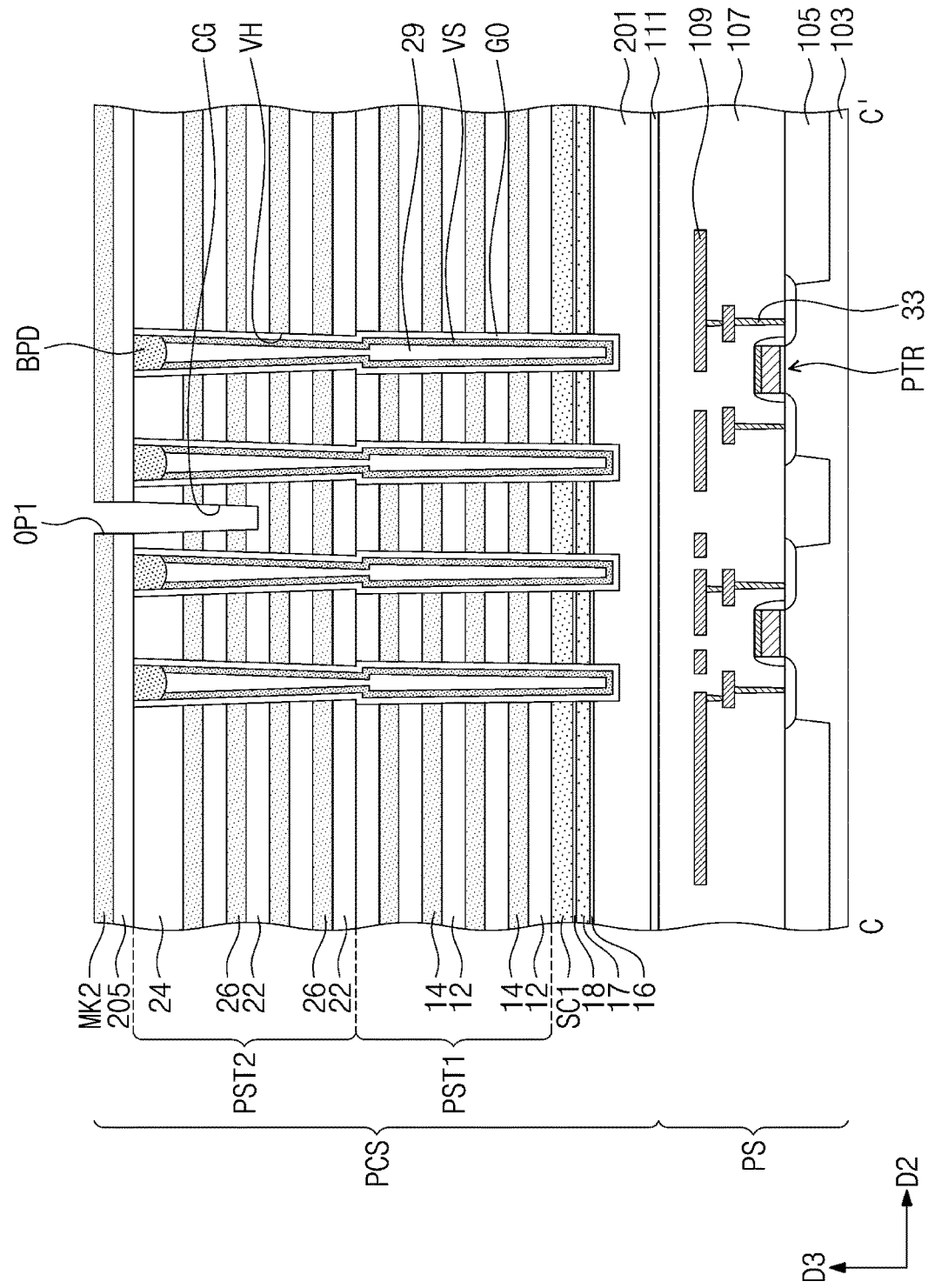

Referring to FIGS. 12A and 12B, the source groove CG may be formed by etching the first upper interlayer insulating layer 205, an upper portion of the upper sacrificial gapfill pattern UGP in the dummy vertical holes DVH, and the second inter-electrode insulating layers 22 and 24 and the third sacrificial layers 26 of the second preliminary stack structure PST2 using the second mask pattern MK2 as an etch mask.

Figure 13A:
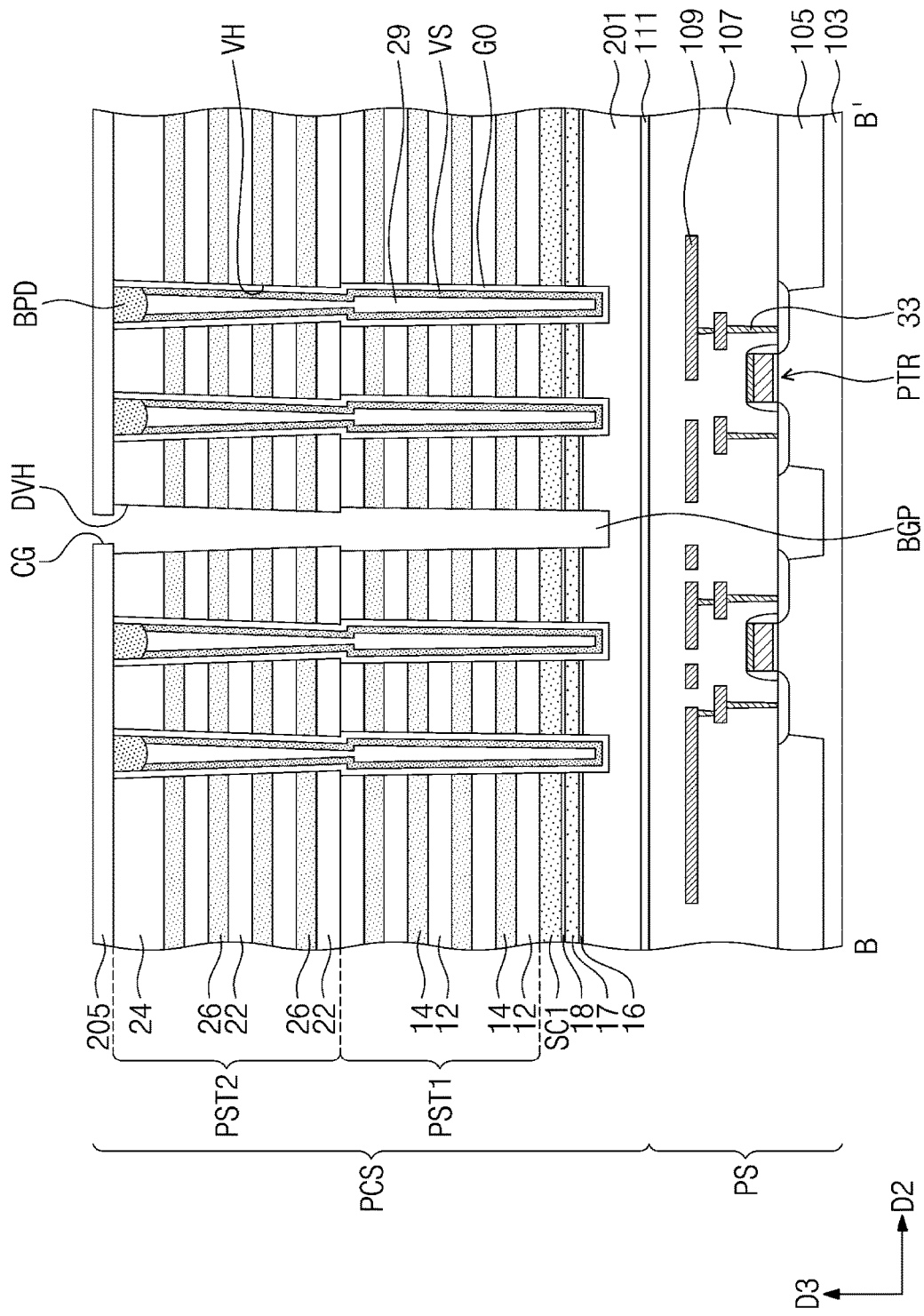
Figure 13B:
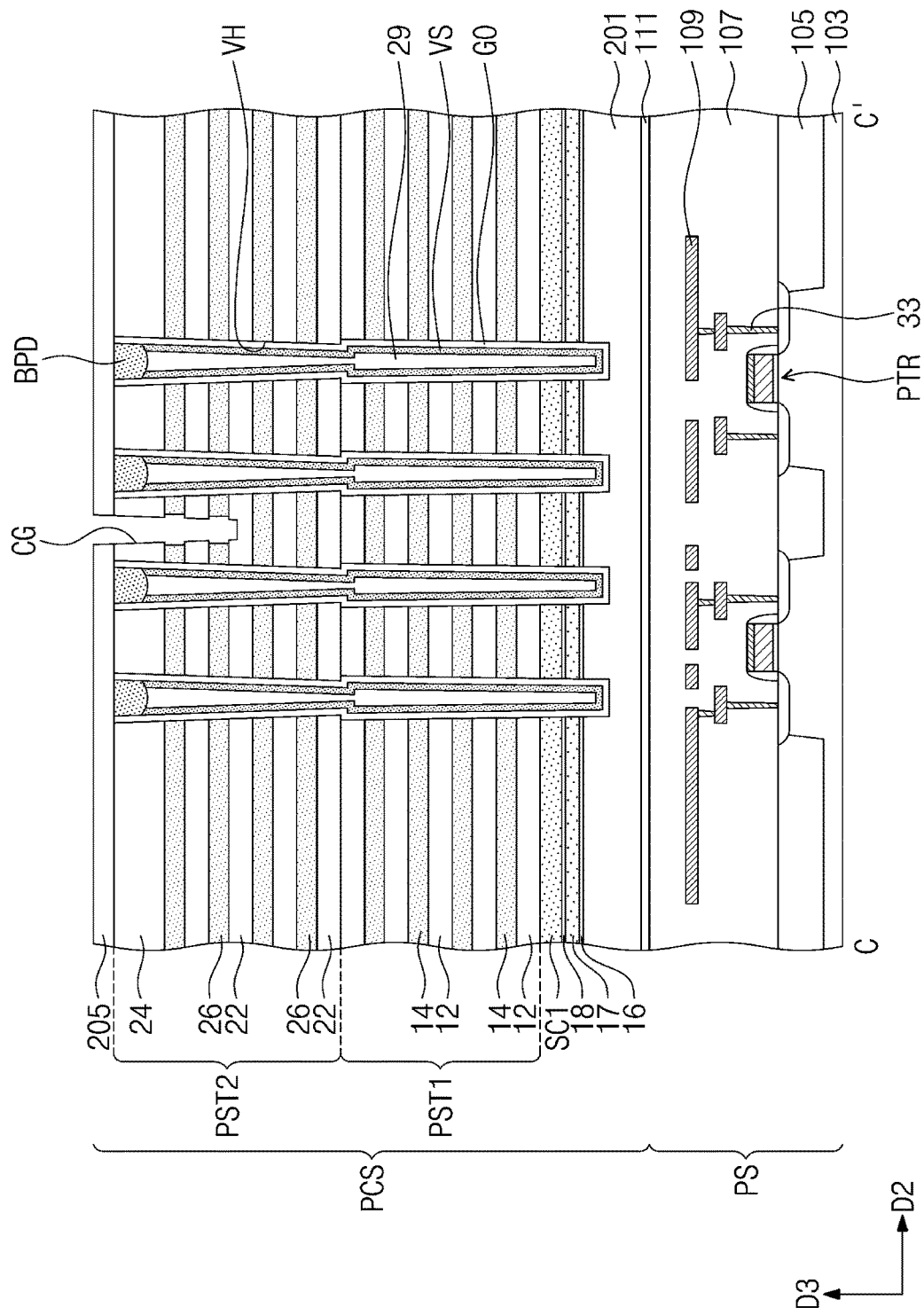

Referring to FIGS. 13A and 13B, the second mask pattern MK2 may be removed. Inner surfaces of the dummy vertical holes DVH may be exposed by removing both of the upper and bottom sacrificial gapfill patterns UGP and BGP from the dummy vertical holes DVH through the source groove CG. Here, as shown in the sectional view of FIG. 13B, the third sacrificial layers 26, which are exposed through the source groove CG, may be partially removed. Accordingly, an inner side surface of the source groove CG may be formed to have an uneven structure.

Figure 14A:
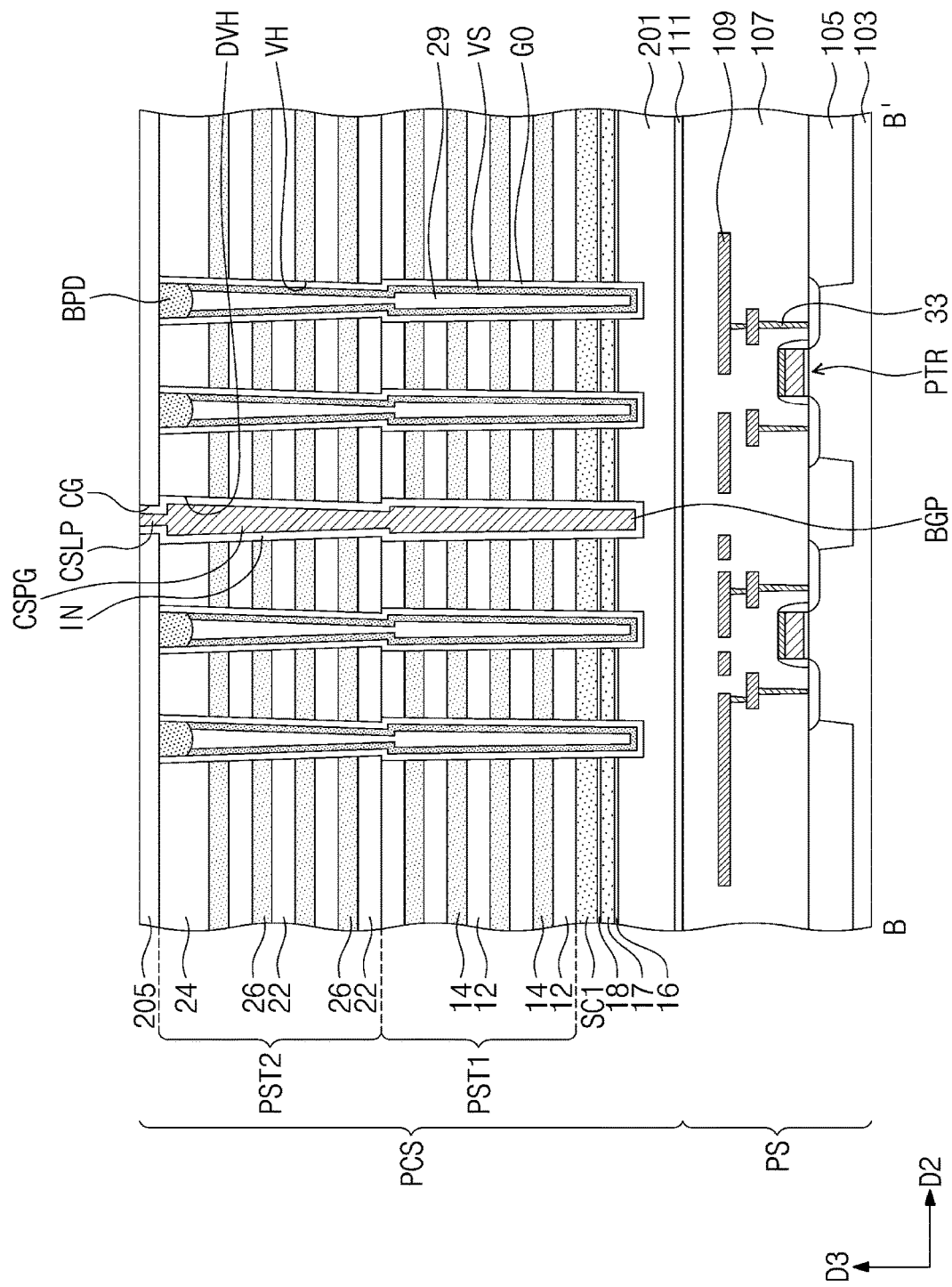
Figure 14B:
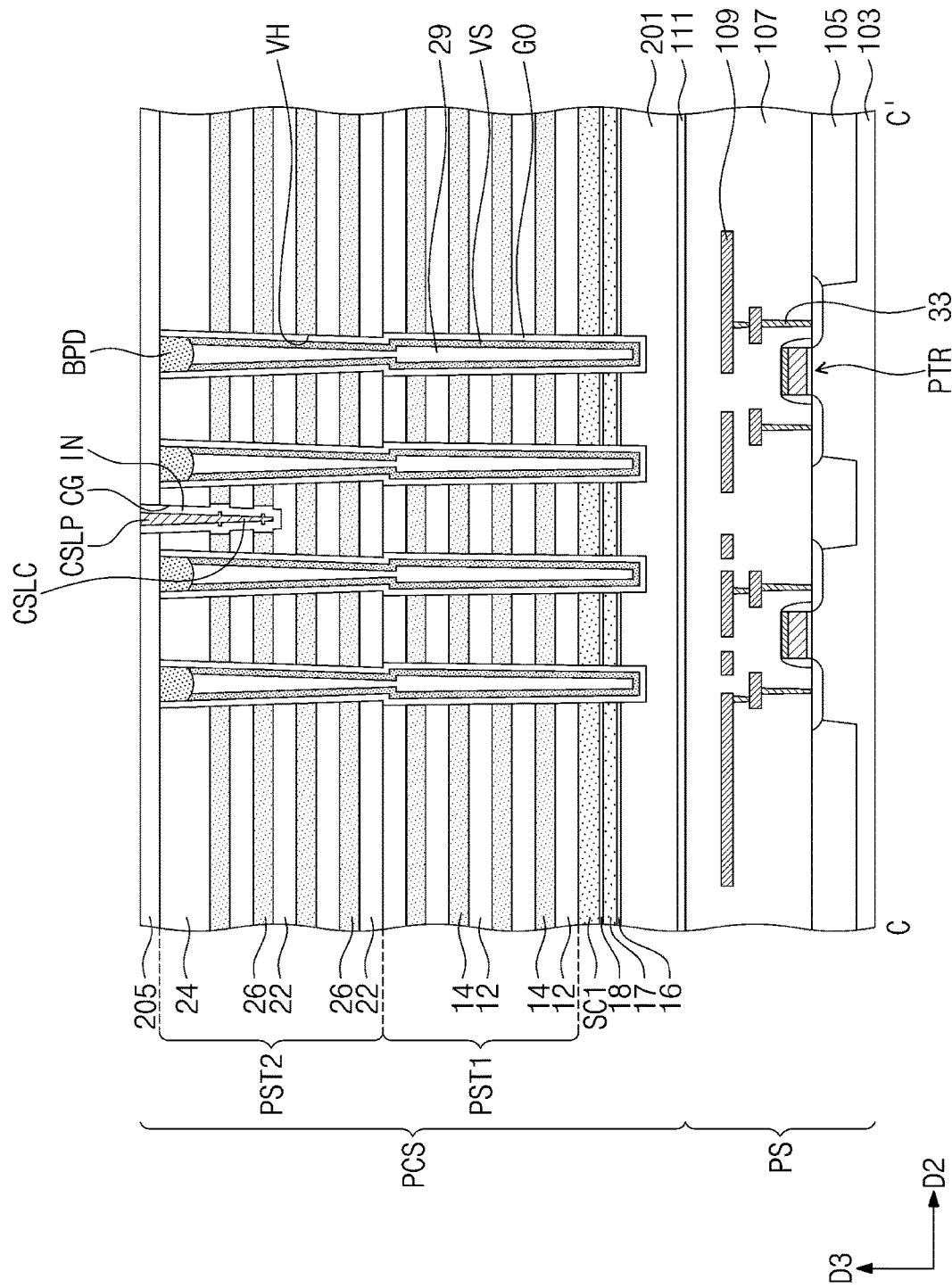

Referring to FIGS. 14A and 14B, the separation insulating layer IN may be formed in, and may conform to, the source groove CG and the dummy vertical holes DVH, a conductive layer may be formed to fill remaining portions of the source groove CG and the dummy vertical holes DVH, and then, an etch-back process or a CMP process may be performed on the conductive layer. Accordingly, the separation insulating layer IN, the conductive line portion CSLP, the conductive connecting portion CSLC, and the vertical conductive patterns CSPG may be formed in the dummy vertical holes DVH.

Figure 15A:
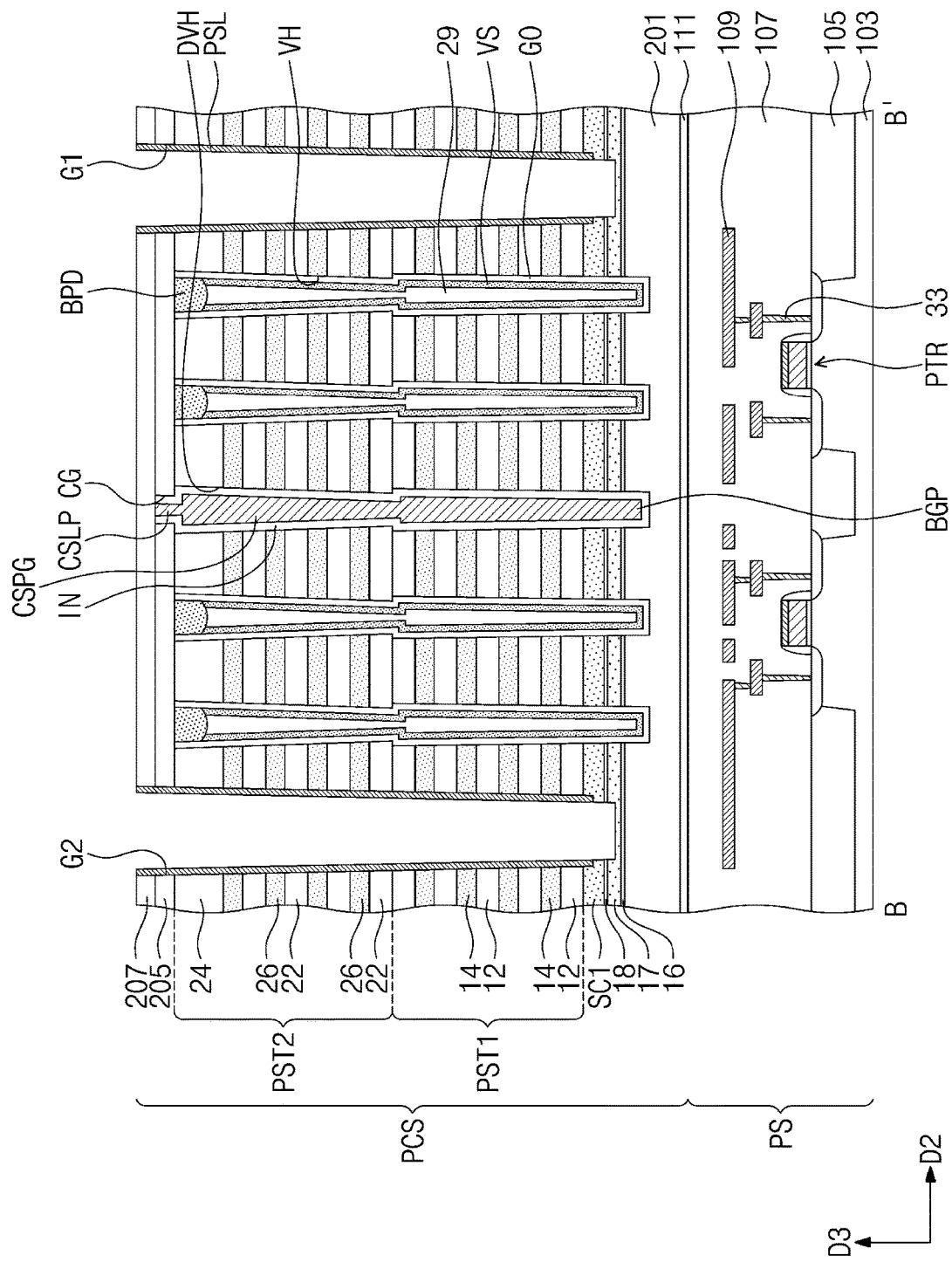
Figure 15B:
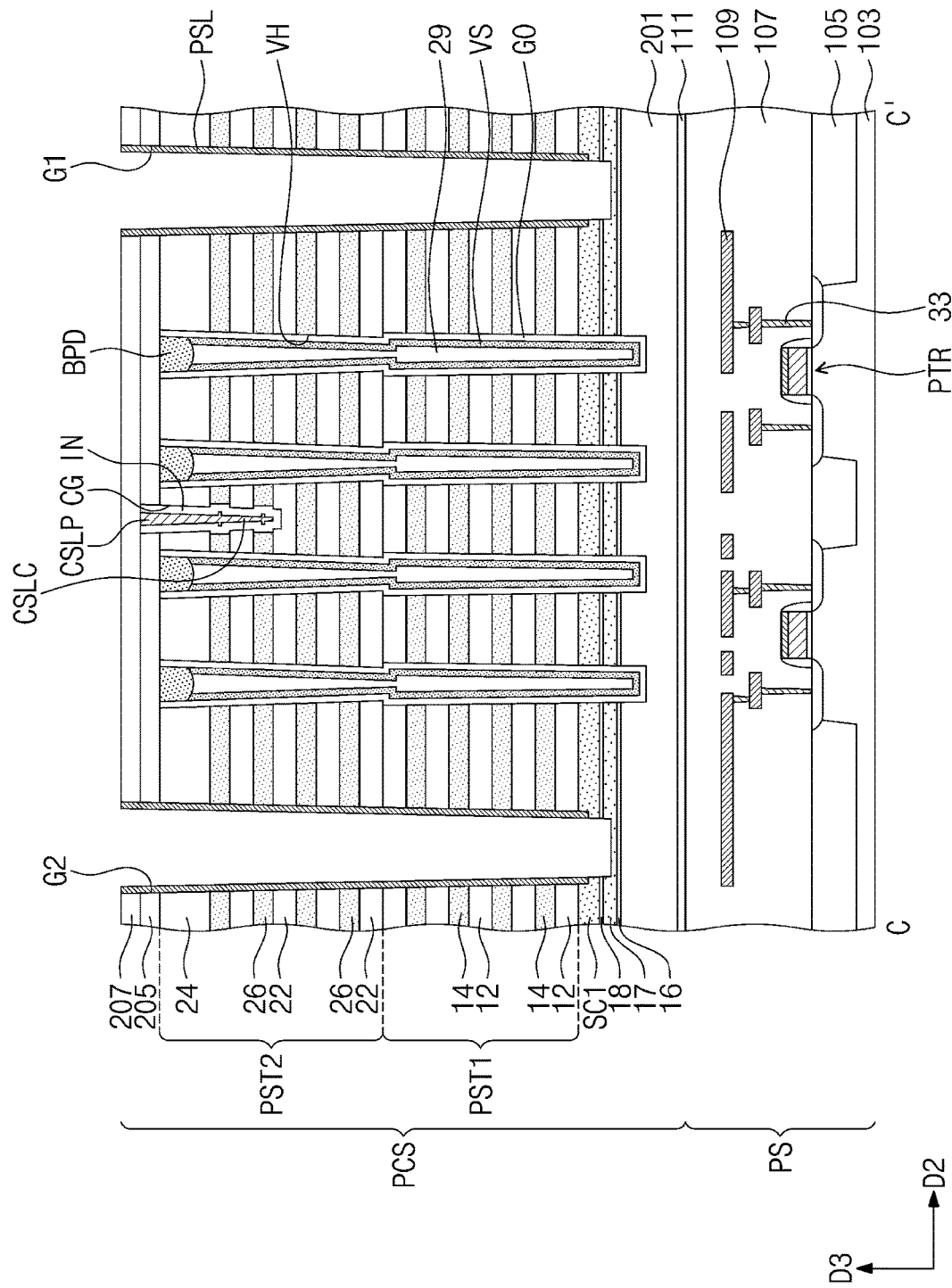

Referring to FIGS. 15A and 15B, the second upper interlayer insulating layer 207 may be formed on the first upper interlayer insulating layer 205. The second upper interlayer insulating layer 207, the first upper interlayer insulating layer 205, the second preliminary stack structure PST2, the first preliminary stack structure PST1, the first source pattern SC1 and the second buffer layer 18 may be sequentially etched to form first and second grooves G1 and G2 exposing the first sacrificial layer 17. Protection spacers PSL may be formed on inner side surfaces of the first and second grooves G1 and G2. The protection spacer PSL may at least partially cover side surfaces of the first and second preliminary stack structures PST1 and PST2.

Figure 16A:
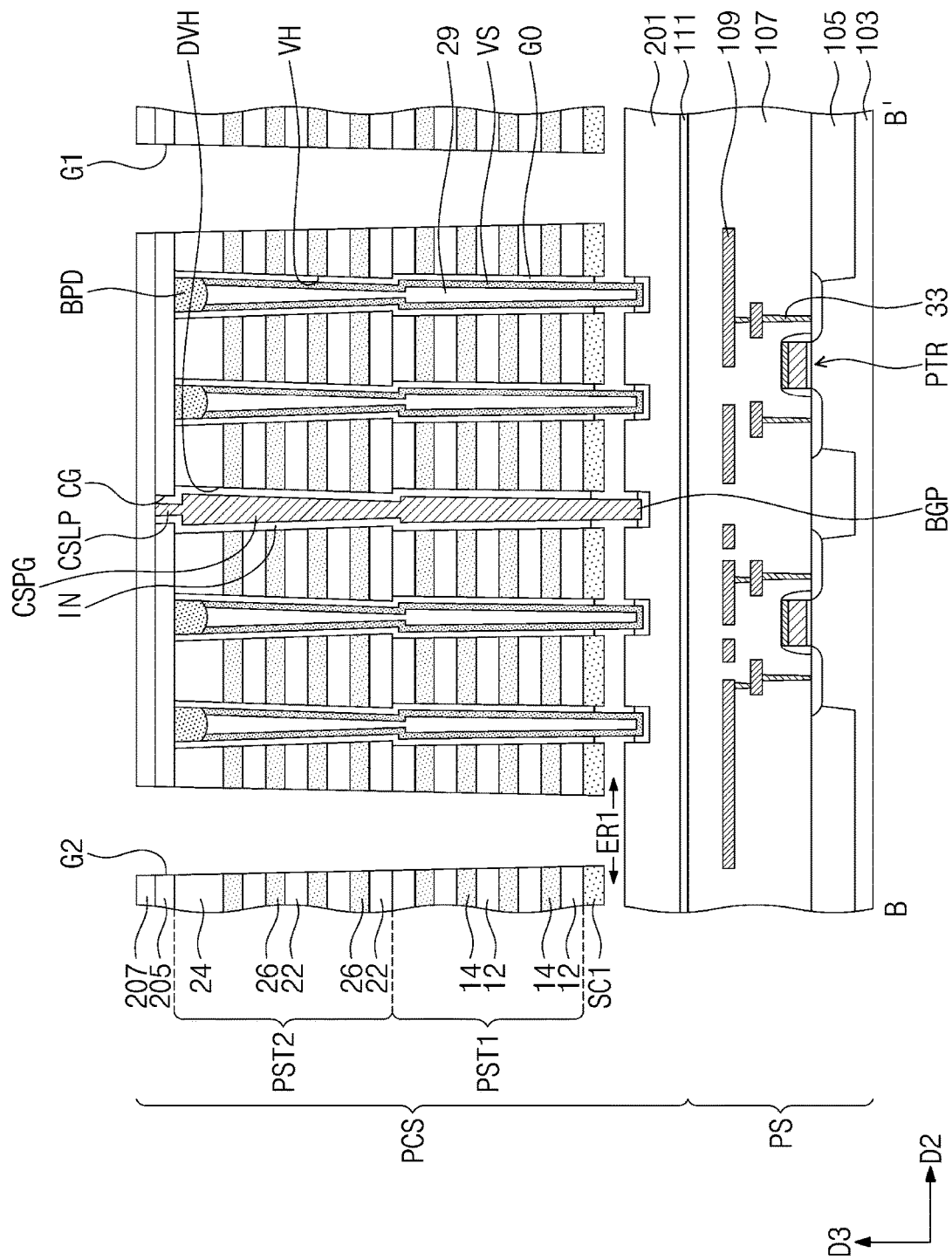
Figure 16B:
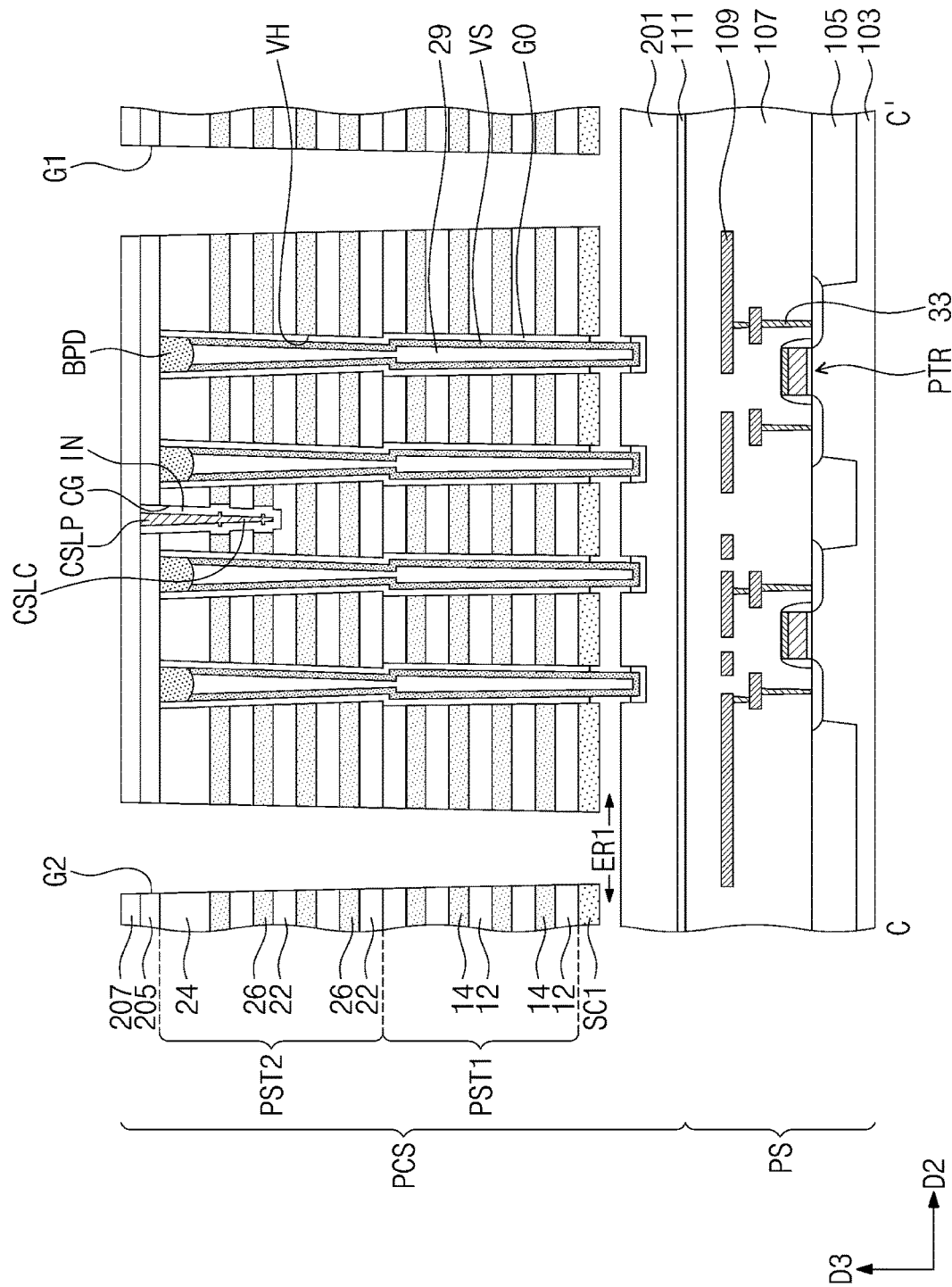

Referring to FIGS. 16A and 16B, a first empty space ER1 may be formed by removing the second buffer layer 18, the first sacrificial layer 17, and the first buffer layer 16 through the first and second grooves G1 and G2. The protection spacer PSL may protect the first and second inter-electrode insulating layers 12, 22, and 24 and the second and third sacrificial layers 14 and 26 and may prevent them from being removed when the second buffer layer 18, the first sacrificial layer 17, and the first buffer layer 16 are removed. When the first empty space ER1 is formed, a portion of the gate insulating layer GO may be removed, and thus, a side surface of the vertical semiconductor pattern VS may be exposed to the first empty space ER1. Similarly, a portion of the separation insulating layer IN may be removed, and thus, a side surface of the vertical conductive pattern CSPG may be exposed to the first empty space ER1. Since a structure and a material of the gate insulating layer GO are different from those of the separation insulating layer IN, an etch rate of the gate insulating layer GO may be different from an etch rate of the separation insulating layer IN. Accordingly, there may be a difference between levels LV1 to LV4, as shown in FIG. 6A. When the first empty space ER1 is formed, the vertical semiconductor pattern VS, the vertical conductive pattern CSPG, and the edge dummy vertical pattern EDVS of FIG. 3 may support a preliminary cell array structure PCS and may be used to prevent the preliminary cell array structure PCS from collapsing.

Figure 17A:
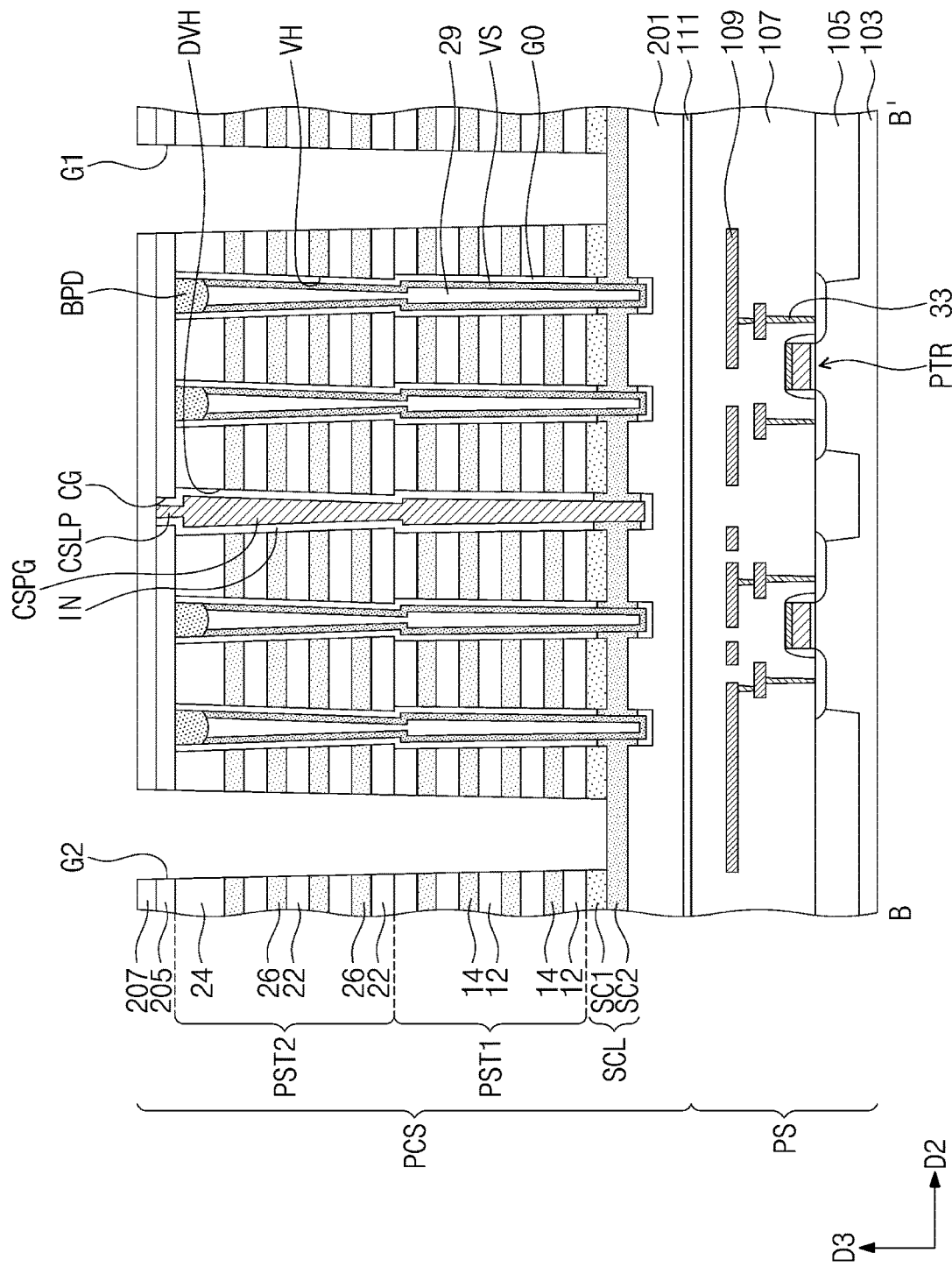
Figure 17B:
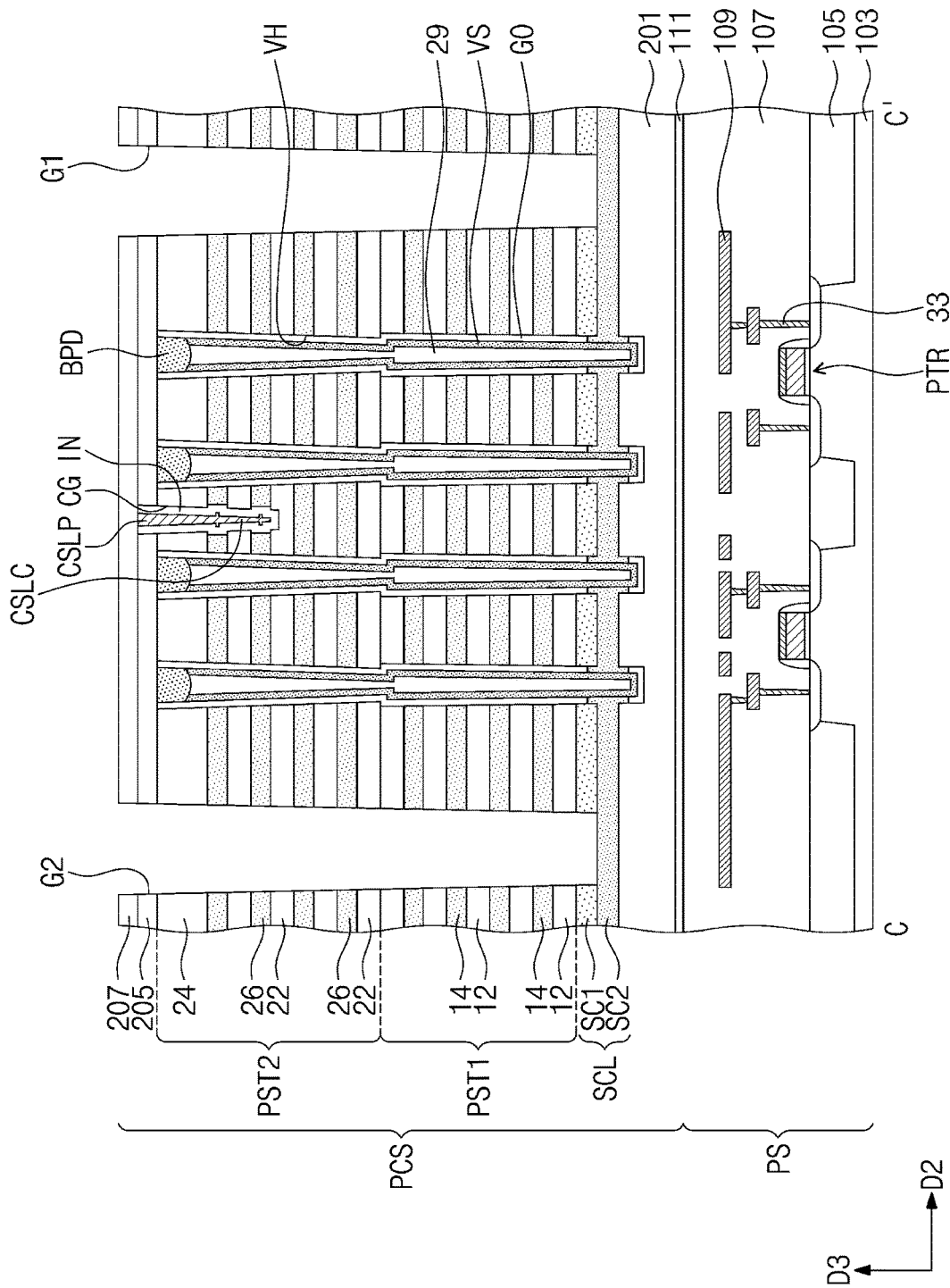

Referring to FIGS. 17A and 17B, a second source layer may be formed to at least partially fill the first empty space ER1 through the first and second grooves G1 and G2, and then, an anisotropic etching process may be performed to remove the second source layer from the first and second grooves G1 and G2 and to leave a portion of the second source layer, which is used as the second source pattern SC2, in the first empty space ER1. Accordingly, the first and second source patterns SC1 and SC2 may constitute the source structure SCL. Here, the protection spacer PSL may be removed.

Figure 18A:
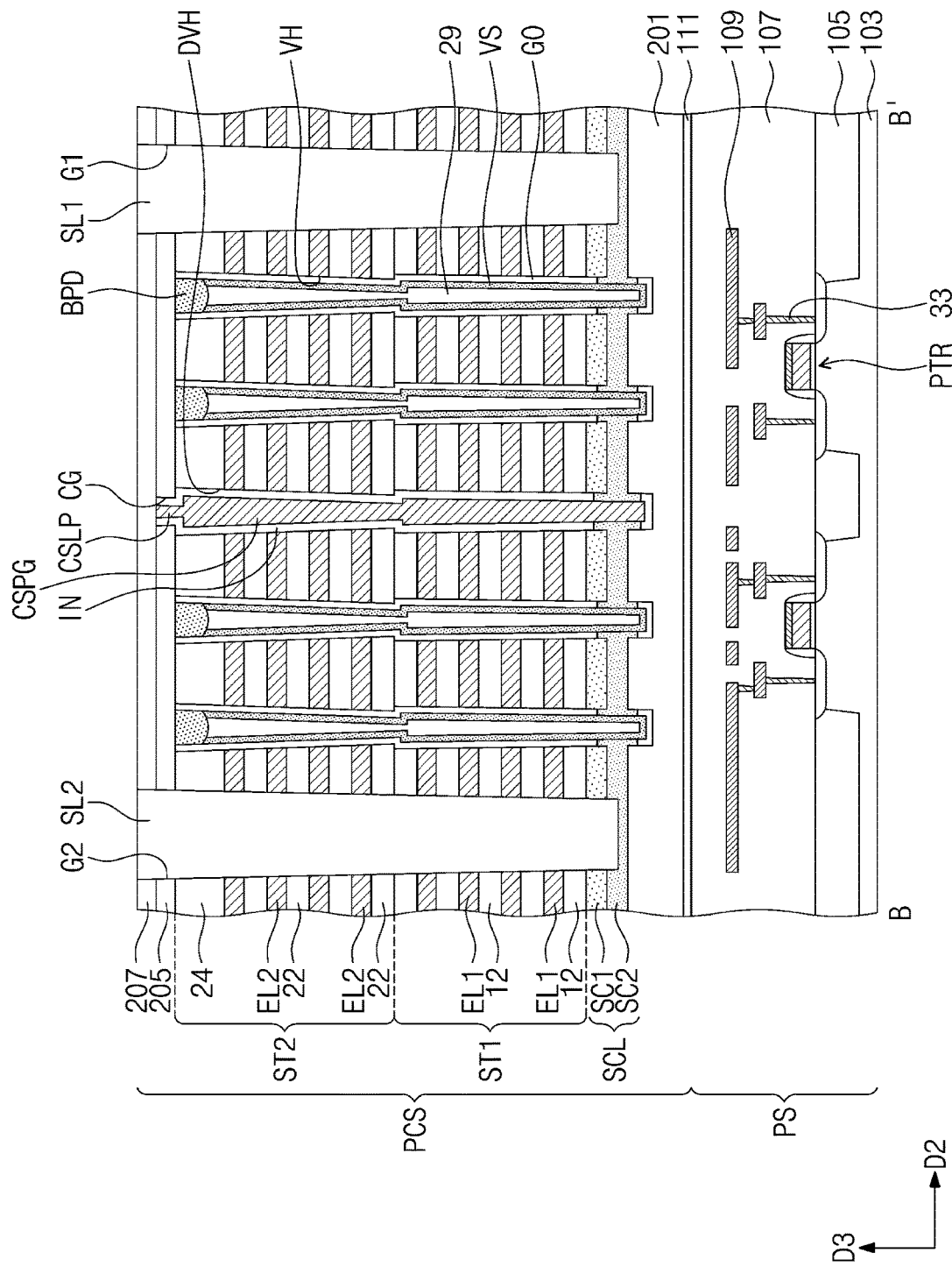
Figure 18B:
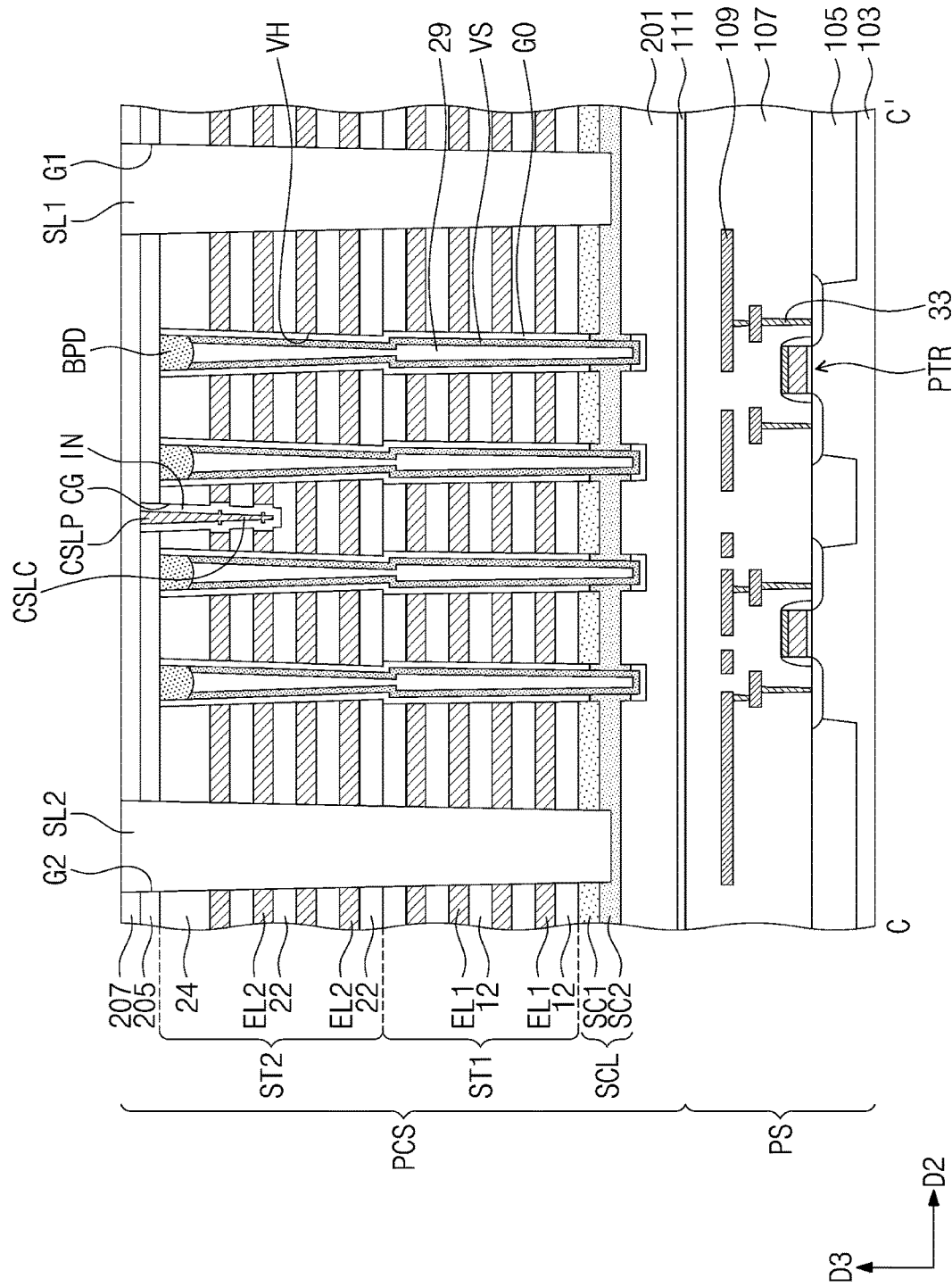

Referring to FIGS. 18A and 18B, second empty spaces may be formed between the inter-electrode insulating layers 12, 22, and 24 by removing the second sacrificial layers 14 and the third sacrificial layers 26 through the first and second grooves G1 and G2. A first conductive layer may be formed to at least partially fill the second empty spaces through the first and second grooves G1 and G2. Then, an anisotropic etching process may be performed to remove the first conductive layer from the first and second grooves G1 and G2 and to form the electrode layers EL1 and EL2 in the second empty spaces. Accordingly, the first and second sub-stack structures ST1 and ST2 may be formed. The high-k dielectric layer HL of FIG. 6A may be formed before the formation of the first conductive layer. Next, an insulating layer may be formed and may be anisotropically etched to form the first and second separation insulating lines SL1 and SL2 filling the first and second grooves G1 and G2. A subsequent process may be performed (e.g., in a typical manner) to fabricate the three-dimensional semiconductor memory device described with reference to FIGS. 2 to 6C.

Figure 19:
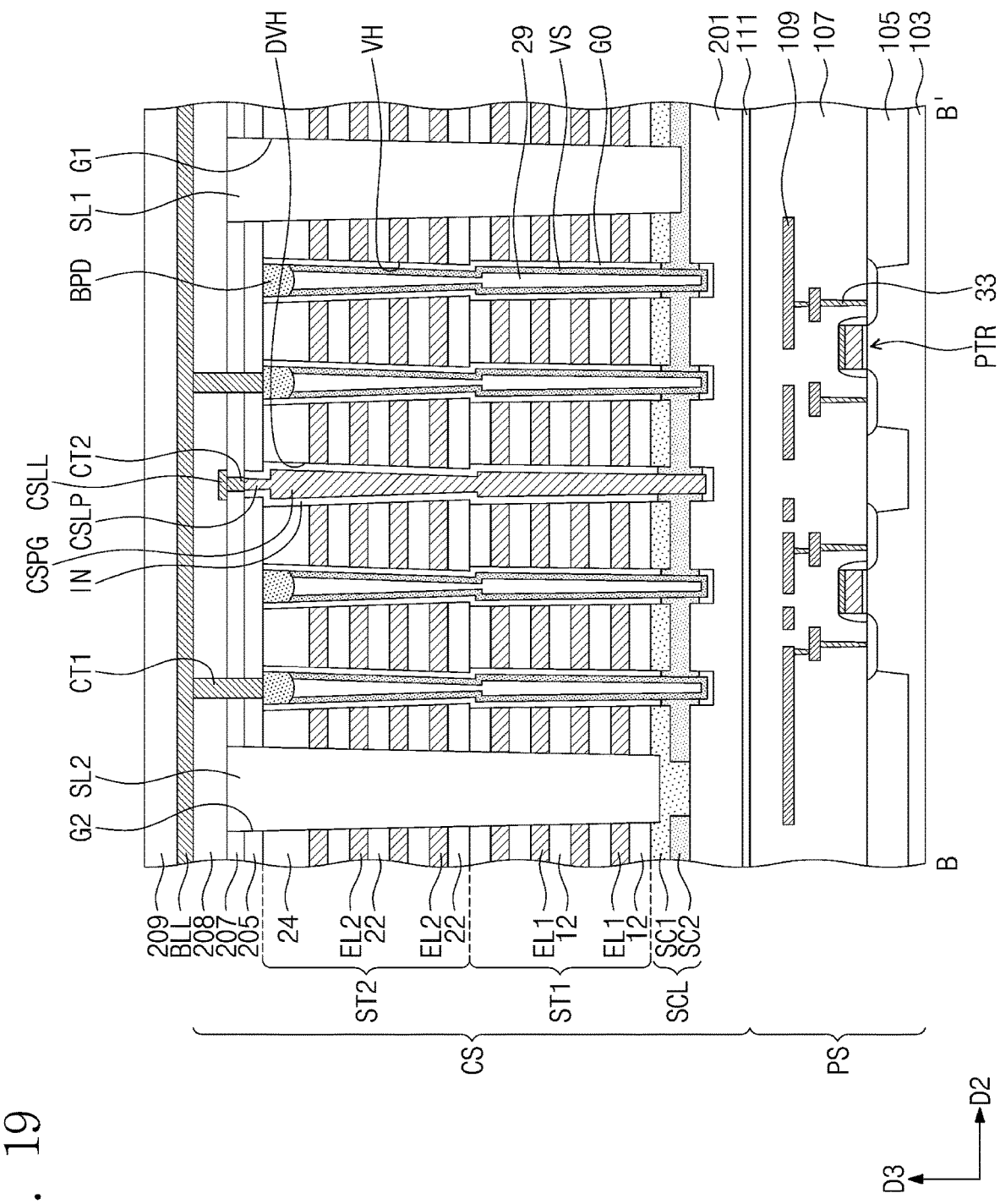
FIG. 19 is a sectional view taken along the line B-B' of FIG. 4A or 4B.

FIG. 19 is a sectional view taken along the line B-B' of FIG. 4A or 4B.

Referring to FIG. 19, the first and second separation insulating lines SL1 and SL2 may have bottom surfaces that are located at different heights. For example, the bottom surface of the second separation insulating line SL2 may be higher than the bottom surface of the first separation insulating line SL1 (i.e., further away from a top surface of a reference plane, such as substrate 201). The bottom surface of the second separation insulating line SL2 may be in contact with the first source pattern SC1 and may be spaced apart from the second source pattern SC2. The bottom surface of the first separation insulating line SL1 may be in contact with the second source pattern SC2. A portion of the first source pattern SC1 below the second separation insulating line SL2 may extend into the second source pattern SC2 and may be in contact with the second substrate 201. Except for these differences, the three-dimensional semiconductor memory device according to the present embodiment may be configured to have the same or similar features as those in the previous embodiments.

Figure 20:
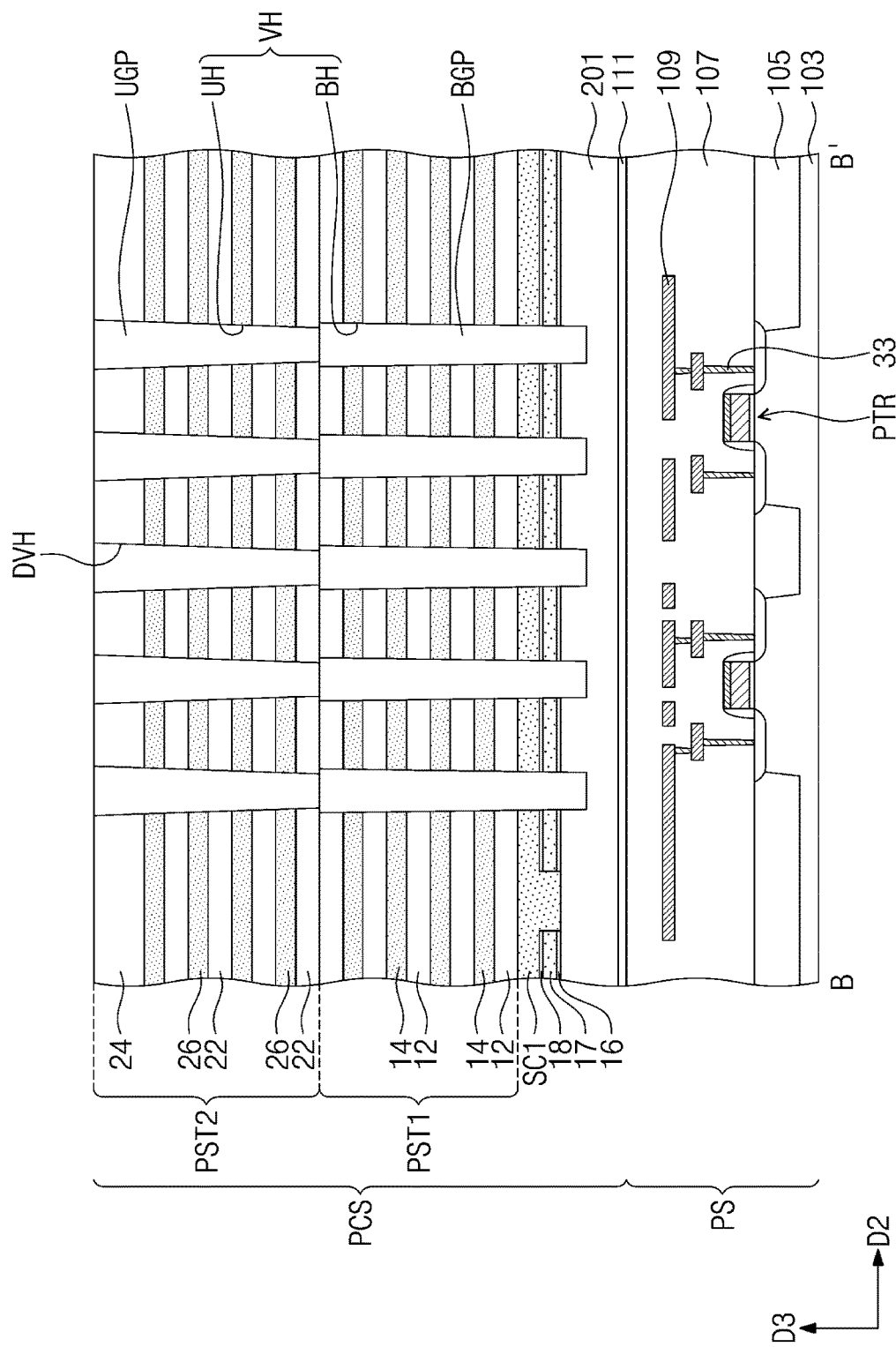
FIG. 20 is a sectional view illustrating a process of fabricating the three-dimensional semiconductor memory device of FIG. 19.

FIG. 20 is a sectional view illustrating a process of fabricating the three-dimensional semiconductor memory device of FIG. 19.

Referring to FIG. 20, in the step of FIG. 8A, a portion of the first source pattern SC1 may be formed to extend into the second buffer layer 18, the first sacrificial layer 17, and the first buffer layer 16 and to be in contact with a top surface of the second substrate 201. Then, a subsequent process may be performed. In such a case, a depth of the second groove G2 in the step of FIG. 15A may be formed to be smaller than that of the first groove G1. When the second buffer layer 18, the first sacrificial layer 17, and the first buffer layer 16 are removed to form the first empty space ER1 in the step of FIG. 16A, a portion of the first source pattern SC1 may support the preliminary cell array structure PCS and may prevent the preliminary cell array structure PCS from collapsing. Except for the afore-described differences, the fabrication method may be substantially the same as or similar to that in the previous embodiments.

Figure 21A:
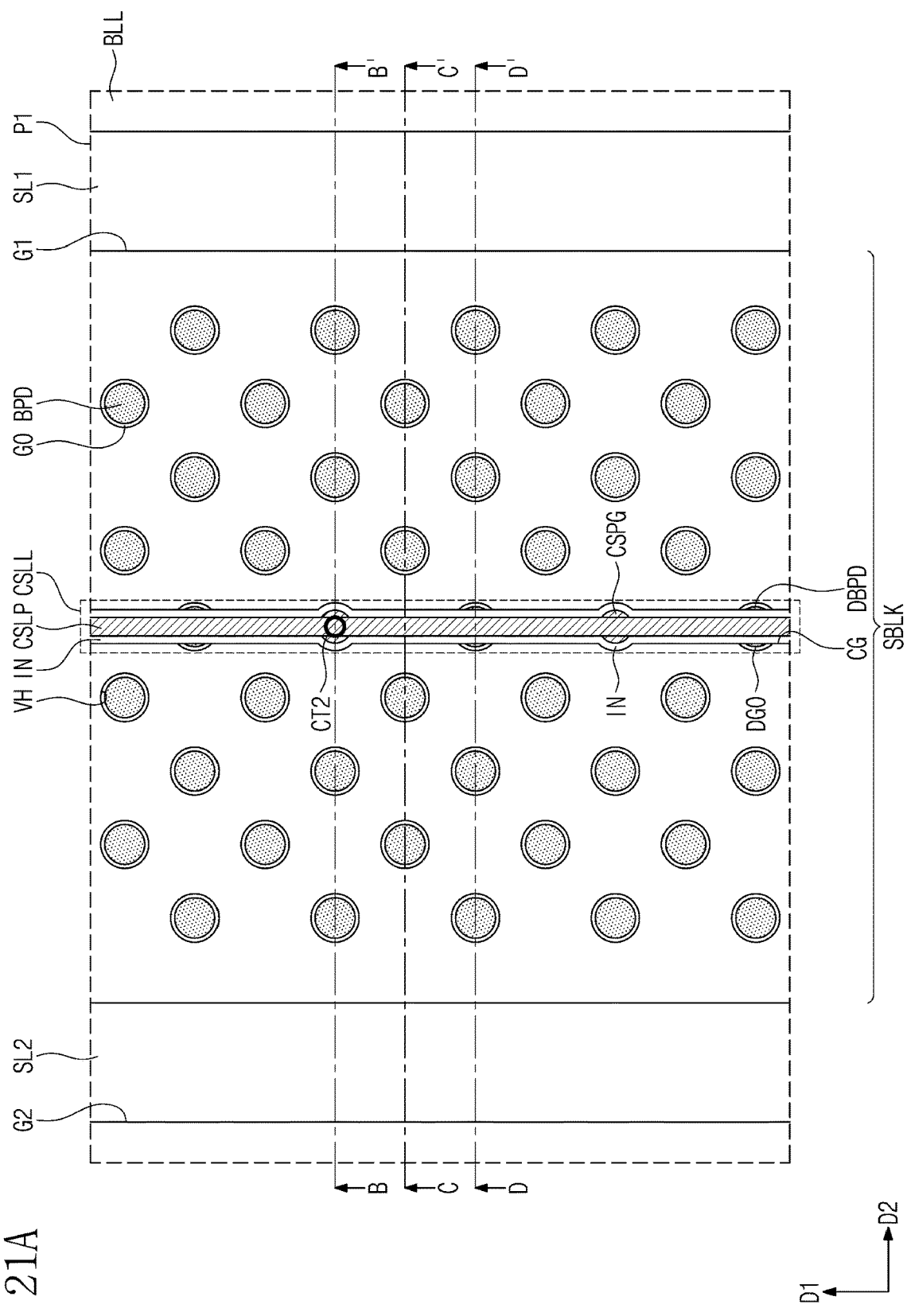
FIGS. 21A and 21B are plan views illustrating a three-dimensional semiconductor memory device according to an embodiment of the present disclosure.
Figure 21B:
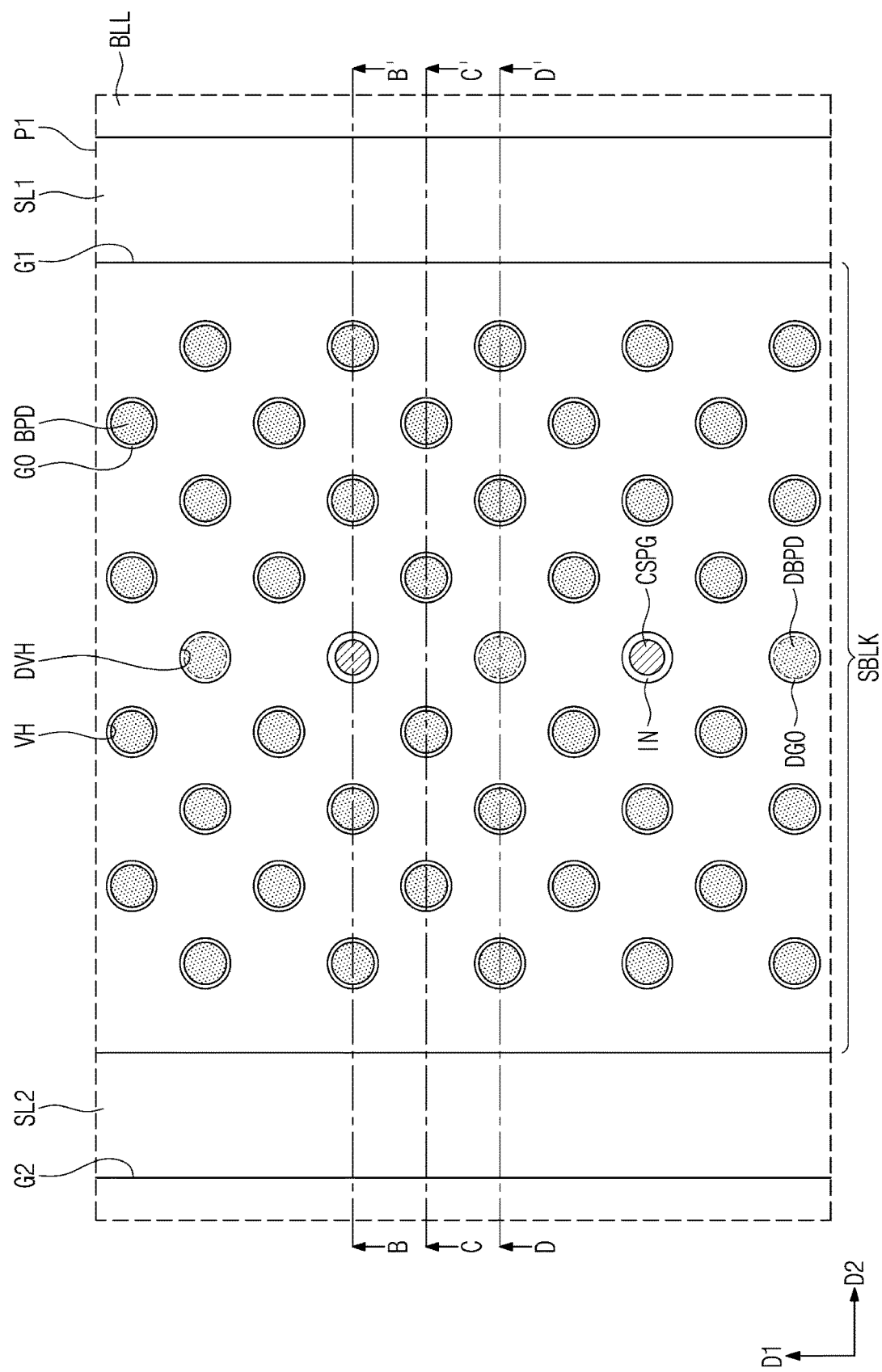
Figure 22:
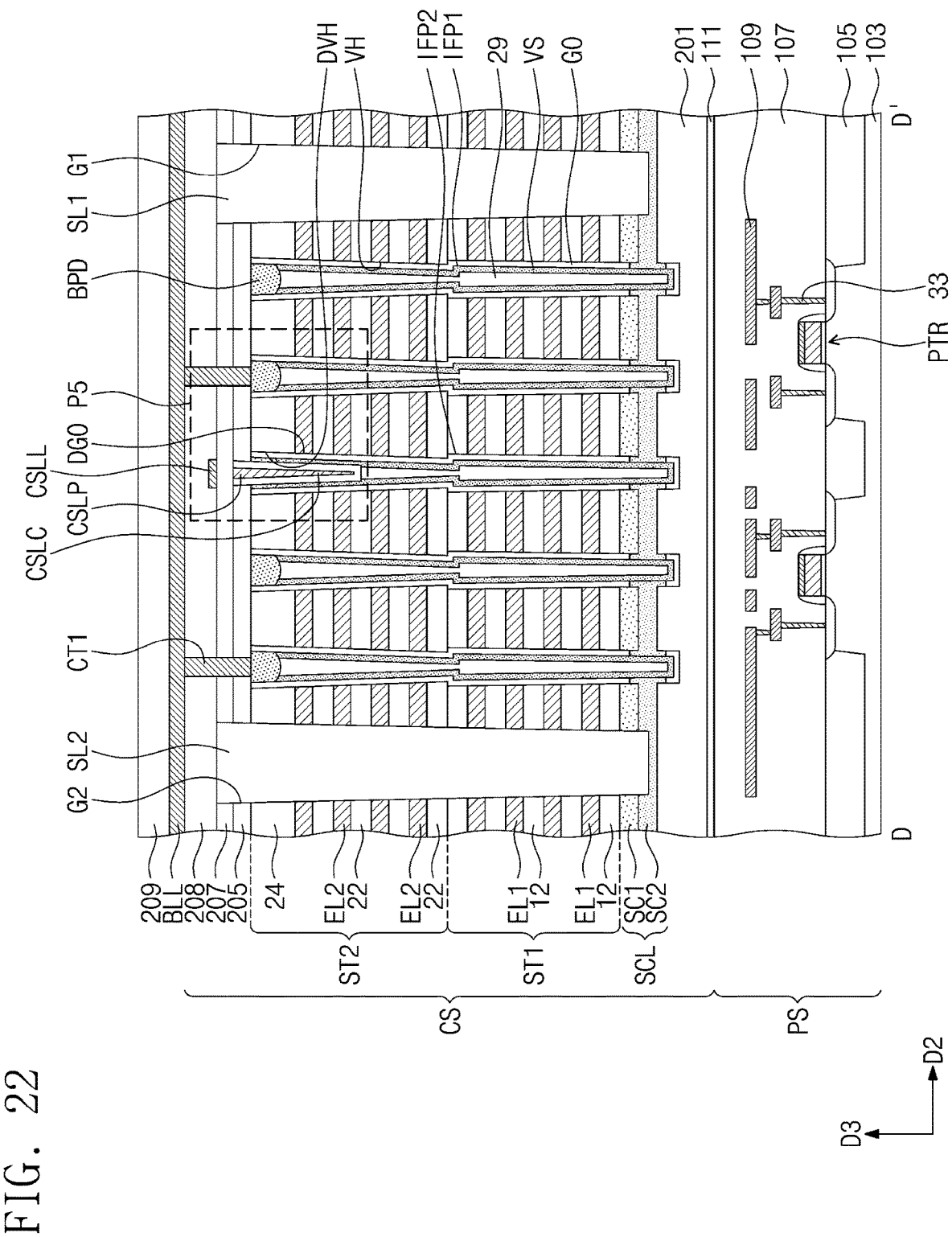
FIG. 22 is a sectional view taken along a line D-D' of FIG. 21A or 21B.
Figure 23:
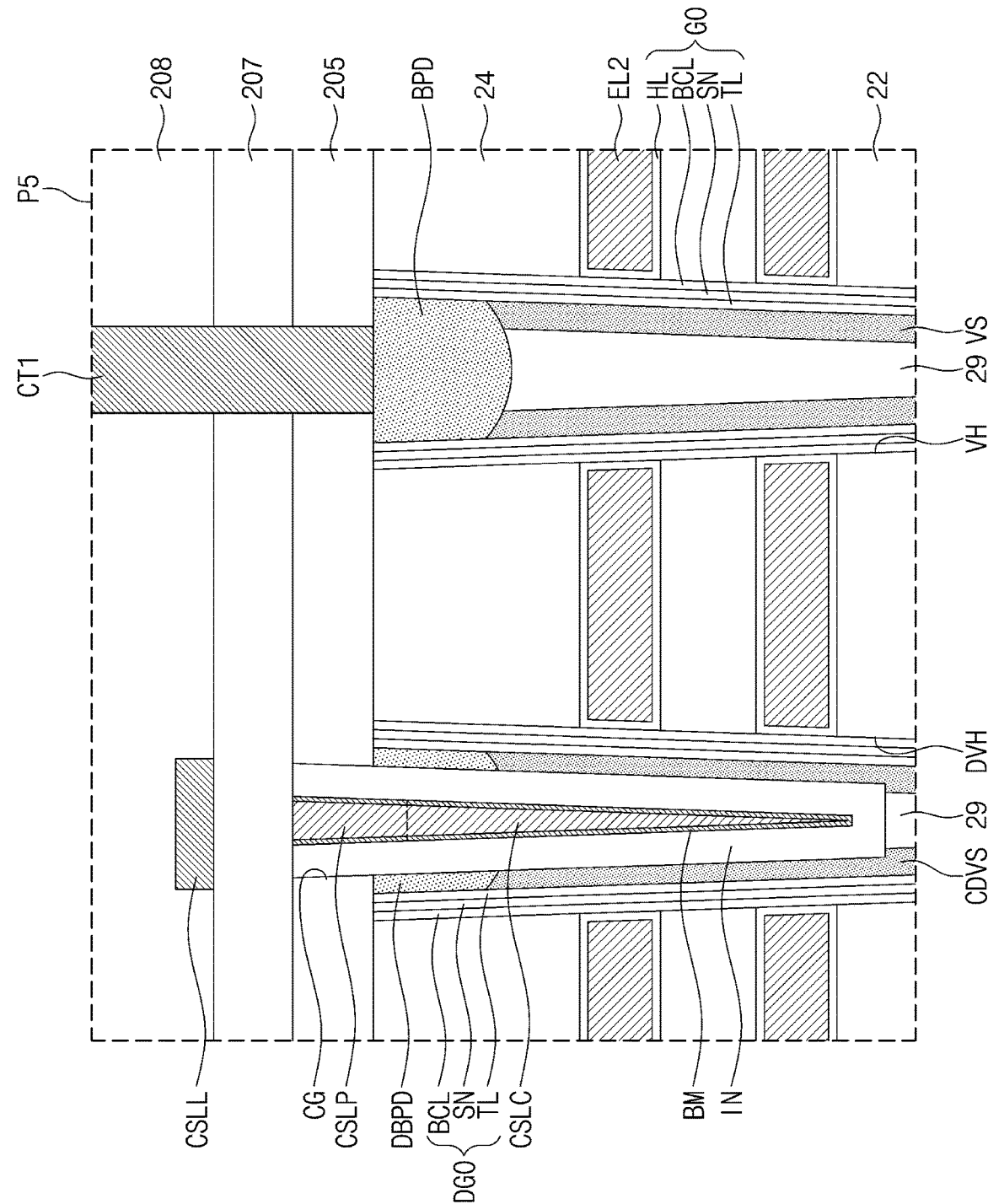
FIG. 23 is an enlarged sectional view of a portion 'P5' of FIG. 22.

FIGS. 21A and 21B are plan views illustrating a three-dimensional semiconductor memory device according to an embodiment of the present disclosure. FIG. 22 is a sectional view taken along a line D-D' of FIG. 21A or 21B. FIG. 23 is an enlarged sectional view of a portion 'P5' of FIG. 22. A section taken along a line B-B' of FIG. 21A or 21B may be the same as that of FIG. 5A. A section taken along a line C-C' of FIG. 21A or 21B may be the same as that of FIG. 5B. The same or similar reference numbers may be used to refer to structures that are the same or similar as discussed in previous Figures.

Referring to FIGS. 21A, 21B, 22, and 23, in each sub-block SBLK, one or more center dummy vertical semiconductor patterns CDVS may be between the vertical conductive patterns CSPG, which are adjacent to each other in the first direction D1. The center dummy vertical semiconductor patterns CDVS may be in the dummy vertical holes DVH. The center dummy vertical semiconductor patterns CDVS may be formed to have a hollow shell or cup shape, like the vertical semiconductor patterns VS. A dummy gate insulating layer DGO may be between the center dummy vertical semiconductor patterns CDVS and the sub-stack structures ST1 and ST2. An inner space of the center dummy vertical semiconductor pattern CDVS may be at least partially filled with the insulating gapfill pattern 29. A dummy bit line pad DBPD may be on the center dummy vertical semiconductor pattern CDVS. The conductive connecting portion CSLC may extend into the dummy bit line pad DBPD, the center dummy vertical semiconductor pattern CDVS, and the insulating gapfill pattern 29 in the first direction D1. The separation insulating layer IN may be between the conductive connecting portion CSLC and the dummy bit line pad DBPD, between the conductive connecting portion CSLC and the center dummy vertical semiconductor pattern CDVS, and between the conductive connecting portion CSLC and the insulating gapfill pattern 29. A side surface of the conductive connecting portion CSLC in the center dummy vertical semiconductor pattern CDVS may not have an uneven structure and may be flat vertically or slantingly. Except for the afore-described differences, the semiconductor memory device may have substantially the same or similar features as those in the previous embodiments.

Figure 24:
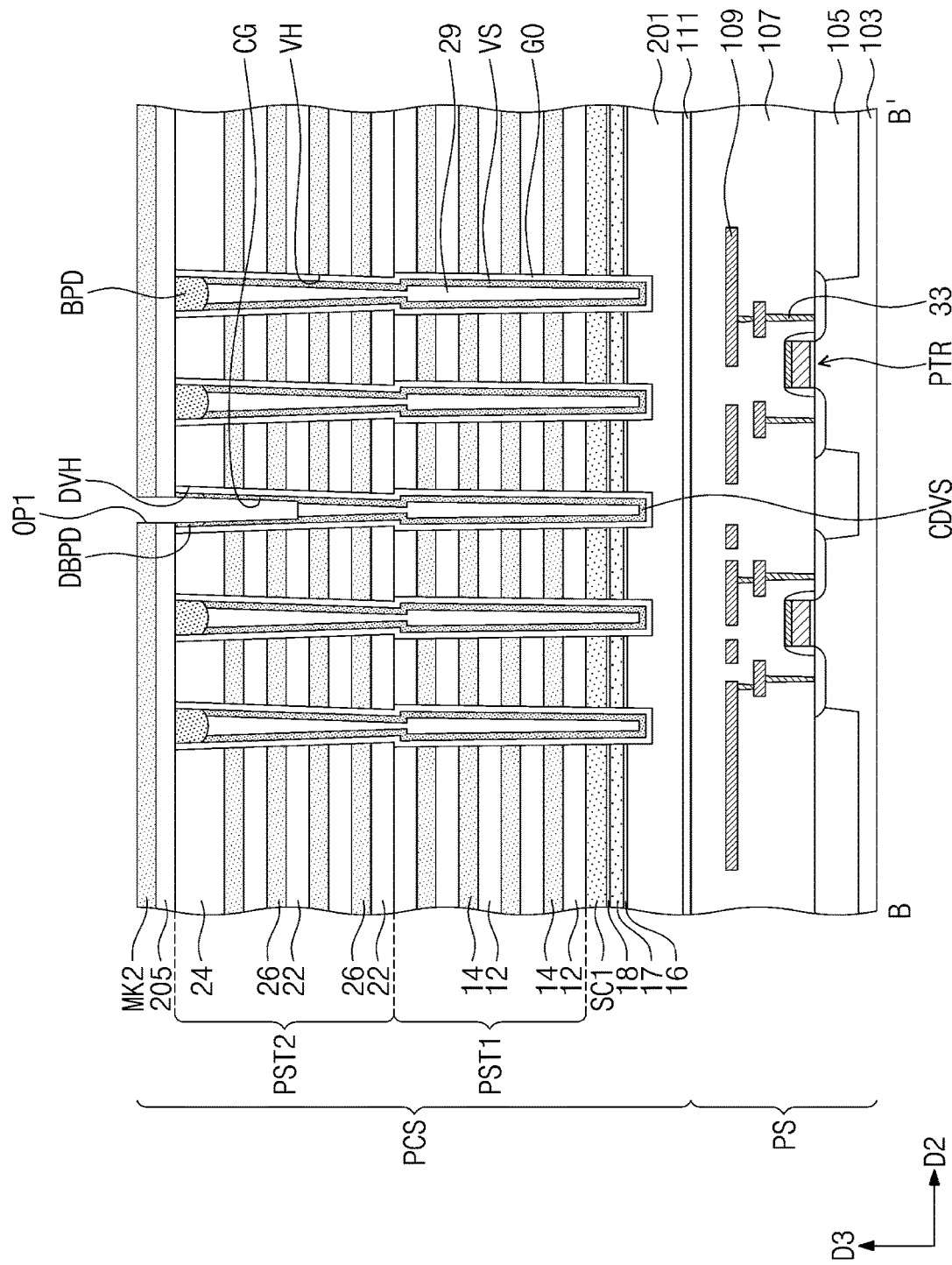
FIG. 24 is a sectional view illustrating a process of fabricating a three-dimensional semiconductor memory device having the section of FIG. 22.

FIG. 24 is a sectional view illustrating a process of fabricating a three-dimensional semiconductor memory device having the section of FIG. 22.

Referring to FIG. 24, the first mask pattern MK1 may be formed to have an island shape, not the line shape, in the step of FIG. 9A. The first mask pattern MK1 may cover some of the dummy vertical holes DVH but not others. The upper and bottom sacrificial gapfill patterns UGP and BGP in the dummy vertical holes DVH, which are not covered with the first mask pattern MK1, may be removed in the step of FIG. 9A. When the vertical semiconductor pattern VS, the gate insulating layer GO, the insulating gapfill pattern 29, and the bit line pad BPD are formed in the step of FIG. 10A, the center dummy vertical semiconductor pattern CDVS, the dummy gate insulating layer DGO, the insulating gapfill pattern 29, and a dummy bit line pad DBPD may also be formed in the dummy vertical hole DVH, which is not covered with the first mask pattern MK1, as shown in FIG. 24. When the source groove CG is formed in the step of FIG. 12A, the source groove CG may also be formed in the center dummy vertical semiconductor pattern CDVS, as shown in FIG. 24. A subsequent process may be performed in the same manner as described above.

Figure 25:
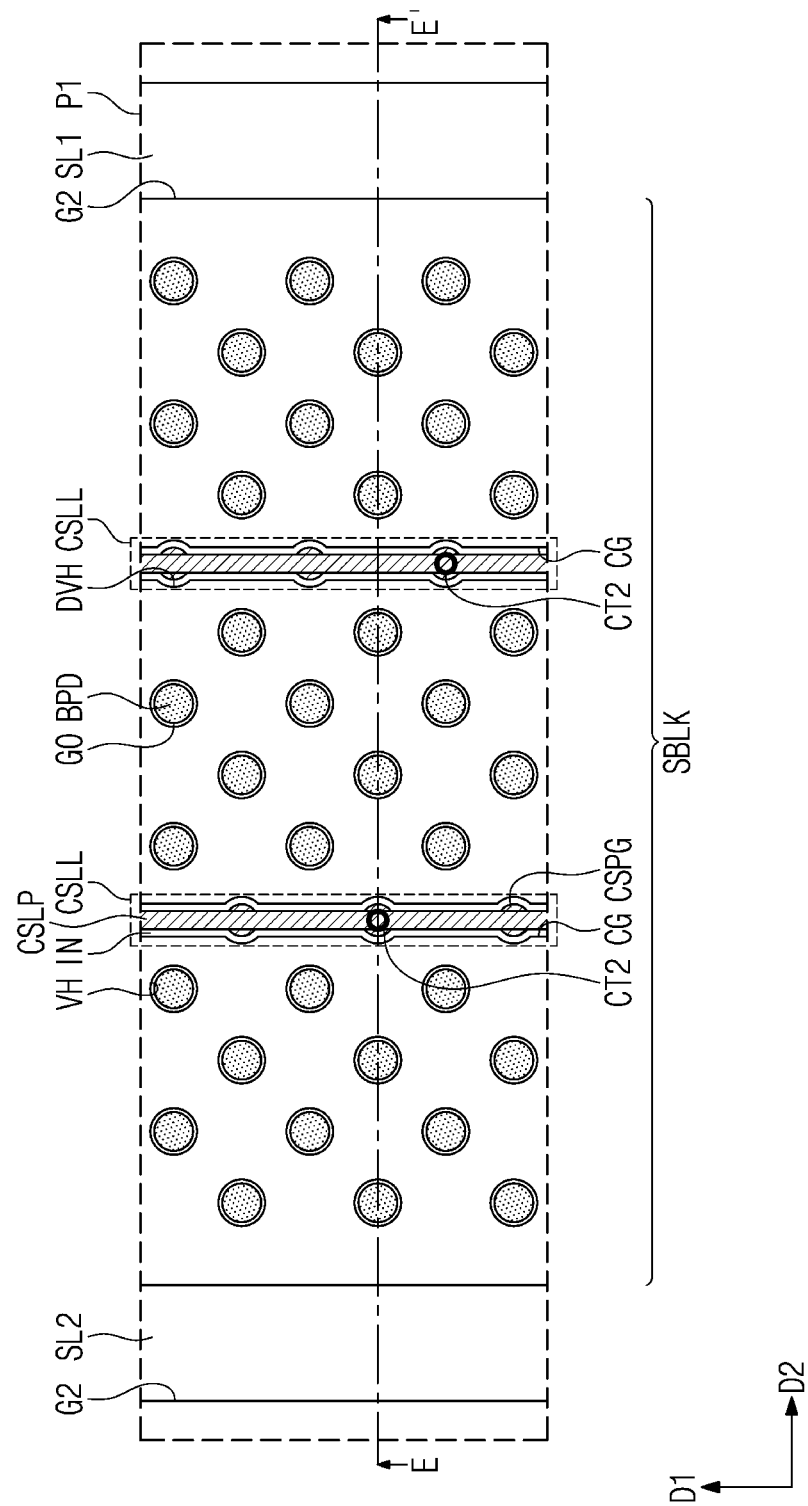
FIG. 25 is a plan view illustrating a three-dimensional semiconductor memory device according to an embodiment of the present disclosure.
Figure 26:
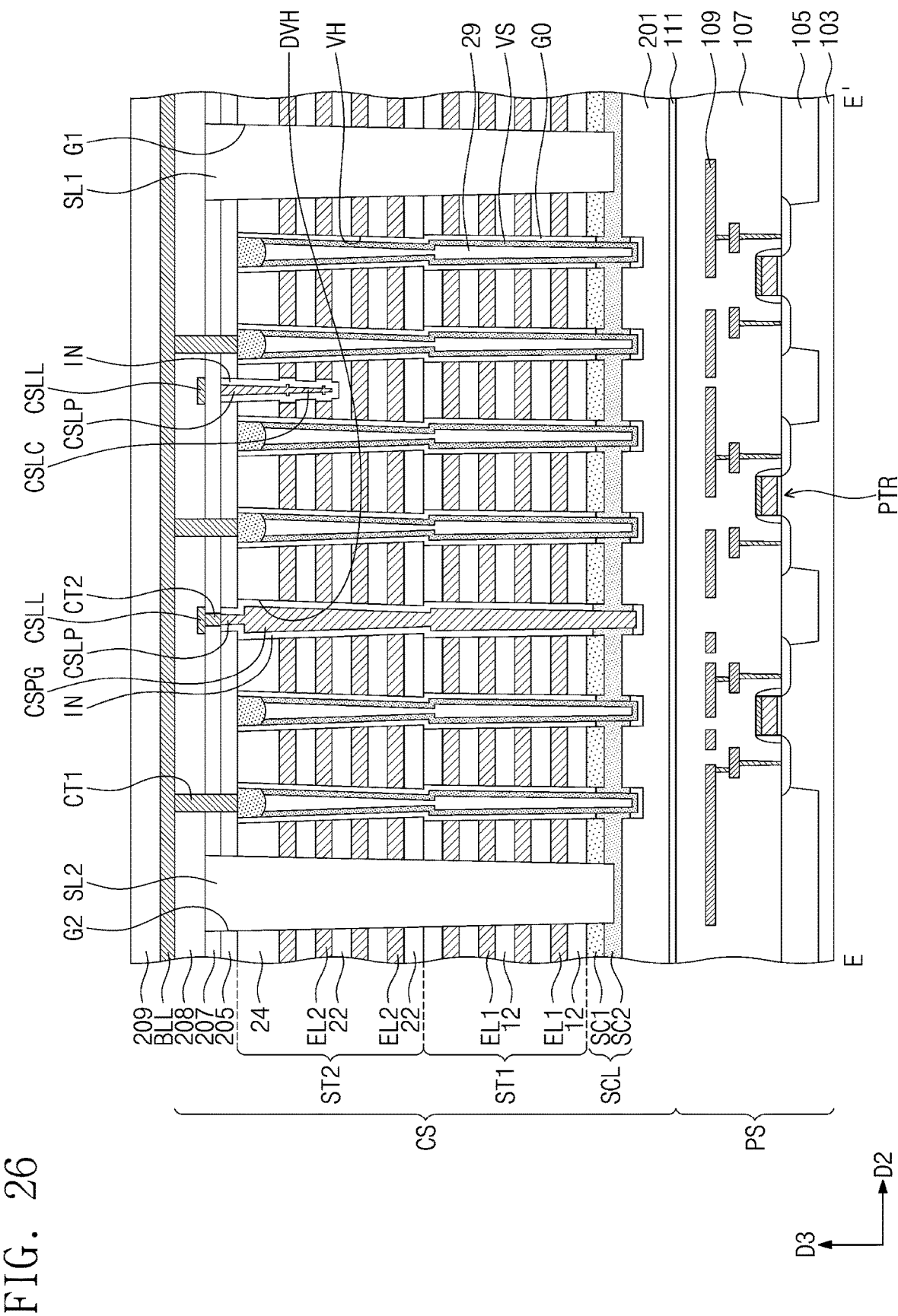
FIG. 26 is a sectional view taken along a line E-E' of FIG. 25.

FIG. 25 is a plan view illustrating a three-dimensional semiconductor memory device according to an embodiment of the present disclosure. FIG. 26 is a sectional view taken along a line E-E' of FIG. 25.

Referring to FIGS. 25 and 26, the vertical holes VH and the dummy vertical holes DVH in each sub-block SBLK may be arranged in a shape different from that of FIG. 4B. The dummy vertical holes DVH in each sub-block SBLK may be arranged to form two columns parallel to the first direction D1. Accordingly, the vertical conductive patterns CSPG in each sub-block SBLK may also be arranged to form two columns parallel to the first direction D1. In each sub-block SBLK, two conductive line portions CSLP may be spaced apart from each other. Except for the afore-described differences, the semiconductor memory device may have substantially the same or similar features as those in the previous embodiments.

Figure 27:
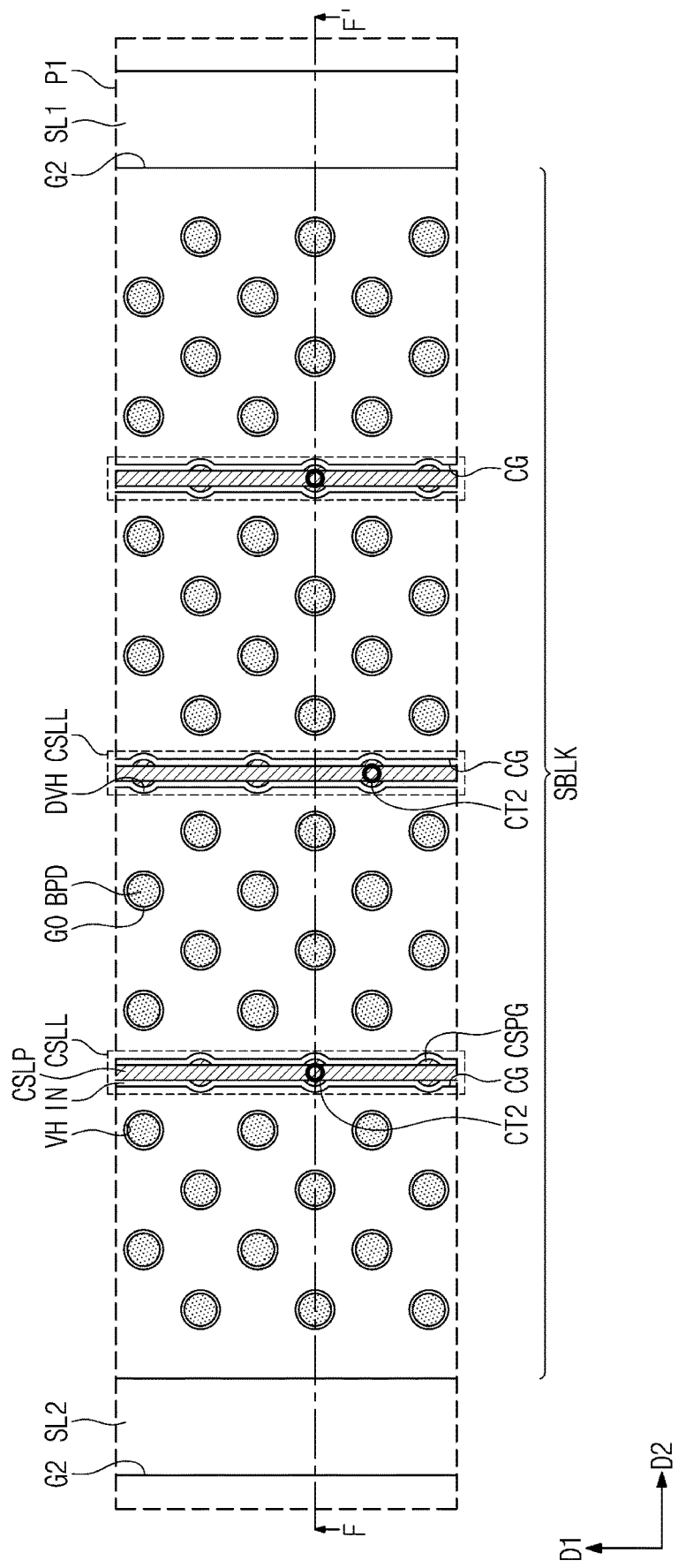
FIG. 27 is a plan view illustrating a three-dimensional semiconductor memory device according to an embodiment of the present disclosure.
Figure 28:
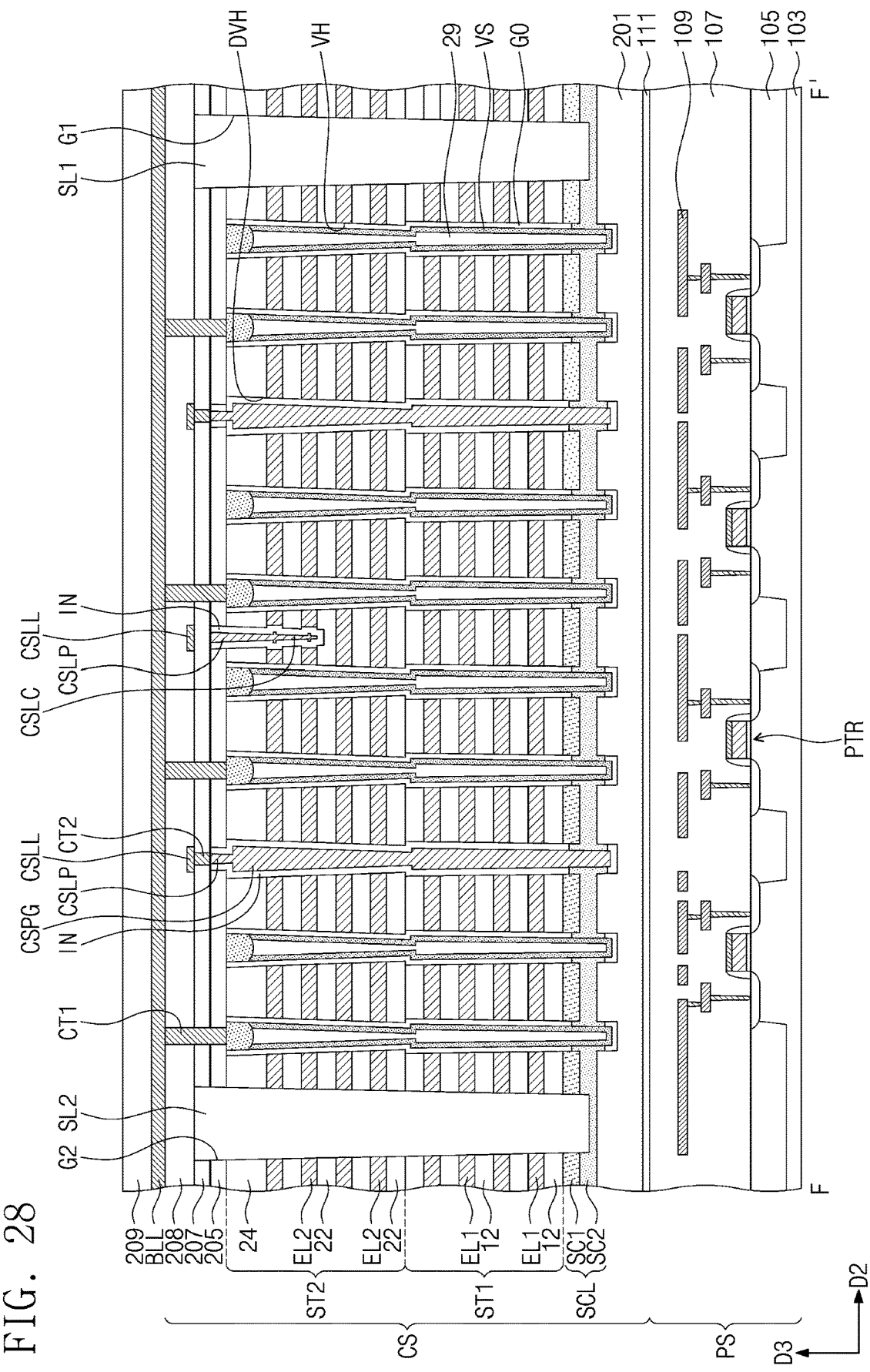
FIG. 28 is a sectional view taken along a line F-F' of FIG. 27.

FIG. 27 is a plan view illustrating a three-dimensional semiconductor memory device according to an embodiment of the present disclosure. FIG. 28 is a sectional view taken along a line F-F' of FIG. 27.

Referring to FIGS. 27 and 28, the dummy vertical holes DVH in each sub-block SBLK may be arranged to form three columns parallel to the first direction D1. Accordingly, the vertical conductive patterns CSPG in each sub-block SBLK may also be arranged to form three columns parallel to the first direction D1. In each sub-block SBLK, three conductive line portions CSLP may be spaced apart from each other. Except for the afore-described differences, the semiconductor memory device may have substantially the same or similar features as those in the previous embodiments.

Figure 29:
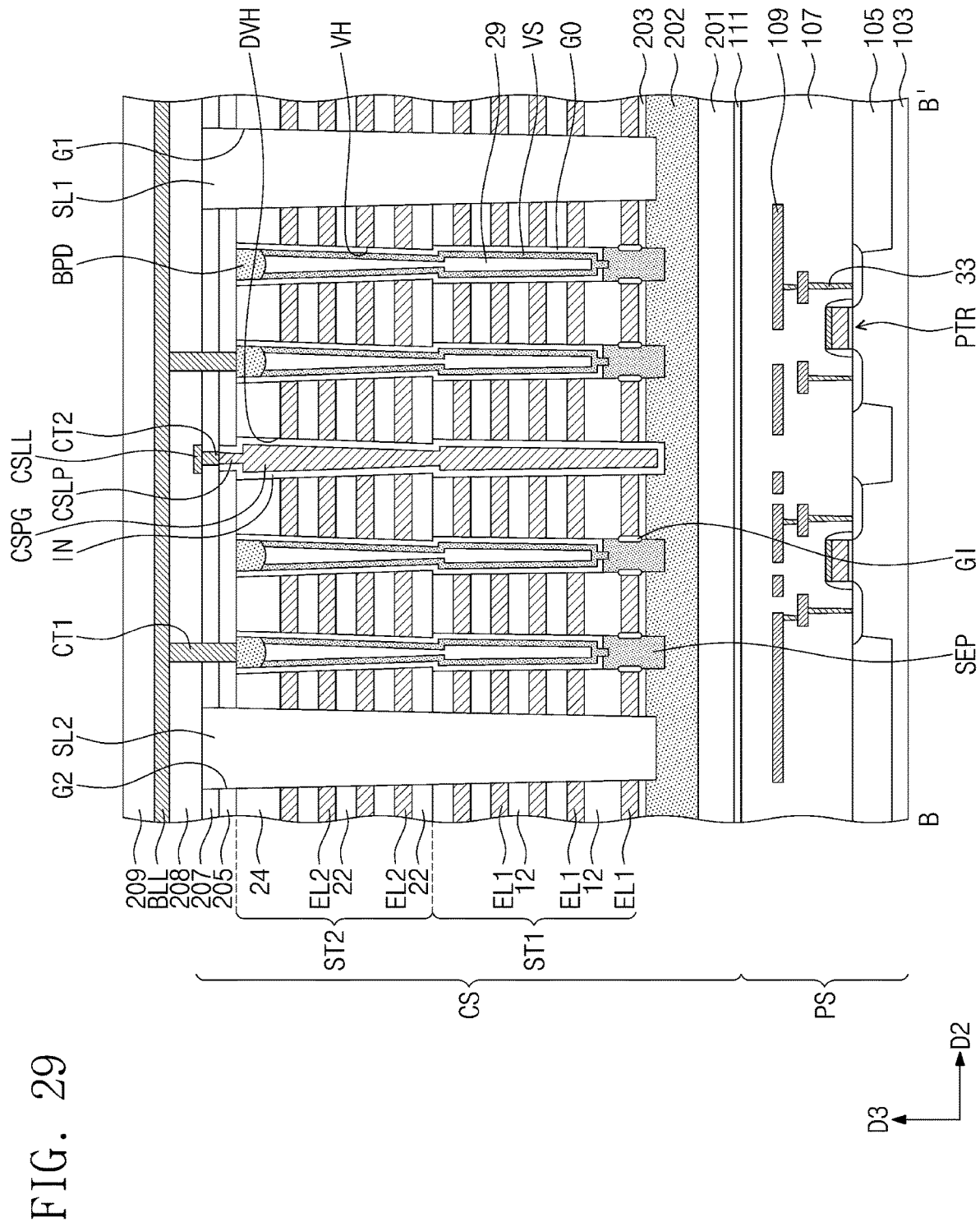
FIG. 29 is a sectional view taken along the line B-B' of FIG. 4A or 4B.

FIG. 29 is a sectional view taken along the line B-B' of FIG. 4A or 4B.

Referring to FIG. 29, a source layer 202 may be on the second substrate 201. The source layer 202 may be doped to have the first conductivity type, like the source structure SCL of FIG. 5A. A buffer layer 203 may be on the source layer 202. The first sub-stack structure ST1 may be on the buffer layer 203. The vertical semiconductor pattern VS may be provided to extend into the lowermost one of the first electrode layers EL1. A semiconductor epitaxial pattern SEP may be between the vertical semiconductor pattern VS and the source layer 202. For example, the semiconductor epitaxial pattern SEP may be formed of or include a doped or undoped silicon epitaxial layer. The semiconductor epitaxial pattern SEP may be provided to extend into the lowermost one of the first electrode layers EL1. A lower gate insulating layer GI may be between the lowermost one of the first electrode layers EL1 and the semiconductor epitaxial pattern SEP. The lower gate insulating layer GI may be formed of a thermal oxidation layer. The gate insulating layer GO may be between a bottom surface of the vertical semiconductor pattern VS and a top surface of the semiconductor epitaxial pattern SEP. A portion of the vertical semiconductor pattern VS may be provided to extend into the gate insulating layer GO and to be in contact with the semiconductor epitaxial pattern SEP. The vertical conductive pattern CSPG and the separation insulating layer IN may be provided to extend into the lowermost one of the first electrode layers EL1 and may be inserted into the source layer 202. Except for the afore-described differences, the semiconductor memory device may have substantially the same or similar features as those in the previous embodiments.

Figure 30:
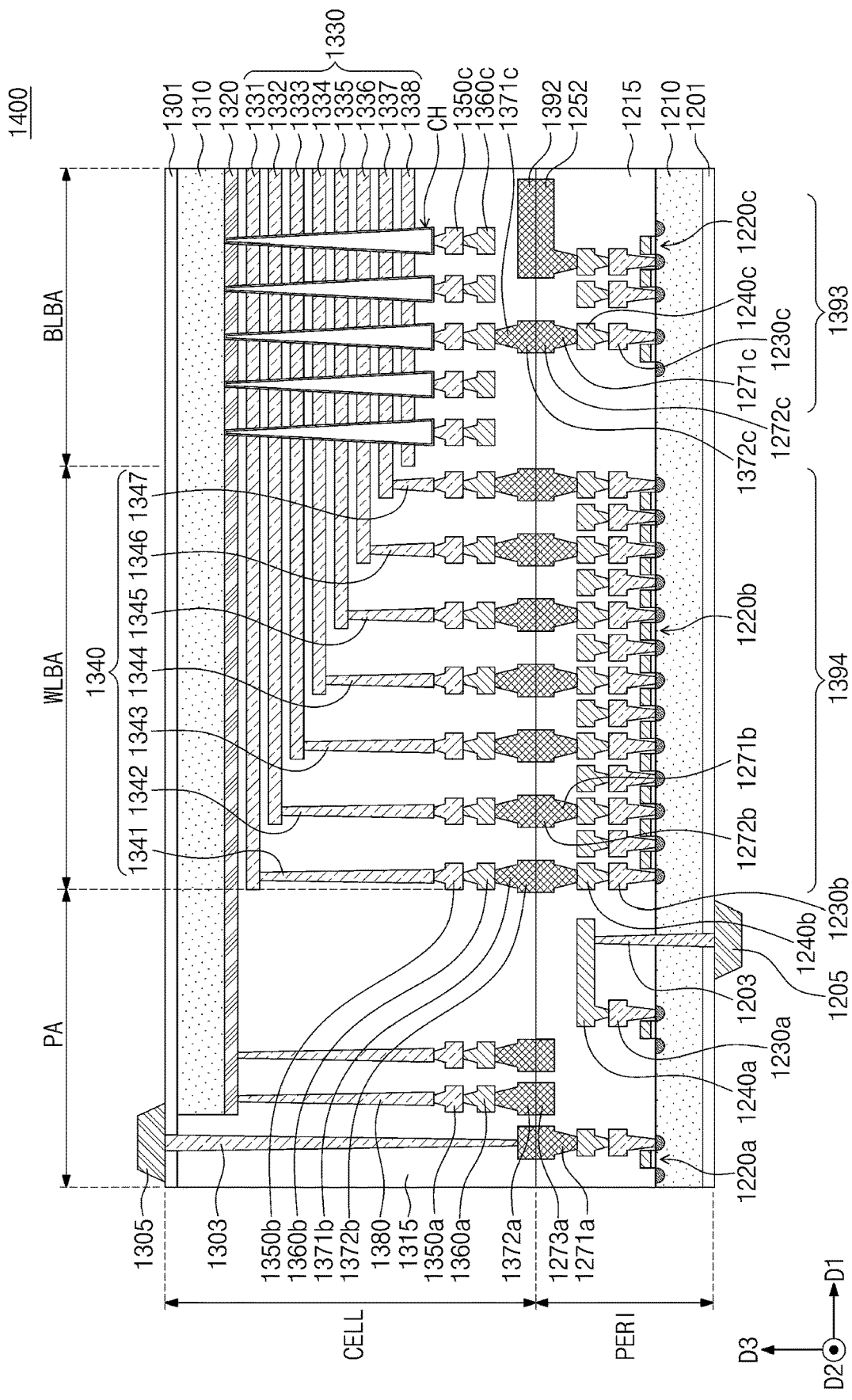
FIG. 30 is a sectional view illustrating a semiconductor device according to an embodiment of the present disclosure.

FIG. 30 is a sectional view illustrating a semiconductor device according to an embodiment of the present disclosure.

Referring to FIG. 30, a memory device 1400 may have a chip-to-chip (C2C) structure. For the C2C structure, an upper chip including a cell array structure CELL may be fabricated on a first wafer, a lower chip including a peripheral circuit structure PERI may be fabricated on a second wafer different from the first wafer, and the upper chip and the lower chip may be connected to each other in a bonding manner. The bonding manner may mean a way of electrically connecting a bonding metal formed in the uppermost metal layer of the upper chip to a bonding metal formed in the uppermost metal layer of the lower chip. For example, in the case where the bonding metal is formed of copper (Cu), the bonding manner may be a Cu-to-Cu bonding manner, but in an embodiment, aluminum (Al) or tungsten (W) may be used as the bonding metal.

Each of the peripheral circuit structure PERI and the cell array structure CELL of the memory device 1400 may include an outer pad bonding region PA, a word line bonding region WLBA, and a bit line bonding region BLBA.

The peripheral circuit structure PERI may include a first substrate 1210, an interlayer insulating layer 1215, a plurality of circuit devices 1220a, 1220b, and 1220c formed on the first substrate 1210, first metal layers 1230a, 1230b, and 1230c connected to the circuit devices 1220a, 1220b, and 1220c, respectively, and second metal layers 1240a, 1240b, and 1240c formed on the first metal layers 1230a, 1230b, and 1230c. In an embodiment, the first metal layers 1230a, 1230b, and 1230c may be formed of or include a material (e.g., tungsten) having relatively high electric resistivity, and the second metal layers 1240a, 1240b, and 1240c may be formed of or include a material (e.g., copper) having relatively low electric resistivity.

Although only the first metal layers 1230a, 1230b, and 1230c and the second metal layers 1240a, 1240b, and 1240c are illustrated and described in the present specification, the present disclosure is not limited thereto and at least one additional metal layer may be further formed on the second metal layers 1240a, 1240b, and 1240c. At least one of the additional metal layers, which are formed on the second metal layers 1240a, 1240b, and 1240c, may be formed of a material (e.g., aluminum), which has lower electric resistivity than the material (e.g., copper) of the second metal layers 1240a, 1240b, and 1240c.

The interlayer insulating layer 1215 may be on the first substrate 1210 to at least partially cover the circuit devices 1220a, 1220b, and 1220c, the first metal layers 1230a, 1230b, and 1230c, and the second metal layers 1240a, 1240b, and 1240c and may be formed of or include at least one of insulating materials (e.g., silicon oxide and silicon nitride).

Lower bonding metals 1271b and 1272b may be formed on the second metal layer 1240b of the word line bonding region WLBA. In the word line bonding region WLBA, the lower bonding metals 1271b and 1272b of the peripheral circuit structure PERI may be electrically connected to upper bonding metals 1371b and 1372b of the cell array structure CELL in a bonding manner, and the lower bonding metals 1271b and 1272b and the upper bonding metals 1371b and 1372b may be formed of or include at least one of aluminum, copper, or tungsten.

The cell array structure CELL may correspond to the cell array structure CS described with reference to FIGS. 2 to 29. The cell array structure CELL may include at least one memory block. The cell array structure CELL may include a second substrate 1310 and a common source line 1320. A plurality of word lines 1331-1338 (1330) may be stacked on the second substrate 1310 in a direction (e.g., a z-axis direction) that is perpendicular to a top surface of the second substrate 1310. String selection lines and a ground selection line may be respectively on and below the word lines 1330; that is, the word lines 1330 may be between the string selection lines and the ground selection line.

In the bit line bonding region BLBA, a channel structure CH may be provided to extend in the direction (e.g., the z-axis direction) perpendicular to a top surface of the second substrate 1310 and to extend into the word lines 1330, the string selection lines, and the ground selection line. The channel structure CH may include a data storage layer, a channel layer, and an insulating gapfill layer, and the channel layer may be electrically connected to a first metal layer 1350c and a second metal layer 1360c. For example, the first metal layer 1350c may be a bit line contact, and the second metal layer 1360c may be a bit line. In an embodiment, the bit line 1360c may extend in a first direction (e.g., a y-axis direction) parallel to the top surface of the second substrate 1310.

In an embodiment shown in FIG. 30, a region provided with the channel structure CH and the bit line 1360c may be defined as the bit line bonding region BLBA. In the bit line bonding region BLBA, the bit lines 1360c may be electrically connected to the circuit devices 1220c, which are provided in the peripheral circuit structure PERI to constitute a page buffer 1393. As an example, the bit lines 1360c may be connected to the peripheral circuit structure PERI through upper bonding metals 1371c and 1372c, and the upper bonding metals 1371c and 1372c may be connected to lower bonding metals 1271c and 1272c, which are connected to the circuit devices 1220c of the page buffer 1393.

In the word line bonding region WLBA, the word lines 1330 may extend in a second direction (e.g., an x-axis direction), which is perpendicular to the first direction and is parallel to the top surface of the second substrate 1310, and may be connected to a plurality of cell contact plugs 1341-1347 (1340). The cell contact plugs 1341-1347 or 1340 may have the same shape as the cell contact plug CC of FIG. 3.

The cell contact plugs 1340 may be connected to pads of the word lines 1330, which extend to have different lengths from each other in the second direction. A first metal layer 1350b and a second metal layer 1360b may be sequentially connected to upper portions of the cell contact plugs 1340 connected to the word lines 1330. In the word line bonding region WLBA, the cell contact plugs 1340 may be connected to the peripheral circuit structure PERI through the upper bonding metals 1371b and 1372b of the cell array structure CELL and the lower bonding metals 1271b and 1272b of the peripheral circuit structure PERI.

In the peripheral circuit structure PERI, the cell contact plugs 1340 may be electrically connected to the circuit devices 1220b constituting a row decoder 1394. In an embodiment, an operation voltage of the circuit devices 1220b constituting the row decoder 1394 may be different from an operation voltage of the circuit devices 1220c constituting the page buffer 1393. As an example, the operation voltage of the circuit devices 1220c constituting the page buffer 1393 may be higher than the operation voltage of the circuit devices 1220b constituting the row decoder 1394.

A common source line contact plug 1380 may be in the outer pad bonding region PA. The common source line contact plug 1380 may be formed of a conductive material (e.g., metals, metal compounds, or polysilicon) and may be electrically connected to the common source line 1320. A first metal layer 1350a and a second metal layer 1360a may be sequentially stacked on the common source line contact plug 1380. A region, in which the common source line contact plug 1380, the first metal layer 1350a, and the second metal layer 1360a are provided, may be defined as the outer pad bonding region PA.

Meanwhile, input/output pads 1205 and 1305 may be in the outer pad bonding region PA. Referring to FIG. 30, a lower insulating layer 1201 may be formed below the first substrate 1210 to at least partially cover the bottom surface of the first substrate 1210, and a first input/output pad 1205 may be formed on the lower insulating layer 1201. The first input/output pad 1205 may be connected to at least one of the circuit devices 1220a, 1220b, and 1220c of the peripheral circuit structure PERI through a first input/output contact plug 1203 and may be separated from the first substrate 1210 by the lower insulating layer 1201. In addition, a sidewall insulating layer (not shown) may be between the first input/output contact plug 1203 and the first substrate 1210 to electrically separate the first input/output contact plug 1203 from the first substrate 1210.

Referring to FIG. 30, an upper insulating layer 1301 may be formed on the second substrate 1310 to at least partially cover the top surface of the second substrate 1310, and a second input/output pad 1305 may be on the upper insulating layer 1301. The second input/output pad 1305 may be connected to at least one of the circuit devices 1220a, 1220b, and 1220c of the peripheral circuit structure PERI through a second input/output contact plug 1303. In an embodiment, the second input/output pad 1305 may be electrically connected to the circuit device 1220a.

In an embodiment, the second substrate 1310 and the common source line 1320 may not be in a region provided with the second input/output contact plug 1303. In addition, the second input/output pad 1305 may not overlap the word lines 1330 in the third direction (i.e., the z-axis direction). Referring to FIG. 30, the second input/output contact plug 1303 may be separated from the second substrate 1310 in a direction parallel to the top surface of the second substrate 1310, may extend into the upper insulating layer 1301 and an interlayer insulating layer 1315 of the cell array structure CELL, and may be connected to the second input/output pad 1305.

In an embodiment, the first input/output pad 1205 and the second input/output pad 1305 may be selectively formed. As an example, the memory device 1400 may be configured to include only the first input/output pad 1205, which is provided on the first substrate 1210, or to include only the second input/output pad 1305, which is provided on the second substrate 1310. Alternatively, the memory device 1400 may be configured to include both of the first and second input/output pads 1205 and 1305.

A metal pattern, which is used as a dummy pattern, may be provided in the uppermost metal layer of the outer pad bonding region PA and the bit line bonding region BLBA, which are included in each of the cell array structure CELL and the peripheral circuit structure PERI, or may not be provided in the uppermost metal layer.

The memory device 1400 may include an upper metal pattern 1372a and a lower metal pattern 1273a, which are provided in the outer pad bonding region PA, and here, the lower metal pattern 1273a may be formed in the uppermost metal layer of the peripheral circuit structure PERI to correspond to the upper metal pattern 1372a, which is formed in the uppermost metal layer of the cell array structure CELL, or to have the same shape as the upper metal pattern 1372a of the cell array structure CELL. The lower metal pattern 1273a, which is formed in the uppermost metal layer of the peripheral circuit structure PERI, may not be connected to any contact plug in the peripheral circuit structure PERI. Similarly, in the outer pad bonding region PA, the upper metal pattern 1372a may be formed in the uppermost metal layer of the cell array structure CELL to correspond to the lower metal pattern 1273a, which is formed in the uppermost metal layer of the peripheral circuit structure PERI, and in this case, the upper metal pattern 1372a may have the same shape as the lower metal pattern 1273a of the peripheral circuit structure PERI.

The lower bonding metals 1271b and 1272b may be formed on the second metal layer 1240b of the word line bonding region WLBA. In the word line bonding region WLBA, the lower bonding metals 1271b and 1272b of the peripheral circuit structure PERI may be electrically connected to the upper bonding metals 1371b and 1372b of the cell array structure CELL in a bonding manner.

Furthermore, in the bit line bonding region BLBA, an upper metal pattern 1392 may be formed in the uppermost metal layer of the cell array structure CELL to correspond to a lower metal pattern 1252, which is formed in the uppermost metal layer of the peripheral circuit structure PERI, and in this case, the upper metal pattern 1392 may have the same shape as the lower metal pattern 1252 of the peripheral circuit structure PERI. In an embodiment, any contact plug may not be formed on the upper metal pattern 1392, which is formed in the uppermost metal layer of the cell array structure CELL.

Figure 31:
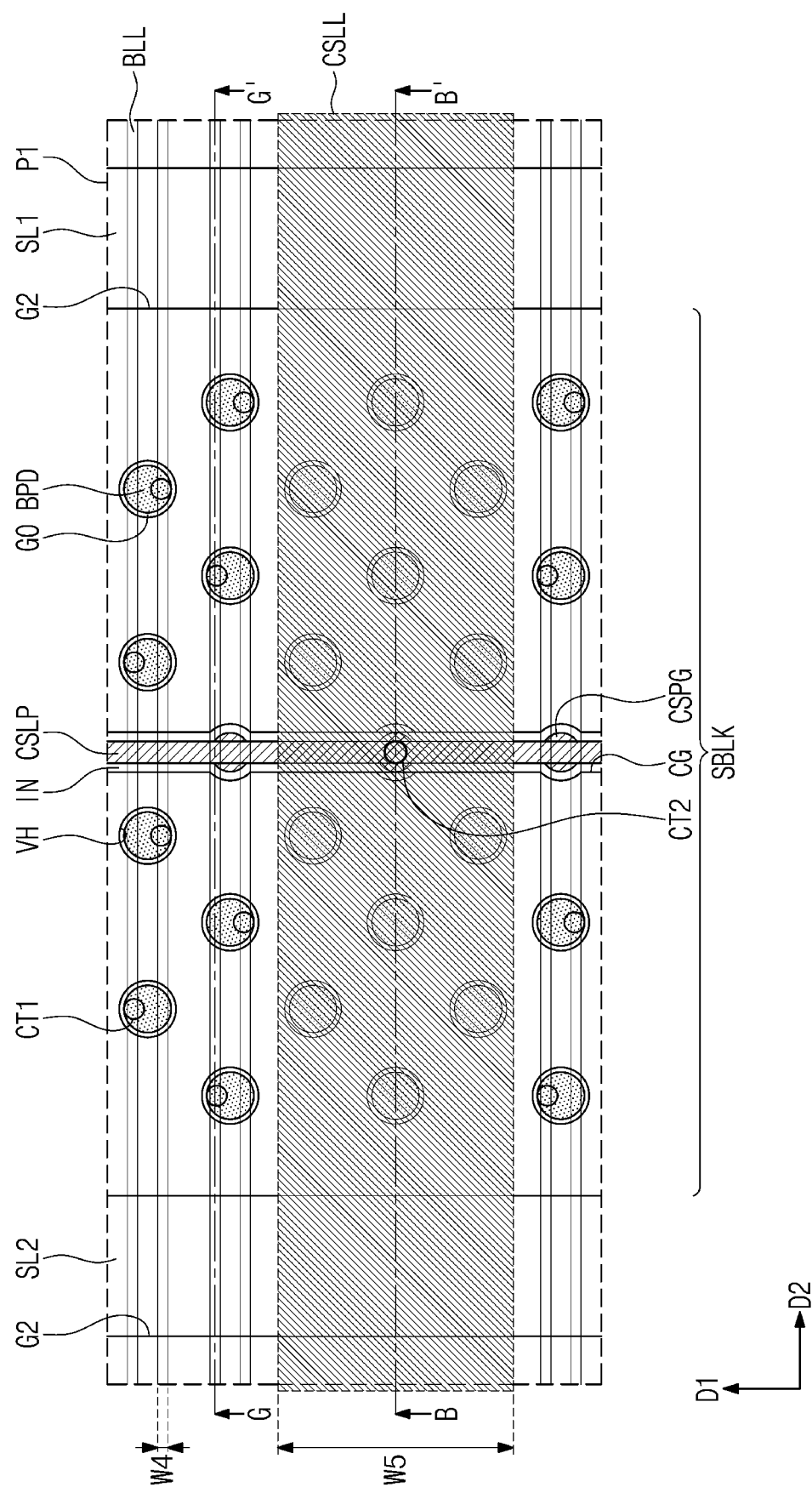
FIG. 31 is an enlarged plan view illustrating a detailed structure of the portion 'P1' of FIG. 2.
Figure 32A:
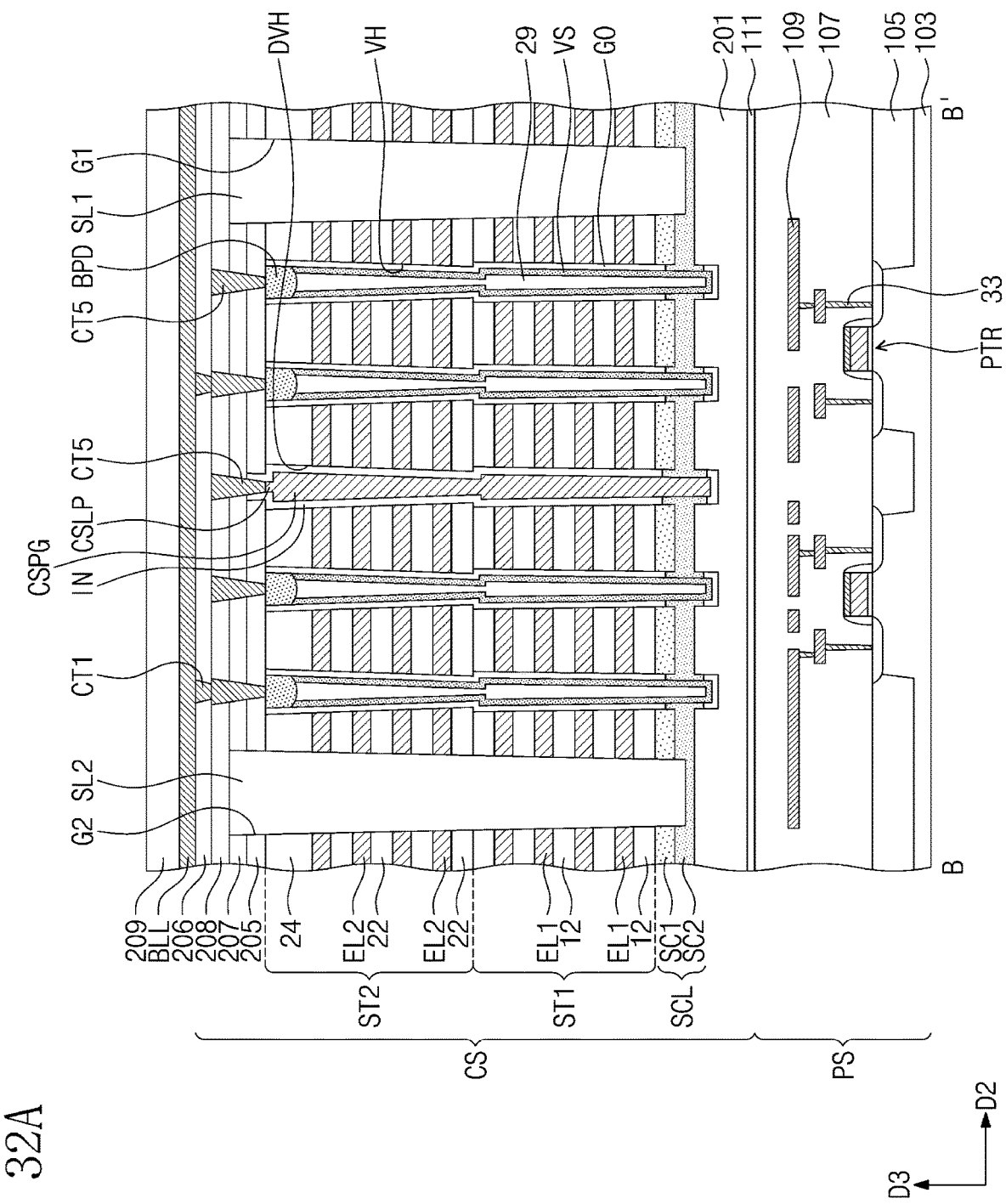
FIG. 32A is a sectional view taken along a line B-B' of FIG. 31.
Figure 32B:
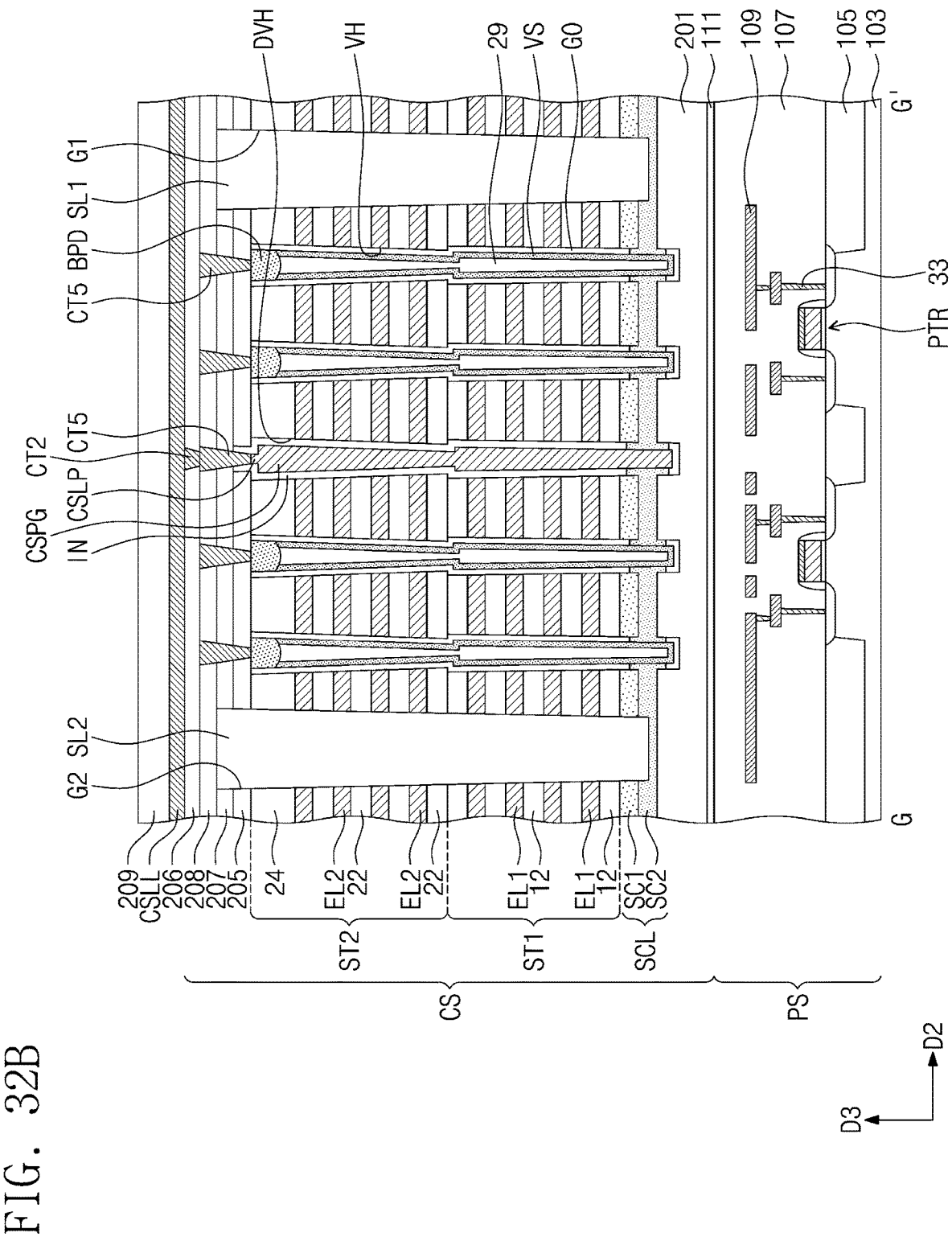
FIG. 32B is a sectional view taken along a line G-G' of FIG. 31.
Figure 33:
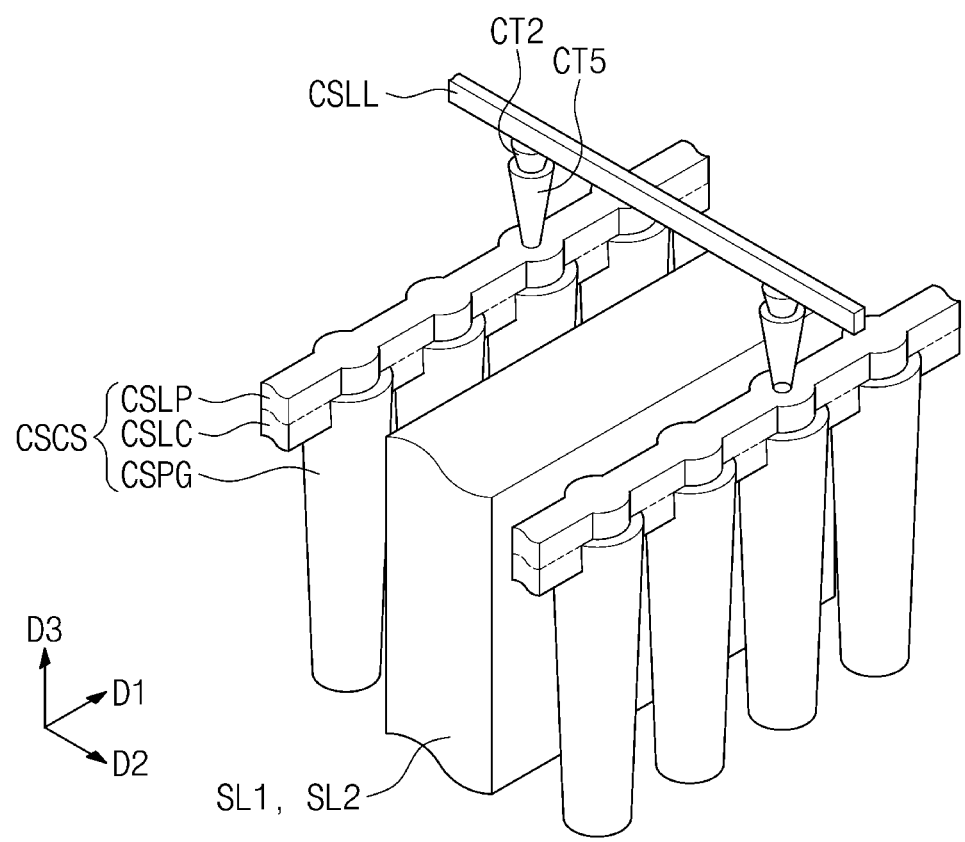
FIG. 33 is a perspective view illustrating common source contact structures according to an embodiment of the present disclosure.

FIG. 31 is an enlarged plan view illustrating a detailed structure of the portion 'P1' of FIG. 2. FIG. 32A is a sectional view taken along a line B-B' of FIG. 31. FIG. 32B is a sectional view taken along a line G-G' of FIG. 31. FIG. 33 is a perspective view illustrating common source contact structures according to an embodiment of the present disclosure. The same or similar reference numbers may be used to refer to structures that are the same or similar as discussed in previous Figures.

Referring to FIGS. 31, 32A, 32B, and 33, a fifth upper interlayer insulating layer 206 may be between the third upper interlayer insulating layer 208 and the first conductive lines BLL and between the third upper interlayer insulating layer 208 and the second conductive line CSLL. The first and second conductive lines BLL and CSLL may have a line shape extending in the second direction D2 and may be parallel to each other. The first conductive lines BLL may have a fourth width W4 in the first direction D1. The second conductive line CSLL may have a fifth width W5 in the first direction D1. The fifth width W5 may be different from the fourth width W4. Preferably, in some embodiments, the fifth width W5 may be larger than the fourth width W4.

One or more fifth contacts CT5 may be provided to extend into the fifth upper interlayer insulating layer 206, the third upper interlayer insulating layer 208, the second upper interlayer insulating layer 207, and the first upper interlayer insulating layer 205. Some of the fifth contacts CT5 may be in contact with respective ones of the bit line pads BPD. Although not shown, some of the fifth contacts CT5 may be provided to extend into at least a portion of the bit line pads BPD. The fifth contacts CT5 may be spaced apart from the first and second conductive lines BLL and CSLL. One of the fifth contacts CT5 may be in contact with the conductive line portion CSLP of the common source contact structure CSCS. The one of the fifth contacts CT5 may be provided to extend into a portion of the conductive line portion CSLP of the common source contact structure CSCS. Bottom surfaces of the fifth contacts CT5 may be located at the same level or different levels. Especially, the level of the bottom surface of the fifth contact CT5 in contact with the conductive line portion CSLP may be different from the levels of the bottom surfaces of the fifth contacts CT5 in contact with the bit line pads BPD.

The first contacts CT1 may be provided to extend into the fifth upper interlayer insulating layer 206 and to connect some of the fifth contacts CT5 to the first conductive lines BLL. The first conductive lines BLL may be connected to the bit line pads BPD by some of the fifth contacts CT5 and the first contacts CT1.

The second contact CT2 may be provided to extend into the fifth upper interlayer insulating layer 206 and to connect one of the fifth contacts CT5 to the second conductive line CSLL. The second conductive line CSLL may be connected to the conductive line portion CSLP of the common source contact structure CSCS by the fifth contact CT5 and the second contact CT2. As shown in FIG. 33, the common source contact structures CSCS, which are spaced apart from each other with the first or second separation insulating line SL1 and SL2 interposed therebetween, may be connected to each other by the second conductive line CSLL, the second contacts CT2, and the fifth contacts CT5. Except for the afore-described differences, the semiconductor memory device may have substantially the same or similar features as those in the previous embodiments.

In a three-dimensional semiconductor memory device and an electronic system including the same according to an embodiment of the present disclosure, vertical conductive patterns may be disposed in dummy vertical holes and may be used as source contacts connected to a source structure. This may make it possible to prevent or minimize a warpage problem of the semiconductor device. In addition, it may be possible to prevent or minimize occurrence of a CSL noise. Furthermore, it may be possible to reduce a horizontal size of the semiconductor memory device or to increase an integration density of the semiconductor memory device. In addition, since the horizontal size of the semiconductor memory device is reduced, the number of chips or net dies produced from one wafer may be increased, and thus, it may be possible to increase a yield.

While example embodiments of the present disclosure have been particularly shown and described, it will be understood by one of ordinary skill in the art that variations in form and detail may be made therein without departing from the spirit and scope of the attached claims.

What is claimed is:

1. A three-dimensional semiconductor memory device, comprising:
   a stack structure comprising a plurality of electrode layers and a plurality of inter-electrode insulating layers on a substrate;
   a plurality of vertical semiconductor structures that extend into the stack structure and are adjacent to the substrate;
   one or more vertical conductive structures arranged in a first direction between adjacent ones of the plurality of vertical semiconductor structures, the one or more vertical conductive structures extending into the stack structure to be adjacent to the substrate; and
   a conductive line portion that is on the stack structure and extends in the first direction to connect the one or more vertical conductive structures to each other,
   wherein the conductive line portion and the one or more vertical conductive structures are connected to form a single unit, and wherein a width of the one or more vertical conductive structures measured in a second direction perpendicular to the first direction is different than a width of the conductive line portion measured in the second direction.

2. The semiconductor memory device of claim 1, further comprising a conductive connecting portion that is between the one or more vertical conductive structures and in contact with a bottom surface of the conductive line portion,
   wherein the conductive connecting portion, the conductive line portion, and the one or more vertical conductive structures are connected to form a single unit.

3. The semiconductor memory device of claim 2, wherein a side surface of the conductive connecting portion has an uneven structure.

4. The semiconductor memory device of claim 1, wherein the stack structure comprises a first sub-stack structure and a second sub-stack structure,
   wherein each of one or more side surfaces of the plurality of vertical semiconductor structures has a first inflection point near an interface between the first sub-stack structure and the second sub-stack structure, and
   wherein each of one or more side surfaces of the one or more vertical conductive structures has a second inflection point near an interface between the first sub-stack structure and the second sub-stack structure.

5. The semiconductor memory device of claim 1, wherein the one or more vertical conductive structures comprise at least two vertical conductive structures, the semiconductor memory device further comprising at least one dummy vertical semiconductor structure between ones of the at least two vertical conductive structures.

6. The semiconductor memory device of claim 5, further comprising a conductive connecting portion between ones of the at least two vertical conductive structures and in contact with a bottom surface of the conductive line portion,
   wherein the conductive connecting portion extends into an upper portion of the dummy vertical semiconductor structure in the first direction.

7. The semiconductor memory device of claim 1, further comprising:
   a gate insulating layer on each of one or more side surfaces of the plurality of vertical semiconductor structures; and
   a separation insulating layer on each of the one or more side surfaces of the one or more vertical conductive structures,
   wherein the gate insulating layer has a first thickness, and
   wherein the separation insulating layer has a second thickness different from the first thickness.

8. The semiconductor memory device of claim 1, further comprising:
   a plurality of gate insulating layers on one or more side surfaces of the plurality of vertical semiconductor structures, respectively;
   a plurality of separation insulating layers on one or more side surfaces of the one or more vertical conductive structures, respectively; and
   a source structure between the stack structure and the substrate,
   wherein the source structure comprises a first source layer and a second source layer below the first source layer,
   wherein the second source layer extends into one or more of the plurality of gate insulating layers to contact the one or more side surfaces of the plurality of vertical semiconductor structures, respectively,
   the second source layer extends into one or more of the plurality of separation insulating layers to contact the one or more side surfaces of the one or more vertical conductive structures, respectively, and
   a first level of a top end of the second source layer on the one or more side surfaces of the plurality of vertical semiconductor structures is different from a second level of a top end of the second source layer on the one or more side surfaces of the one or more vertical conductive structures.

9. The semiconductor memory device of claim 1, further comprising:
   a plurality of separation insulating layers on one or more side surfaces of the one or more vertical conductive structures;
   a plurality of diffusion barrier layers that are respectively between the one or more vertical conductive structures and the plurality of separation insulating layers; and
   a source structure between the stack structure and the substrate,
   wherein the source structure comprises a first source layer and a second source layer below the first source layer, and
   the second source layer extends into one or more of the plurality of separation insulating layers to contact one or more of the plurality of diffusion barrier layers.

10. The semiconductor memory device of claim 1, further comprising a separation insulating line that extends into the stack structure and is spaced apart from the plurality of vertical semiconductor structures and the one or more vertical conductive structures, the separation insulating line extending in the first direction.

11. A three-dimensional semiconductor memory device, comprising a peripheral circuit structure and a cell array structure on the peripheral circuit structure,
wherein the cell array structure comprises:
a first substrate comprising a cell array region and a connection region, each of which is arranged in a first direction;
a source structure on the first substrate;
a first sub-stack structure comprising first electrode layers and first inter-electrode insulating layers alternately stacked on the first substrate;
a second sub-stack structure comprising second electrode layers and second inter-electrode insulating layers alternately stacked on the first sub-stack structure;
a plurality of vertical semiconductor structures on the cell array region that extend into the first sub-stack structure, the second sub-stack structure, and the source structure to be adjacent to the first substrate;
a plurality of bit line pads on the plurality of vertical semiconductor structures, with each one of the plurality of bit line pads on a respective one of the plurality of vertical semiconductor structures;
a plurality of vertical conductive structures arranged in a first direction and between adjacent ones of the plurality of vertical semiconductor structures, the plurality of vertical conductive structures extending into the first sub-stack structure and the second sub-stack structure to be adjacent to the substrate;
a conductive line portion on the second sub-stack structure that extends in the first direction to connect ones of the plurality of vertical conductive structures to each other; and
a separation insulating line that extends in the first direction and into the first sub-stack structure, the second sub-stack structure, and the source structure on the cell array region and the connection region,
wherein each of one or more side surfaces of the plurality of vertical semiconductor structures has a first inflection point near an interface between the first sub-stack structure and the second sub-stack structure, and
wherein each of one or more side surfaces of the plurality of vertical conductive structures has a second inflection point near an interface between the first sub-stack structure and the second sub-stack structure.

12. The semiconductor memory device of claim 11, wherein the conductive line portion and the plurality of vertical conductive structures are connected to form a single unit.

13. The semiconductor memory device of claim 12, further comprising a conductive connecting portion between ones of the plurality of vertical conductive structures and in contact with a bottom surface of the conductive line portion,
wherein a width of a top surface of the vertical conductive structure is larger than a width of the conductive line portion and is larger than a width of the conductive connecting portion,
wherein the conductive connecting portion, the conductive line portion, and the plurality of vertical conductive structures are connected to form a single unit, and
wherein a side surface of the conductive connecting portion has an uneven structure.

14. The semiconductor memory device of claim 11, further comprising at least one dummy vertical semiconductor structure between ones of the plurality of vertical conductive structures.

15. The semiconductor memory device of claim 14, further comprising a conductive connecting portion between ones of the plurality of vertical conductive structures and in contact with a bottom surface of the conductive line portion,
wherein the conductive connecting portion extends into an upper portion of the dummy vertical semiconductor structure in the first direction.

16. The semiconductor memory device of claim 11, further comprising:
a gate insulating layer on each of the one or more side surfaces of the plurality of vertical semiconductor structures, wherein the gate insulating layer comprises a tunnel insulating layer, a charge storing layer, and a blocking insulating layer; and
a separation insulating layer on each of the one or more side surfaces of the plurality of vertical conductive structures,
wherein the gate insulating layer has a first thickness, and
wherein the separation insulating layer has a second thickness different from the first thickness, and the second thickness is greater than the first thickness.

17. The semiconductor memory device of claim 11, further comprising:
a plurality of gate insulating layers on the one or more side surfaces of the plurality of vertical semiconductor structures, respectively;
a plurality of separation insulating layers on the one or more side surfaces of the plurality of vertical conductive structures, respectively,
wherein the source structure comprises a first source layer and a second source layer below the first source layer,
wherein the second source layer extends into one or more of the plurality of gate insulating layers to contact the one or more side surfaces of the plurality of vertical semiconductor structures, respectively,
wherein the second source layer extends into one or more of the plurality of separation insulating layers to contact the one or more side surfaces of the plurality of vertical conductive structures, respectively,
wherein a first level of a top end of the second source layer on the one or more side surfaces of the plurality of vertical semiconductor structures is different from a second level of a top end of the second source layer on the one or more side surfaces of the plurality of vertical conductive structures, and the second level is higher than the first level, and
wherein a bottom end of the second source layer on lower side surfaces of the vertical semiconductor structures are at a third level and a bottom end of the second source layer on lower side surfaces of the vertical conductive structures are at a fourth level different from the third level, with the fourth level being lower than the third level.

18. The semiconductor memory device of claim 11, further comprising:
a plurality of separation insulating layers on the one or more side surfaces of the plurality of vertical conductive structures, respectively; and
a plurality of diffusion barrier layers that are respectively between ones of the plurality of vertical conductive structures and ones of the plurality of separation insulating layers,
wherein the source structure comprises a first source layer and a second source layer below the first source layer, and
wherein the second source layer extends into ones of the plurality of separation insulating layers to contact each of the plurality of diffusion barrier layers.

19. The semiconductor memory device of claim 11, further comprising a planarization insulating layer on the connection region that at least partially covers an end portion of the first sub-stack structure and the second sub-stack structure.

20. An electronic system, comprising:
- a semiconductor device comprising a peripheral circuit structure, a cell array structure on the peripheral circuit structure, and an input/output pad electrically connected to the peripheral circuit structure; and
- a controller that is electrically connected to the semiconductor device through the input/output pad to control the semiconductor device,
- wherein the cell array structure comprises:
- a stack structure including electrode layers and inter-electrode insulating layers on a substrate layer;
- a plurality of vertical semiconductor structures extending into the stack structure to be adjacent to the substrate;
- a plurality of vertical conductive structures arranged in a first direction between adjacent ones of the plurality of vertical semiconductor structures and extending into the stack structure to be adjacent to the substrate layer; and
- a conductive line portion on the stack structure and extending in the first direction to connect ones of the plurality of vertical conductive structures, wherein the conductive line portion and the plurality of vertical conductive structures are connected to form a single unit, and wherein a width of the plurality of vertical conductive structures measured in a second direction perpendicular to the first direction is different than a width of the conductive line portion measured in the second direction.

* * * * *